United States Patent
Soma et al.

(10) Patent No.: US 6,795,496 B1
(45) Date of Patent: *Sep. 21, 2004

(54) JITTER MEASURING DEVICE AND METHOD

(75) Inventors: Mani Soma, Seattle, WA (US); Takahiro Yamaguchi, Tokyo (JP); Masahiro Ishida, Tokyo (JP); Yasuo Furukawa, Tokyo (JP); Toshifumi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/647,908

(22) PCT Filed: Feb. 7, 2000

(86) PCT No.: PCT/JP00/00644

§ 371 (c)(1),
(2), (4) Date: Oct. 5, 2000

(87) PCT Pub. No.: WO00/46606

PCT Pub. Date: Aug. 10, 2000

Related U.S. Application Data

(63) Continuation-in-part of application No. 09/408,280, filed on Sep. 29, 1999, which is a continuation-in-part of application No. 09/246,458, filed on Feb. 8, 1999.

(51) Int. Cl.[7] .......................... H04B 3/46; H04B 17/00; H04Q 1/20
(52) U.S. Cl. .......................... 375/226; 324/620; 702/69
(58) Field of Search .................. 375/226, 240, 375/371, 376, 227, 340, 344, 346; 324/76.77, 76.82, 76.53, 620, 96; 327/554; 370/395.62; 702/69, 67, 76.39, 111, 75

(56) References Cited

U.S. PATENT DOCUMENTS

| | | | |
|---|---|---|---|
| 4,106,102 A | 8/1978 | Desblache | |
| 4,397,039 A | 8/1983 | McAuliffe | |
| 4,654,851 A | 3/1987 | Busby | |
| 4,654,861 A | 3/1987 | Godard | 375/10 |
| 5,557,196 A * | 9/1996 | Ujiie | 324/76.77 |
| 5,692,009 A * | 11/1997 | Iijima | 375/226 |
| 5,754,437 A | 5/1998 | Blazo | 364/484 |
| 6,240,130 B1 * | 5/2001 | Burns et al. | 375/226 |
| 6,621,860 B1 * | 9/2003 | Yamaguchi et al. | 375/226 |
| 6,687,629 B1 | 2/2004 | Yamaguchi et al. | |

FOREIGN PATENT DOCUMENTS

| | | |
|---|---|---|
| EP | 849907 | 6/1998 |
| JP | 6119260 | 1/1986 |
| JP | 2171663 | 7/1990 |
| JP | 8262083 | 10/1996 |

OTHER PUBLICATIONS

Lam, W.K., et al.; "Measurement of the Phase Noise Characteristics of an Unlocked Communication Channel Identifier," IEEE International Frequency Control Symposium, 1993, pp. 283–288.

(List continued on next page.)

Primary Examiner—Stephen Chin
Assistant Examiner—Ted Wang
(74) Attorney, Agent, or Firm—David N. Lathrop, Esq.; Gallagher & Lathrop

(57) ABSTRACT

A signal under measurement is transformed into a complex analytic signal using a Hilbert transformer and an instantaneous phase of this analytic signal is estimated. A linear phase is subtracted from the instantaneous phase to obtain a phase noise waveform. The phase noise waveform is sampled in the proximity of a zero crossing point of a real part of the analytic signal. A differential waveform of the sample phase noise waveform is calculated to obtain a differential phase noise waveform. An RMS jitter is obtained from the phase noise waveform, and a peak-to-peak jitter is obtained from the phase noise waveform.

19 Claims, 66 Drawing Sheets

OTHER PUBLICATIONS

Yamaguchi, T. Extraction of Instantaneous and Average PLL Jitter using Analytic Signal Technique: Tohoku Daigaku Dentsu Danwakai Kiroku, vol. 68, No. 1, (Japan), Tokyo Daigaku Denki Tsushin Kenkyusho, (Aug. 28, 1999), pp. 99–104.

Petrich, D. and Wilstrup, J., Jitter Analysis "101", A Primer for Jitter Testing of PLL Circuits, Notes, Tutorial 9, International Test Conference sponsored by IEEE Computer Society, Washington D.C., Oct. 1998.

* cited by examiner

| | Computer Systems | Telecommunication |
|---|---|---|
| Design Technology | CMOS | Bipolar, GaAs, CMOS |
| PLL Circuit | On-chip PLL | Discrete PLL |
| Signal | No modulation | Modulated signal |
| Jitter | Peak-to-peak jitter | Average jitter |
| Test method | Not available | Available |

Down: decrease the frequency  Up: Increase the frequency

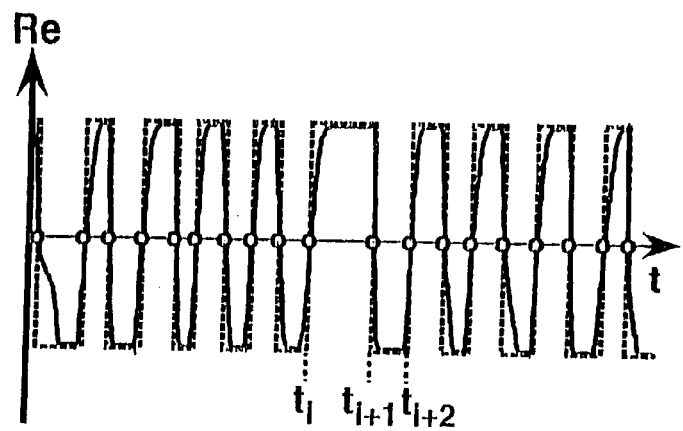
FIG. 25 (a) Prior Art
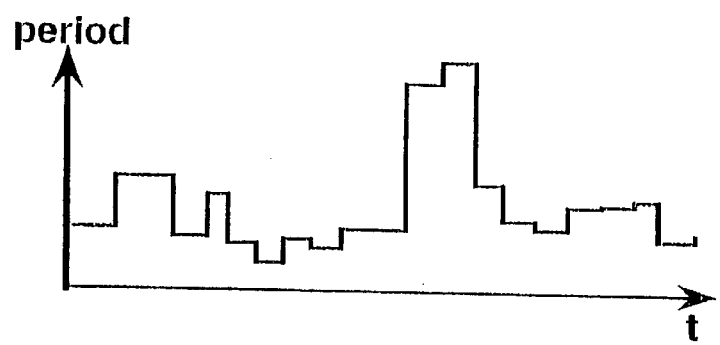
FIG. 25 (b) Prior Art

FIG. 30a
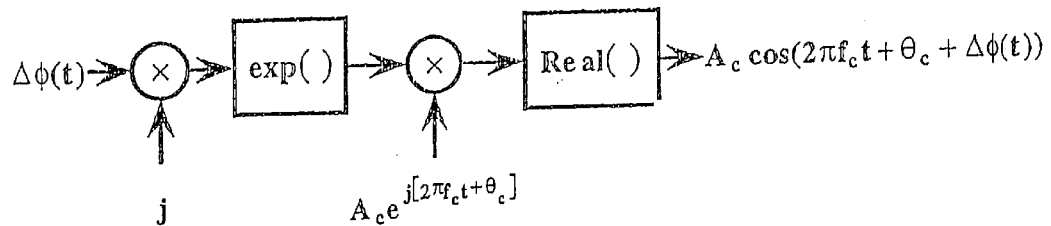
FIG. 30b
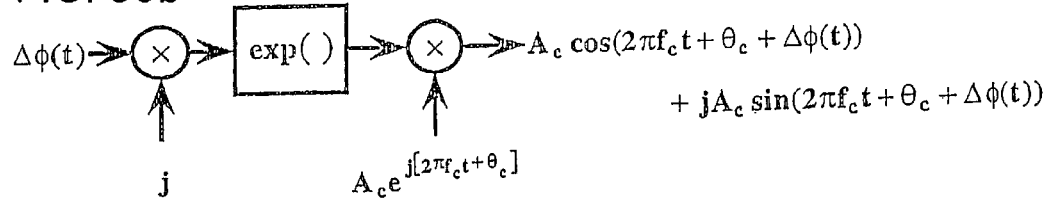
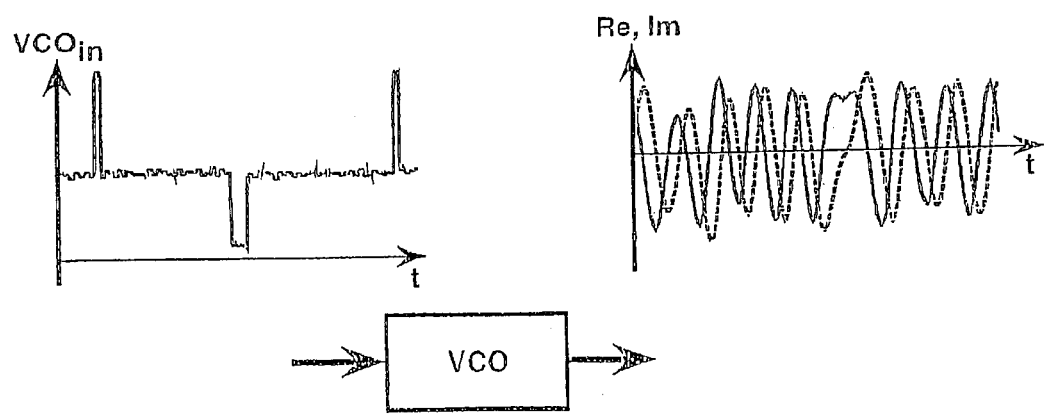
FIG. 31

AUTOMATIC TESTING EQUIPMENT

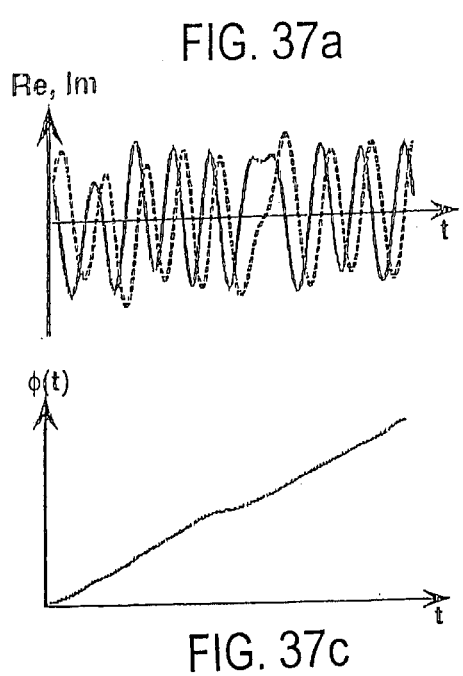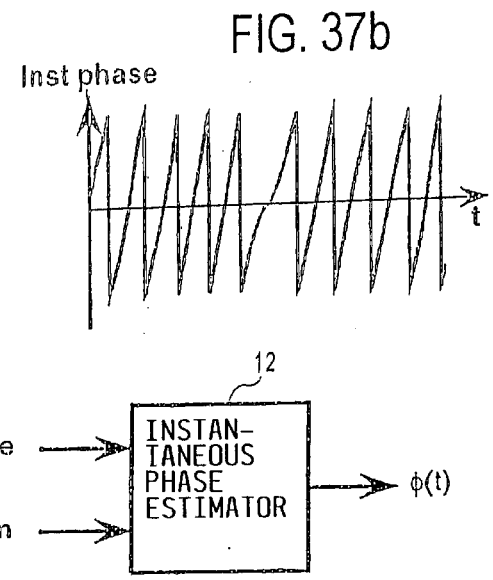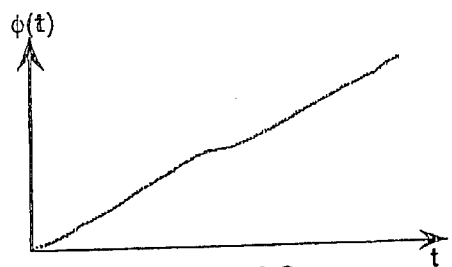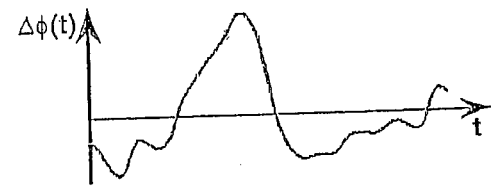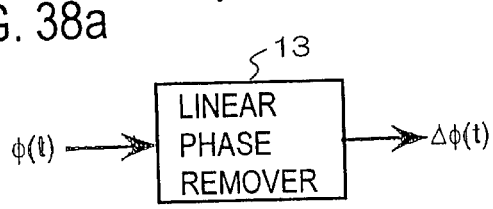

| | $\triangle\phi(t)$ Method | Zero-Crossing Method |
|---|---|---|
| Instantaneous Frequency | $\dfrac{1}{T_{ZERO}}$ | $\dfrac{1}{T_{ZERO}}$ |
| Minimum Sampling Frequency | any $f \geq 2f_c$ | fixed $f_c$ |
| Quadrature-Modulated Sampling Frequency | any $f \geq 2\Delta f$ | fixed $\Delta f$ |
| Heterodyned Sampling Frequency | any $f \geq 2\Delta f$ | fixed $\Delta f$ |
| Measuring Time | $\dfrac{1}{2K} \cdot \dfrac{N}{\Delta f}$ | $\dfrac{N}{\Delta f}$ |

FIG. 41

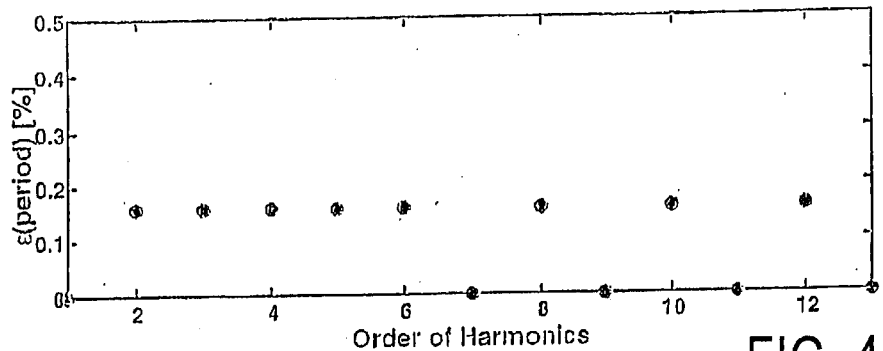
FIG. 44a
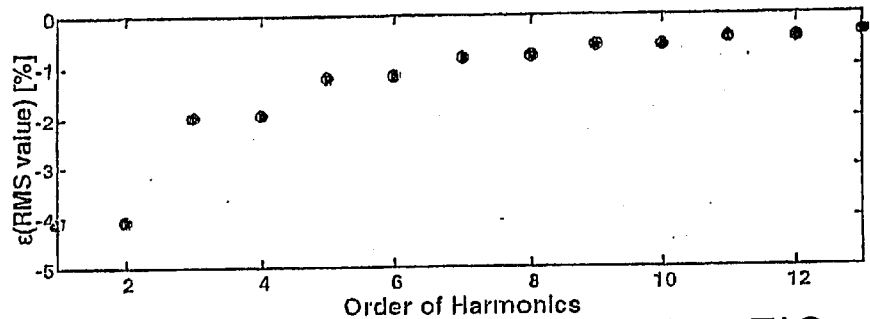
FIG. 44b
| Parameters | nMOS | pMOS | Unit |
|---|---|---|---|
| $V_{TO}$ | 0.7386893 | -0.9160475 | V |
| $t_{OX}$ | 135.23 | 134.216 | A |
| XL | -0.0672454 | -0.0287155 | μm |
| XW | -0.166238 | -0.200027 | um |
| RSH | 64.7204 | 117.086 | Ω/[] |
FIG. 45

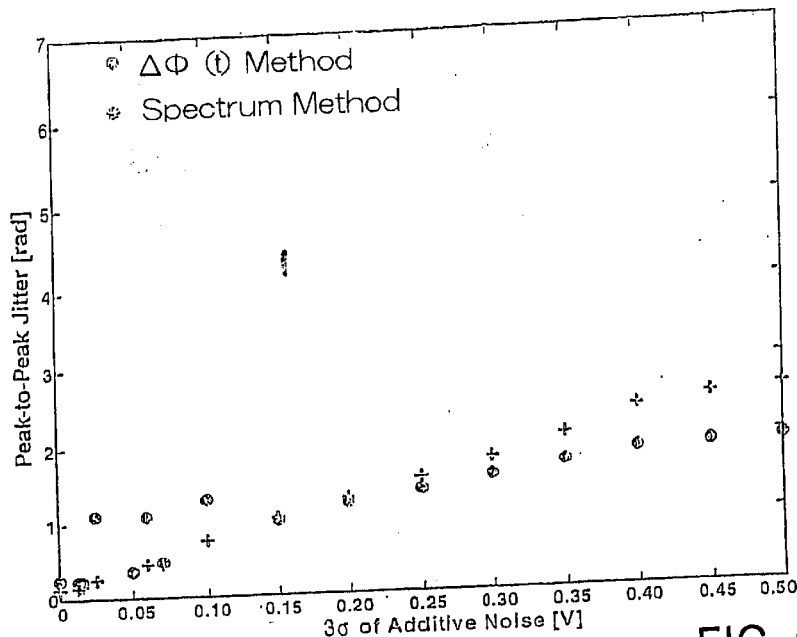
FIG. 60
FIG. 61a
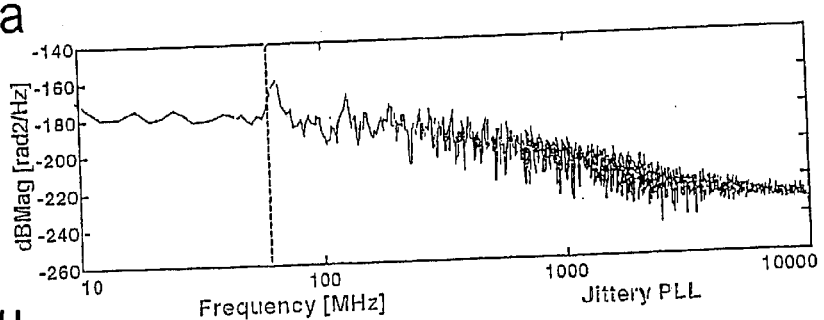
FIG. 61b
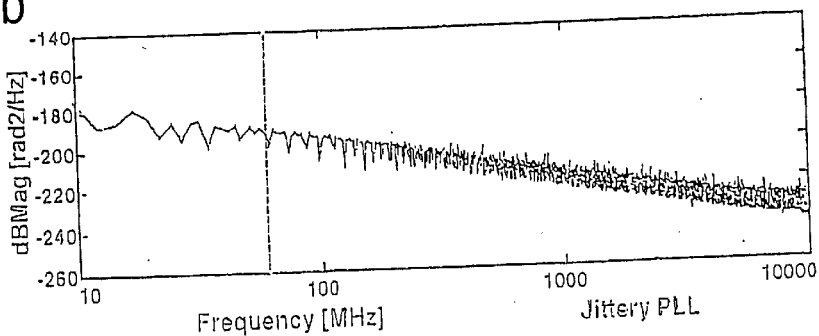

$\Delta \phi (t)$[nsec]

$J_{CC.}(t)$ [nsec]

Jpp(psec)

Jpp(t)[psec]

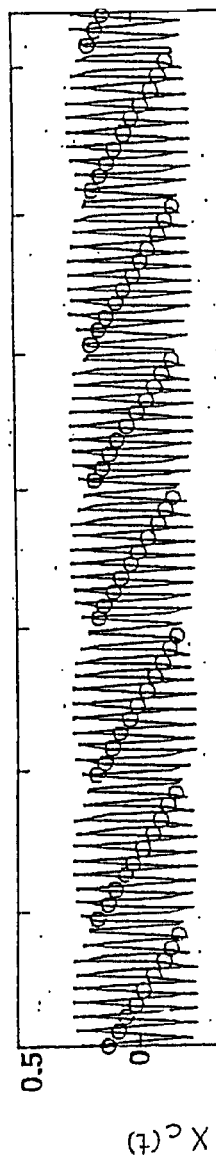
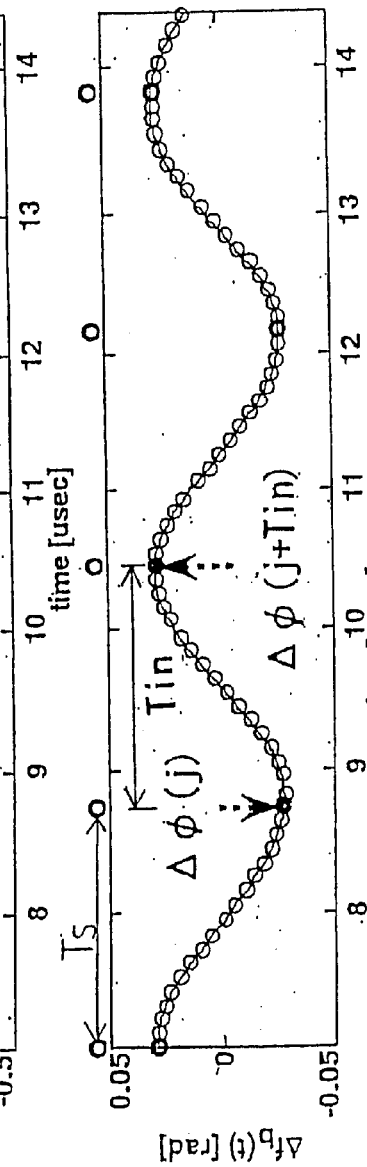
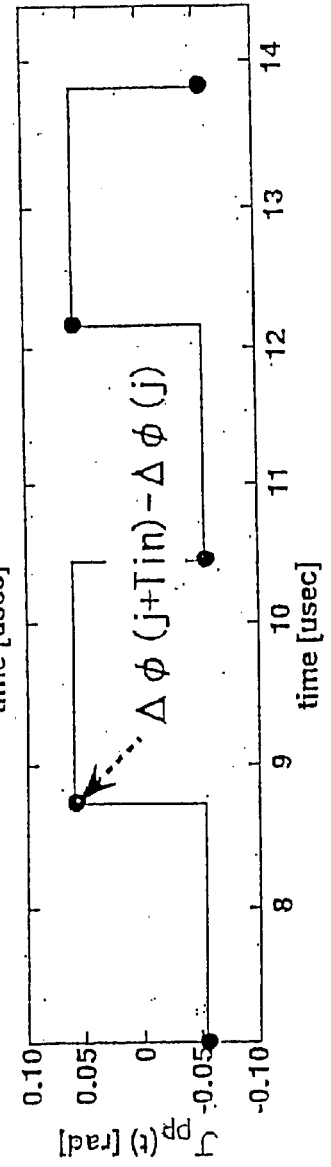
FIG. 99a
FIG. 99b
FIG. 99c

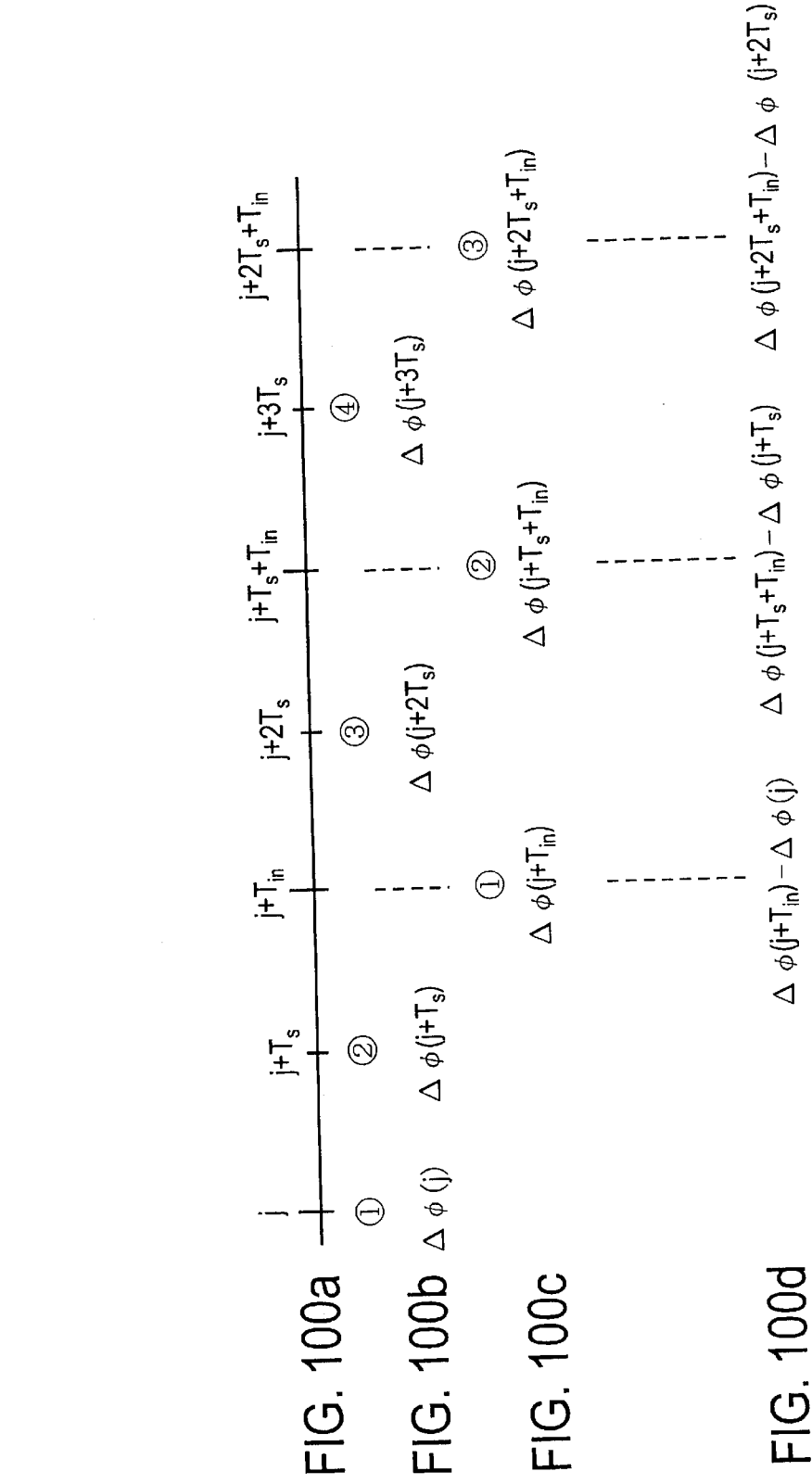

JITTER MEASURING DEVICE AND METHOD

CROSS-REFERENCE TO RELATED APPLICATIONS

This application is a continuation-in-part application of U.S. patent application Ser. No. 09/246,458 filed on Feb. 8, 1999, which is a continuation in part of Ser. No. 09/408,280 filed on Sep. 29, 1999.

BACKGROUND OF THE INVENTION

1. Field of the Invention

The present invention relates to an apparatus for and a method of measuring a jitter in a microcomputer. More particularly, the present invention relates to an apparatus for and a method of measuring a jitter in a clock generating circuit used in a microcomputer.

2. Description of the Related Art

In the past thirty years, the number of transistors on a VLSI (very large scale integrated circuit) chip has been exponentially increasing in accordance with Moore's law, and the clock frequency of a microcomputer has also been exponentially increasing in accordance with Moore's law. At present time, the clock frequency is about to exceed the limit of 1.0 GHz. (For example, see: Naoaki Aoki, H. P. Hofstee, and S. Dong; "GHz MICROPROCESSOR", INFORMATION PROCESSING vol. 39, No. 7, July 1998.) FIG. 1 is a graph showing a progress of clock period in a microcomputer disclosed in Semiconductor Industry Association: "The National Technology Roadmap for Semiconductors, 1997". In FIG. 1, an RMS jitter (root-mean-square jitter) is also plotted.

In a communication system, a carrier frequency and a carrier phase, or symbol timing are regenerated by applying non-linear operations to a received signal and by inputting the result of the non-linear process to a phase-locked loop (PLL) circuit. This regeneration corresponds to the maximum likelihood parameter estimation. However, when a carrier or a data cannot correctly be regenerated from the received signal due to an influence of a noise or the like, a retransmission can be requested to the transmitter. In a communication system, a clock generator is formed on a separate chip from the other components. This clock generator is formed on a VLSI chip using a.bipolar technology, GaAs technology or a CMOS technology.

In each of many microcomputers, an instruction execution is controlled by a clock signal having a constant period. The clock period of this clock signal corresponds to a cycle time of a microcomputer. (For example, see: Mike Johnson; "Superscale Microprocessor Design", Prentice-Hall, Inc., 1991.) If the clock period is too short, a synchronous operation becomes impossible and the system is locked. In a microcomputer, a clock generator is integrated in a same chip where other logical circuits are integrated. FIG. 2 shows, as an example, a Pentium chip. In FIG. 2, a white square (□) indicates a clock generating circuit. This microcomputer is produced utilizing a CMOS (complementary metal-oxide semiconductor) processing.

In a communication system, the average jitter or the RMS jitter is important. The RMS jitter contributes to an average noise of signal-to-noise ratio and increases the bit error rate. On the other hand, in a microcomputer, the worst instantaneous value of some parameter determines the operation frequency. That is, the peak-to-peak jitter (the worst value of jitter) determines the upper limit of the operation frequency.

Therefore, for testing of a PLL circuit in a microcomputer, there is required a method of measuring an instantaneous value of jitter accurately and in a short period of time. However, since a measurement of a jitter has been developed in the area of communications, there is no measuring method, in the present state, corresponding to this requirement in the area of microcomputers. It is an object of the present invention to provide a method of measuring an instantaneous value of jitter accurately and in a short period of time.

On the contrary, for testing of a PLL circuit in a communication system, there is required a method of measuring an RMS jitter accurately. Although it takes approximately 10 minutes of measuring time, a measuring method actually exists and is practically used. FIG. 3 collectively shows comparisons of clock generators between a microcomputer and a communication system.

A phase-locked loop circuit (PLL circuit) is a feedback system. In a PLL circuit, a frequency and a phase $\theta_i$ of a given reference signal are compared with a frequency and a phase $\theta_0$ of an internal signal source, respectively to control the internal signal source, using the differences therebetween, such that the frequency difference or the phase difference can be minimized. Therefore, a voltage-controlled oscillator (VCO) which is an internal signal source of a PLL circuit comprises a component or components the delay time of which can be varied. When a DC voltage is inputted to this oscillator, a repetitive waveform having a constant period proportional to the direct current value is outputted.

The PLL circuit relating to the present invention comprises a phase-frequency detector, a charge pump circuit, a loop filter and a VCO. FIG. 4 shows a basic circuit configuration of a PLL circuit in a block diagram form. Next, the operation of each of the circuit components will be briefly described.

A phase-frequency detector is a digital sequential circuit. FIG. 5 is a block diagram showing a circuit configuration of a phase-frequency detector comprising two D-type flip-flops D-FF1 and D-FF2 and an AND gate. A reference clock is applied to a clock terminal ck of the first D-type flip-flop D-FF1, and a PLL clock is applied to a clock terminal ck of the second D-type flip-flop D-FF2. A logical value "1" is supplied to each data input terminal D.

In the circuit configuration described above, when each of the two Q outputs of the both flip-flops becomes "1" at the same time, the AND gate resets the both flip-flops. The phase-frequency detector outputs, depending on the phase difference and the frequency difference between the two input signals, an UP signal for increasing the frequency or a DOWN signal for decreasing the frequency. (For example, see: R. Jacob Baker, Henry W. Li, and David E. Boyce; "CMOS Circuit Design, Layout, and Simulation", IEEE Press, 1998.)

FIG. 6 shows a state transition diagram of a phase-frequency detector (PFD). The phase-frequency detector transits the state by rise edges of a reference clock and a PLL clock. For example, as shown in FIG. 7, when the frequency of a reference clock is 40 MHz and the frequency of a PLL clock is 37 MHz, in order to increase the frequency, an UP signal is outputted during a time interval between the two rise edges. A similar operation is also performed when a phase difference is present between the reference clock and the PLL clock. The phase-frequency detector has the following characteristics compared with a phase detector using an Exclusive OR circuit. (For example, see: R. Jacob Baker, Henry W. Li, and David E. Boyce; "CMOS Circuit Design, Layout, and Simulation", IEEE Press, 1998.)

(i) The phase-frequency detector operates at a rising edge of an input clock, and does not relate to the shape of the waveform such as a pulse width of the clock.

(ii) The phase-frequency detector is not locked by a harmonic of the reference frequency.

(iii) Since both of the two outputs are logical "0" during a time period when the loop is locked, a ripple is not generated at the output of the loop filter.

The phase-frequency detector is highly sensitive to an edge. When an edge of a reference clock cannot be discriminated due to a noise, the phase-frequency detector is hung-up to some state. On the other hand, in a phase detector based on an Exclusive OR circuit, even if an edge cannot be discriminated, the average output is 0 (zero). Therefore, (iv) The phase-frequency detector is sensitive to a noise.

A charge pump circuit converts logical signals UP and DOWN from the phase-frequency detector (PFD) into specific analog signal levels ($i_p$, $-i_p$ and 0). The reason for the conversion is that, since signal amplitude in a digital circuit has a large allowance width, a conversion to a specific analog signal level is necessary. (For example, see: Floyd M. Gardner; "Phaselock Techniques", 2nd edition, John Wiley & Sons, 1979; and Heinrich Meyr and Gerd Ascheid; "Synchronization in Digital Communications", vol. 1, John Wiley & Sons, 1990.)

As shown in FIG. 8A, a charge pump circuit comprises two current sources. In this case, in order to simplify the model circuit, it is assumed that each of the current sources has the same current value $I_p$. Further, in order to simply describe an output current $i_p$ of the charge pump circuit, a negative pulse width is introduced as shown in FIG. 8B. The logical signals UP and DOWN open/close switches $S_1$ and $S_2$, respectively. That is, the logical signal UP closes the switch $S_1$ during a time period of positive pulse width τ and the logical signal DOWN closes the switch $S_2$ during a time period of negative pulse width τ. Therefore, the output current $i_p$ is represented, during the time period of pulse width τ, by the following equation.

$$i_p = I_p \text{sgn}(\tau) \quad (2.1.1)$$

Otherwise, the output current $i_p$ is as follows.

$$i_p = 0 \quad (2.1.2)$$

(For example, see: Mark Van Paemel; "Analysis of Charge-Pump PLL: A New Model", IEEE Trans. Commun., vol. 42, pp. 2490–2498, 1994.)

In this case, sgn(τ) is a sign function. The function sgn(τ) takes a value of +1 when τ is positive, and takes a value of −1 when τ is negative. When the two switches $S_1$ and $S_2$ are open, no current flows. Therefore, the output node is in high impedance.

A loop filter converts a current $i_p$ of the charge pump circuit into an analog voltage value $V_{CTRL}$. As shown in FIG. 9A, a first order loop filter can be constructed when a resister $R_2$ and a capacitor C are connected in series. When a constant current $i_p$ given by the equations (2.1.1) and (2.1.2) is inputted to the filter, an electric charge proportional to a time length is charged in the capacitor C. That is, as shown in FIG. 9B, the control voltage $V_{CTRL}$ linearly changes during the time period τ. In the other time period, the control voltage $V_{CTRL}$ remains constant (for example, see the literature of Mark Van Paemel).

$$V_{CTRL}(t) = \frac{1}{C}\int_{t_0}^{t} i_p(\tau)d\tau + V_{CTRL}(t_0), \quad (2.2)$$

$$V_{CTRL}(t) = I_p R_2 + \frac{I_p}{C}(t - t_0) + V_{CTRL}(t_0)$$

The resistance value and the capacitance value of the loop filter are selected such that an attenuation coefficient and a natural frequency are optimized. (For example, see: Jose Alvarez, Hector Sanchez, Gianfranco Gerosa and Roger Countryman; "A Wide-bandwidth Low-voltage PLL for Power PC Microprocessors", IEEE J. Solid-State Circuits, vol. 30, pp. 383–391, 1995; and Behzad Razavi; "Monolithic Phase-Locked Loops and Clock Recovery Circuits: Theory and Design", IEEE Press, 1996.) In the present invention, the loop filter is configured as a passive lag filter as shown in FIG. 10 in accordance with a thesis by Ronald E. Best listed below. (See: Ronald E. Best; "Phase-Locked Loops", 3rd edition, McGraw-Hill, 1997.) Because, as disclosed in this Ronald E. Best's publication, the combination of a phase-frequency detector and a passive lag filter has infinite pull-in range and hold range, and hence there is no merit in using an other type of filter. In FIG. 10, C=250 pF, $R_1$=920 Ω, and $R_2$=360 Ω are set. The VCO is constituted, as shown in FIG. 11, by thirteen stages of CMOS inverters IN-1, IN-2, . . . and IN-13. The power supply voltage is 5 V.

The linear characteristic of the voltage controlled oscillator VCO is given by the following equation.

$$f_{VCO} = K_{VCO} V_{CTRL} \quad (2.3)$$

In this case, $K_{VCO}$ is a gain of the VCO, and its unit is Hz/V.

When the PLL is in synchronous state (a state that a rise edge of a reference clock accords with a rise edge of a PLL clock), the phase-frequency detector outputs no signal. The charge pump circuit, the loop filter and the VCO provided in the rear stages of the PLL do not send/receive signals and keep maintain the internal state unchanged. On the contrary, when a rise edge of a reference clock does not accord with a rise edge of a PLL clock (in asynchronous state), the phase-frequency detector outputs an UP signal or a DOWN signal to change the oscillation frequency of the VCO. As a result, the charge pump circuit, the loop filter and the VCO provided in the rear stages of the PLL.circuit send/receive signals and transit into a corresponding state. Therefore, it could be understood, in order to measure an internal noise of the PLL circuit, that the PLL circuit must be placed in a synchronous state. On the other hand, in order to test a short-circuit failure or a delay failure of the PLL circuit, the PLL circuit must be moved into other state.

Now, a random jitter will be described.

A jitter on a clock appears as a fluctuation of a rise time and a fall time of a clock pulse series. For this reason, in the transmission of a clock signal, the receiving time or the pulse width of the clock pulse becomes uncertain. (For example, see: Ron K. Poon; "Computer Circuits Electrical Design", Prentice-Hall, Inc, 1995.) FIG. 12 shows jitters of a rise time period and a fall time period of a clock pulse series.

Any component in the blocks shown in FIG. 4 has a potential to cause a jitter. Among those components, the largest factors of a jitter are a thermal noise and a shot noise of the inverters composing the VCO. (For example, see: Todd C. Weigandt, Beomsup Kim and Paul R. Gray; "Analysis of Timing Jitter in CMOS Ring Oscillators", International Symposium on Circuits and System, 1994.)

Therefore, the jitter generated from the VCO is a random fluctuation and does not depend on the input. In the present invention, assuming that the major jitter source is the VCO, it is considered that the measurement of a random jitter of an oscillation waveform of the VCO is the most important problem to be solved.

In order to measure only a random jitter of an oscillation waveform of the VCO, it is necessary that the PLL circuit maintains the components other than the VCO to be inactive. Therefore, as mentioned above, it is important that a reference input signal to be supplied to the PLL circuit strictly maintains a constant period so that the PLL circuit under test does not induce a phase error. A concept of this measuring method is shown in FIG. 13.

As a preparation for discussing a phase noise, a zero crossing is defined. Assuming that the minimum value $-A$ of a cosine wave $A \cos(2\pi f_0 t)$ is 0% and the maximum value $+A$ thereof is 100%, a level of 50% corresponds to zero amplitude. A point where the waveform crosses a zero level is called a zero crossing.

A phase noise will be discussed with reference to, as an example, a cosine wave generated from an oscillator. An output signal $X_{IDEAL}(t)$ of an ideal oscillator is an ideal cosine wave having no distortion.

$$X_{IDEAL}(t) = A_c \cos(2\pi f_c t + \theta_c) \qquad (2.4)$$

In this case, $A_C$ and $f_C$ are nominal values of amplitude and a frequency, respectively, and $\theta_c$ is an initial phase angle. When the output signal $X_{IDEAL}(t)$ is observed in frequency domain, the output signal is measured as a line spectrum as shown in FIG. 14. In the actual oscillator, there are some differences from the nominal values. In this case, the output signal is expressed as follows.

$$X_{OSC}(t) = [A_c + \epsilon(t)] \cos(2\pi f_c t + \theta_c + \Delta\phi(t)) \qquad (2.5.1)$$

$$X_{OSC}(t) = A_c \cos(2\pi f_c t + \theta_c + \Delta\phi(t)) \qquad (2.5.2)$$

In the above equations, $\epsilon(t)$ represents a fluctuation of amplitude. In the present invention, the discussion will be made assuming that, as shown in the equation (2.5.2), the amplitude fluctuation $\epsilon(t)$ of the oscillator is zero. In the above equations, $\Delta\phi(t)$ represents a phase fluctuation. That is, $\Delta\phi(t)$ is a term for modulating the ideal cosine wave. The initial phase angle $\theta_C$ follows a uniform distribution in the range of an interval $(0, 2\pi)$. On the other hand, the phase fluctuation $\Delta\phi(t)$ is a random data and follows, for example, a Gaussian distribution. This $\Delta\phi(t)$ is called a phase noise.

In FIG. 15, an output signal $X_{IDEAL}(t)$ of an ideal oscillator and an output signal $X_{OSC}(t)$ of an actual oscillator are plotted. Comparing those signals with one another, it can be seen that the zero crossing of $X_{OSC}(t)$ is changed due to $\Delta\phi(t)$.

On the other hand, as shown in FIG. 16, when the oscillation signal $X_{OSC}(t)$ is transformed into frequency domain, the influence of a phase noise is observed as a spectrum diffusion in the proximity of the nominal frequency $f_0$. Comparing FIG. 15 with FIG. 16, it can be said that frequency domain is easier to observe the influence of a phase noise. However, even if the clock pulse shown in FIG. 12 is transformed into frequency domain, the maximum value of the pulse width fluctuation cannot be estimated. Because, the transformation is a process for averaging the fluctuation in certain frequencies, and in the summing step of the process, the maximum value and the minimum value are mutually canceled. Therefore, in a peak-to-peak jitter estimating method which is an object of the present invention, a process in time domain must be a nucleus of the method.

Here, it will be made clear that an additive noise at the reference input end to the PLL circuit is equal to an additive noise at the input end of the loop filter. (See: Floyd M. Gardner; "Phaselock Techniques", 2nd edition, John Wiley & Sons, 1979; and John G. Proakis; "Digital Communications", 2nd edition, McGraw-Hill, 1989.) FIG. 17 shows an additive noise at the reference input end to the PLL circuit. In order to simplify the calculation, it is assumed that a phase detector of the PLL circuit is a sine wave phase detector (mixer).

The PLL circuit is phase-synchronized with a given reference signal expressed by the following equation (2.6).

$$X_{ref}(t) = A_c \cos(2\pi f_c t) \qquad (2.6)$$

In this case, it is assumed that the following additive noise expressed by the equation (2.7) is added to this reference signal $X_{ref}(t)$.

$$X_{noise}(t) = n_i(t) \cos(2\pi f_c t) - n_q(t) \sin(2\pi f_c t) \qquad (2.7)$$

$$X_{VCO}(t) = \cos(2\pi f_c t + \Delta\phi) \qquad (2.8)$$

An oscillation waveform of the VCO expressed by the above equation (2.8) and the reference signal $X_{ref}(t) + X_{noise}(t)$ are inputted to the phase detector to be converted to a difference frequency component.

$$x_{PD}(t) = K_{PD}\left(\frac{A_c}{2}\cos(\Delta\phi) + \frac{n_i(t)}{2}\cos(\Delta\phi) - \frac{n_q(t)}{2}\sin(\Delta\phi)\right) \qquad (2.9)$$

$$= \frac{K_{PD}}{2} A_c \left[\cos(\Delta\phi) + \left(\frac{n_i(t)}{A_c}\cos(\Delta\phi) - \frac{n_q(t)}{A_c}\sin(\Delta\phi)\right)\right]$$

In this case, $K_{PD}$ is a gain of a phase comparator. Therefore, it can be understood that the additive noise of the reference signal is equal to that an additive noise expressed by the following equation (2.10) is applied to an input end of the loop filter.

$$x_{noise,LPF}(t) = \frac{n_i(t)}{A_c}\cos(\Delta\phi) - \frac{n_q(t)}{A_c}\sin(\Delta\phi) \qquad (2.10)$$

FIG. 18 shows an additive noise at the input end of the loop filter. If a power spectrum density of the additive noise at the reference input end of the PLL circuit is assumed to be $N_0[V^2/Hz]$, the power spectrum density $G_{nn}(f)$ of the additive noise at the input end of this loop filter is, from the equation (2.10), expressed by the following equation (2.11).

$$G_{nn}(f) = \frac{2N_0}{A_c^2} [V^2/Hz] \qquad (2.11)$$

Moreover, it can be seen from the equation (2.9) that when a phase difference $\Delta\phi$ between the oscillation waveform of the VCO and the reference signal becomes $\pi/2$, an output of the phase detector becomes zero. That is, if a sine wave phase detector is used, when the phase of the VCO is shifted by 90 degrees from the phase of the reference signal, the VCO is phase-synchronized with the reference signal. Further, in this calculation, the additive noise is neglected.

Next, using a model of equivalent additive noise shown in FIG. 17, an amount of jitter produced by an additive noise will be made clear. (See: Heinrich Meyr and Gerd Ascheid; "Synchronization in Digital Communications", vol. 1, John Wiley & Sons, 1990.) In order to simplify the expression, assuming $\theta_i = 0$, the phase $\theta_0$ of the output signal corresponds to an error. A phase spectrum of the oscillation waveform of the VCO is expressed by the equation (2.12).

$$G_{\theta_O \theta_O}(f) = |H(f)|^2 G_{nn}(f) \tag{2.12}$$

In this case, H(f) is a transfer function of the PLL circuit.

$$H(s) = \frac{\theta_o(s)}{\theta_i(s)} = \frac{K_{VCO} K_{PD} F(s)}{K_{VCO} K_{PD} F(s)} \tag{2.13}$$

Since a phase error is $-\theta_O$, a variance of the phase error is given by the following equation (2.14).

$$\sigma_{\Delta\phi}^2 = \frac{1}{\pi} \int_0^\infty |H(f)|^2 G_{nn}(f) df \tag{2.14}$$

Substituting the equation (2.11) for the equation (2.14), the following two equations are obtained.

$$\sigma_{\Delta\phi}^2 = \frac{2N_0}{A_c^2} B_e \tag{2.15.1}$$

$$\sigma_{\Delta\phi}^2 = \frac{1}{\left(\frac{A_c}{\sqrt{2}}\right)^2} \tag{2.15.2}$$

$$\frac{\left(\frac{A_c}{\sqrt{2}}\right)^2}{N_0 B_e}$$

That is, if a signal to noise ratio of the loop $$\frac{\left(\frac{A_c}{\sqrt{2}}\right)^2}{N_0 B_e}$$

is large, a phase noise becomes small. In this case, $B_e$ is an equivalent noise band width of the loop.

As described above, an additive noise at the reference input end of the PLL circuit or an additive noise at the input end of the loop filter is observed as an output phase noise, which is a component passed through a lowpass filter corresponding to the loop characteristic. The power of a phase noise is inversely proportional to a signal to noise ratio of the PLL loop.

Next, a discussion will be made as to how a phase fluctuation due to an internal noise of the VCO influences a phase of output signal of the PLL. (See: Heinrich Meyr and Gerd Ascheid; "Synchronization in Digital Communications", vol. 1, John Wiley & Sons, 1990.) An output signal of the VCO is assumed to be expressed by the following equation (2.16).

$$X_{VCO, \text{ noise}} = A_c \cos(2\pi f_c t + \theta_p(t) + \Psi(t)) \tag{2.16}$$

In this case, $\theta_p(t)$ is a phase of an ideal VCO. An internal thermal noise or the like generates $\Psi(t)$. The generated $\Psi(t)$ is an internal phase noise and randomly fluctuates the phase of the VCO. FIG. 19 shows an internal phase noise model of the VCO. A phase $\theta_p(S)$ at the output end of the ideal VCO is given by a equation (2.17).

$$\theta_p(s) = K_{PD} K_{VCO} \frac{F(s)}{s} \Phi(s) \tag{2.17}$$

In this case, $\Phi(t)$ is a phase error and corresponds to an output of the phase detector.

$$\Phi(s) = \theta_i(s) - \theta_o(s) = \theta_i(s) - (\theta_p(s) + \Psi(s)) \tag{2.18}$$

Substituting $\theta_p(S)$ of the equation (2.17) for that of the equation (2.18), the following equation (2.19) is obtained.

$$\Phi(s) = \theta_i(s) - \left[\frac{K_{PD} K_{VCO} F(s)}{s} \Phi(s) + \Psi(s)\right] \tag{2.19}$$

The following equation (2.20.1) can be obtained by rearranging the above equation (2.19).

$$\Phi(s) = \frac{1}{1 + \frac{K_{PD} K_{VCO} F(s)}{s}} (\theta_i(s) - \Psi(s)) \tag{2.20.1}$$

Substituting the equation (2.13) for the equation (2.20.1), the following equation (2.20.2) is obtained.

$$\Phi(s) = (1 - H(s))(\theta_i(s) - \Psi(s)) \tag{2.20.2}$$

Therefore, a phase fluctuation due to an internal noise of the VCO is expressed by the following equation (2.21).

$$\sigma_\Phi^2 = \frac{1}{\pi} \int_0^\infty |1 - H(f)|^2 G_{\Psi\Psi}(f) df \tag{2.21}$$

That is, an internal phase noise of the VCO is observed as a phase noise of an output signal of the PLL circuit, which is a component passed through a highpass filter. This highpass filter corresponds to a phase error transfer function of the loop.

As stated above, an internal thermal noise of the VCO becomes a phase noise of an oscillation waveform of the VCO. Further, a component passed through the highpass filter corresponding to a loop phase error is observed as an output phase noise.

An additive noise of the PLL circuit and/or an internal thermal noise of the VCO is converted to a phase noise of an oscillation waveform of the VCO. An additive noise of the PLL circuit and/or an internal thermal noise of the VCO is observed, correspondingly to the path from a block generating a noise through the output of the PLL circuit, as a phase noise of a low frequency component or a high frequency component. Therefore, it can be seen that a noise of the PLL circuit has an effect to give a fluctuation to a phase of an oscillation waveform of the VCO. This is equivalent to a voltage change at the input end of the VCO. In the present invention, an additive noise is applied to the input end of the VCO to randomly modulate the phase of a waveform of the VCO so that a jitter is simulated. FIG. 20 shows a method of simulating a jitter.

Next, a method of measuring a jitter of a clock will be explained. A peak-to-peak jitter is measured in time domain and an RMS jitter is measured in frequency domain. Each of those conventional jitter measuring methods requires approximately 10 minutes of test time. On the other hand, in the case of a VLSI test, only approximately 100 msec of test time is allocated to one test item. Therefore, the conventional method of measuring a jitter cannot be applied to a test in the VLSI production line.

In the study of the method of measuring a jitter, the zero crossing is an important concept. From the view point of period measurement, a relationship between the zero crossings of a waveform and the zero crossings of the fundamental waveform of its fundamental frequency will be discussed. It will be proven that "the waveform of its fundamental frequency contains the zero-crossing information of the original waveform". In the present invention, this characteristic of the fundamental waveform is referred to as "theorem of zero crossing.". An explanation will be given on an ideal clock waveform $X_{d50\%}(t)$ shown in FIG. 21, as an example, having 50% duty cycle. Assuming that a period of this clock waveform is $T_0$, the Fourier transform of the clock waveform is given by the following equation (3.1). (For example, refer to a reference literature c1.)

$$S_{d50\%}(f) = \sum_{k=-\infty}^{+\infty} \frac{2\sin\left(\frac{\pi k}{2}\right)}{k} \delta(f - kf_0) \tag{3.1}$$

That is, a period of the fundamental wave is equal to a period of the clock.

$$T_0 = \frac{1}{f} \delta(f - f_0) \tag{3.2}$$

When the fundamental waveform of the clock signal is extracted, its zero crossings correspond to the zero crossings of the original clock waveform. Therefore, a period of a clock waveform can be estimated from the zero crossings of its fundamental waveform. In this case, the estimation accuracy is not improved even if some harmonics are added to the fundamental waveform. However, harmonics and an estimation accuracy of a period will be verified later.

Next, Hilbert transform and an analytic signal will be explained (for example, refer to a reference literature c2).

As can be seen from the equation (3.1), when the Fourier transform of the waveform $X_a(t)$ is calculated, a power spectrum $S_{aa}(f)$ ranging from negative frequencies through positive frequencies can be obtained. This is called a two-sided power spectrum. The negative frequency spectrum is a mirror image of the positive frequency spectrum about an axis of f=0. Therefore, the two-sided power spectrum is symmetric about the axis of f=0, i.e., $S_{aa}(-f)=S_{aa}(f)$. However, the spectrum of negative frequencies cannot be observed. There can be defined a spectrum $G_{aa}(f)$ in which negative frequencies are cut to zero and, instead, observable positive frequencies are doubled. This is called one-sided power spectrum.

$G_{aa}(f)=2S_{aa}(f) f>0$ $G_{aa}(f)=0$ $f<0$ (3.3.1)

$G_{aa}(f)=S_{aa}(f)[1+\text{sgn}(f)]$ (3.3.2)

In this case, sgn(f) is a sign function, which takes a value of +1 when f is positive and takes a value of −1 when f is negative. This one-sided spectrum corresponds to a spectrum of an analytic signal z(t). The analytic signal z(t) can be expressed in time domain as follows.

$$z(t) = x_a(t) + j\hat{x}_a(t) \tag{3.4}$$

$$\hat{x}_a(t) = H[x_a(t)] = \frac{1}{\pi}\int_{-\infty}^{+\infty} \frac{x_a(\tau)}{t-\tau} d\tau \tag{3.5}$$

The real part corresponds to the original waveform $X_a(t)$. The imaginary part is given by the Hilbert transform $\hat{x}_a(t)$ of the original waveform. As shown by the equation (3.5), the Hilbert transform $\hat{x}_a(t)$ of a waveform $X_a(t)$ is given by a convolution of the waveform $X_a(t)$ and $\frac{1}{\pi t}$ Let's obtain the Hilbert transform of a waveform handled in the present invention. First, the Hilbert transform of a cosine wave is derived.

$$H[\cos(2\pi f_0 t)] = -\frac{1}{\pi}\int_{-\infty}^{+\infty} \frac{\cos(2\pi f_0 \tau)}{\tau - t} d\tau$$

$$= -\frac{1}{\pi}\int_{-\infty}^{+\infty} \frac{\cos(2\pi f_0 (y+t))}{y} dy$$

$$= \frac{1}{\pi}\left[\cos(2\pi f_0 t)\int_{-\infty}^{+\infty} \frac{\cos(2\pi f_0 y)}{y} dy - \sin(2\pi f_0 t)\int_{-\infty}^{+\infty} \frac{\cos(2\pi f_0 y)}{y} dy\right]$$

Since the integral of the first term is equal to zero and the integral of the second term is π, the following equation (3.6) is obtained.

$H[\cos(2\pi f_0 t)]=\sin(2\pi f_0 t)$ (3.6)

Similarly, the following equation (3.7) is obtained.

$H[\sin(2\pi f_0 t)]=-\cos(2\pi f_0 t)$ (3.7)

Next, the Hilbert transform of a square wave corresponding to a clock waveform will be derived (for example, refer to a reference literature c3). The Fourier series of an ideal clock waveform shown in FIG. 21 is given by the following equation (3.8).

$$x_{d50\%}(t) = \frac{1}{2} + \frac{2}{\pi}\left[\cos\frac{2\pi}{T_0}t - \frac{1}{3}\cos 3\frac{2\pi}{T_0}t + \frac{1}{5}\cos 5\frac{2\pi}{T_0}t - \ldots\right] \tag{3.8}$$

The Hilbert transform is given, using the equation (3.6), by the following equation (3.9).

$$H[x_{d50\%}(t)] = \frac{2}{\pi}\left[\sin\frac{2\pi}{T_0}t - \frac{1}{3}\sin 3\frac{2\pi}{T_0}t + \frac{1}{5}\sin 5\frac{2\pi}{T_0}t - \ldots\right] \tag{3.9}$$

FIG. 22 shows examples of a clock waveform and its Hilbert transform. Those waveforms are based on the partial summation up to the 11th-order harmonics, respectively. The period $T_0$ in this example is 20 nsec.

An analytic signal z(t) is introduced by J. Dugundji to uniquely obtain an envelope of a waveform. (For example, refer to a reference literature c4.) If an analytic signal is expressed in a polar coordinate system, the following equations (3.10.1), (3.10.2) and (3.10.3) are obtained.

$$z(t) = A(t)e^{j\Theta(t)} \tag{3.10.1}$$

$$A(t) = \sqrt{x_a^2(t) + \hat{x}_a^2(t)} \tag{3.10.2}$$

-continued $$\Theta(t) = \tan^{-1}\left[\frac{\hat{x}_a(t)}{x_a(t)}\right] \quad (3.10.3)$$

In this case, A(t) represents an envelope of $X_a(t)$. For this reason, z(t) is called pre-envelope by J. Dugundji. Further, $\Theta(t)$ represents an instantaneous phase of $X_a(t)$. In the method of measuring a jitter according to the present invention, a method of estimating this instantaneous phase is the nucleus.

If a measured waveform is handled as a complex number, its envelope and instantaneous phase can simply be obtained. Hilbert transform is a tool for transforming a waveform to an analytic signal. An analytic signal can be obtained by the procedure of the following Algorithm 1.

Algorithm 1 (Procedure for transforming a real waveform to an analytic signal):

1. A waveform is transformed to a frequency domain using fast Fourier transform;
2. Negative frequency components are cut to zero and positive frequency components are doubled; and
3. The spectrum is transformed to a time domain using inverse fast Fourier transform.

Next, a phase unwrap method for converting a phase to a continuous phase will briefly be described.

The phase unwrap method is a method proposed to obtain a complex cepstrum. (For example, refer to a reference literature c5.) When a complex logarithmic function log(z) is defined as an arbitrary complex number satisfying $e^{\log(z)} = z$, the following equation (3.11) can be obtained. (For example, refer to a reference literature c6.)

$$\log(z) = \log|z| + j\mathrm{ARG}(z) \quad (3.11)$$

The result of Fourier transform of a time waveform $X_a(n)$ is assumed to be $S_a(e^{j\omega})$. When its logarithmic magnitude spectrum $\log|S_a(e^{j\omega})|$ and phase spectrum $\mathrm{ARG}[S_a(e^{j\omega})]$ correspond to a real part and an imaginary part of a complex spectrum, respectively, and inverse Fourier transform is applied, a complex cepstrum $C_a(n)$ can be obtained.

$$c_a(n) = \frac{1}{2\pi}\int_{-\pi}^{+\pi} \log[S_a(e^{j\omega})]e^{j\omega n}\,d\omega \quad (3.12)$$

$$= \frac{1}{2\pi}\int_{-\pi}^{+\pi} \{\log|S_a(e^{j\omega})| + j\mathrm{ARG}[S_a(e^{j\omega})]\}e^{j\omega n}\,d\omega$$

In this case, ARG represents the principal value of the phase. The principal value of the phase lies in the range $[-\pi, \pi]$. There exist discontinuity points at $-\pi$ and $+\pi$ in the phase spectrum of the 2nd term. Since an influence of those discontinuity points diffuses throughout entire time domain by the application of inverse Fourier transform, a complex cepstrum cannot accurately be estimated. In order to convert a phase to a continuous phase, an unwrapped phase is introduced. An unwrapped phase can be uniquely given by integrating a derived function of a phase.

$$arg[S_a(e^{j\omega})] = \int_0^{\omega} \frac{d\,\mathrm{ARG}[S_a(e^{j\eta})]}{d\eta}\,d\eta \quad (3.13.1)$$

$$arg[S_a(e^{j0})] = 0 \quad (3.13.2)$$

Where, arg represents an unwrapped phase. An algorithm for obtaining an unwrapped phase by removing discontinuity points from a phase spectrum in frequency domain has been developed by Ronald W. Schafer and Donald G. Childers (for example, refer to a reference literature c7).

Algorithm 2:

1. $ARG(0) = 0, C(0) = 0$

2. $C(k) = \begin{cases} C(k-1) - 2\pi, & \text{if } ARG(k) - ARG(k-1) > \pi \\ C(k-1) + 2\pi, & \text{if } ARG(k) - ARG(k-1) < \pi \\ C(k-1), & \text{otherwise.} \end{cases}$ 3. $arg(k) = ARG(k) + C(k)$ An unwrapped phase will be obtained by the above Algorithm 2. First, a judgment is made, by obtaining differences between main values of adjacent phases, to see if there is. a discontinuity point. If there is a discontinuity point, $\pm 2\pi$ is added to the main value to remove the discontinuity point from the phase spectrum (refer to the reference literature c7).

In the above algorithm 2, it is assumed that a difference between adjacent phases is smaller than $\pi$. That is, a resolution for observing a phase spectrum is required to be sufficiently small. However, at a frequency in the proximity of a pole (a resonance frequency), the phase difference between the adjacent phases is larger than $\pi$. If a frequency resolution for observing a phase spectrum is rough, it cannot be determined whether or not a phase is increased or decreased by equal to or more than $2\pi$. As a result, an unwrapped phase cannot be accurately obtained. This problem has been solved by Jose M. Tribolet. That is, Jose M. Tribolet proposed a method wherein the integration of the derived function of a phase in the equation (3.12) is approximated by a numerical integration based on a trapezoidal rule and a division width of the integrating section is adaptively subdivided to fine pieces until an estimated phase value for determining whether or not a phase is increased or decreased by equal to or more than $2\pi$ is obtained (for example, refer to a reference literature c8). In such a way, an integer 1 of the following equation, (3.14) is found.

$$arg[S_a(e^{j\Omega})] = \mathrm{ARG}[S_a(e^{j\Omega})] + 2\pi l(\Omega) \quad (3.14)$$

The Tribolet's algorithm has been expanded by Kuno P. Zimmermann to a phase unwrap algorithm in time domain (for example, refer to a reference literature c9).

In the present invention, the phase unwrap is used to convert an instantaneous phase waveform in time domain into a continuous phase by removing discontinuity points at $-\pi$ and $+\pi$ from the instantaneous phase waveform. A sampling condition for uniquely performing the phase unwrap in time domain will be discussed later.

Next, a linear trend estimating method to be utilized to obtain a linear phase from a continuous phase will briefly be described (for example, refer to reference literatures c10 and c11).

The target of the linear trend estimating method is to find a linear phase g(x) adaptable to a phase data $y_i$.

$$g(x) = a + bx \quad (3.15)$$

In this case, "a" and "b" are the constants to be found. A square error R between $g(x_i)$ and each data $(x_i, y_i)$ is given by the following equation (3.16).

$$R = \sum_{i=1}^{L} (y_i - a - bx_i)^2 \quad (3.16)$$

In this case, L is the number of phase data. A linear phase for minimizing the square error is found. A partial differentiation of the equation (3.16) with respect to each of the unknown constants a and b is calculated and the result is put into zero. Then the following equations (3.17.1) and (3.17.2) can be obtained.

$$\frac{\partial R}{\partial a} = \sum_{i=1}^{L}(y_i - a - bx_i) = 0 \quad (3.17.1)$$

$$\frac{\partial R}{\partial b} = \sum_{i=1}^{L} x_i(y_i - a - bx_i) = 0 \quad (3.17.2)$$

Those equations are transformed to obtain the following equation (3.18).

$$\begin{bmatrix} L & \sum x_i \\ \sum x_i & \sum x_i^2 \end{bmatrix} \begin{bmatrix} a \\ b \end{bmatrix} = \begin{bmatrix} \sum y_i \\ \sum x_i y_i \end{bmatrix} \quad (3.18)$$

Therefore, the following equation (3.19) can be obtained.

$$\begin{bmatrix} a \\ b \end{bmatrix} = \frac{1}{L\sum x_i^2 - (\sum x_i)^2} \begin{bmatrix} \sum x_i^2 & -\sum x_i \\ -\sum x_i & L \end{bmatrix} \begin{bmatrix} \sum y_i \\ \sum x_i y_i \end{bmatrix} \quad (3.19)$$

That is, a linear phase can be estimated from the following equations (3.20.1) and (3.20.2).

$$a = \frac{\sum x_i^2 \sum y_i - \sum x_i \sum x_i y_i}{L\sum x_i^2 - (\sum x_i)^2} \quad (3.20.1)$$

$$b = \frac{L\sum x_i y_i - \sum x_i \sum y_i}{L\sum x_i^2 - (\sum x_i)^2} \quad (3.20.2)$$

In the present invention, when a linear phase is estimated from a continuous phase, a linear trend estimating method is used.

As apparent from the above discussion, in the conventional method of measuring a jitter, a peak-to-peak jitter is measured in time domain using an oscilloscope and an RMS jitter is measured in frequency domain using a spectrum analyzer.

In the method of measuring a jitter in time domain, a peak-to-peak jitter $J_{PP}$ of a clock signal is measured in time domain. A relative fluctuation between zero crossings becomes a problem as a peak-to-peak jitter $J_{PP}$. Therefore, for example, like a clock signal in a computer or the like shown in FIG. 81a, when a jitter-free clock signal has a waveform shown by a dotted line, in a jittery clock signal, for example paying attention to a rising point of the waveform, a time interval $T_{int}$ between a rising point and a next rising point each fluctuating toward leading side and trailing side from the rising point of the dotted line waveform as a center fluctuates. This instantaneous interval $T_{int}$ is obtained as a peak-to-jitter $J_{PP}$. FIGS. 23 and 24 show a measured example of a peak-to-peak jitter measured using an oscilloscope and the measuring system, respectively. A clock signal under test is applied to a reference input of the phase detector. In this case, the phase detector and the signal generator compose a phase-locked loop. A signal of the signal generator is synchronized with the clock signal under test and is supplied to an oscilloscope as a trigger signal. In this example, a jitter of rise edge of the clock signal is observed. A square zone is used to specify a level to be crossed by the signal. A jitter is measured as a varying component of time difference between "a time point when the clock signal under test crosses the specified level" and "a reference time point given by the trigger signal". This method.requires a longer time period for the measurement. For this reason, the trigger signal must be phase-synchronized with the clock signal under test so that the measurement is not influenced by a frequency drift of the clock signal under test.

A measurement of a jitter in time domain corresponds to a measurement of a fluctuation of a time point when a level is crossed by the signal. This is called, in the present invention, a zero crossing method. Since a change rate of a waveform is maximum at the zero crossing, a timing error of a time point measurement is minimum at the zero crossing.

$$\Delta t = \left|\frac{\Delta A}{A 2\pi f_0 \sin(2\pi f_0 t)}\right| \geq \frac{\Delta A}{2\pi f_0 A} \quad (3.21)$$

In FIG. 25(a), the zero crossing is indicated by each of small circles. A time interval between a time point $t_i$ that a rise edge crosses a zero amplitude level and a.time point $t_{i+2}$ that a next rise edge crosses a zero amplitude level gives a period of this cosine wave. FIG. 25(b) shows an instantaneous period $P_{inst}$ obtained from the zero crossing (found from adjacent zero crossings $t_{j+1}$ and $t_{i+2}$). A instantaneous frequency $f_{inst}$ is given by an inverse number of $P_{inst}$.

$$P_{inst}(t_{i+2}) = t_{i+2} - t_i, P_{inst}(t_{i+2}) = 2(t_{i+2} - t_{i+1}) \quad (3.22.1)$$

$$f_{inst}(t_{i+2}) = 1/p_{inst}(t_{i+2}) \quad (3.22.2)$$

Problems in measuring a jitter in time domain will be discussed. In order to measure a jitter, a rise edge of a clock signal under test $X_C(t)$ is captured, using an oscilloscope, at a timing of the zero crossing.

$$X_c(t) = A_c \cos(2\pi f_c t + \theta_c + \Delta\phi(t)) \quad (3.23)$$

This means that only $X_C(t)$ satisfying the next condition of phase angle given by the following equation (3.24) can be collected.

$$2\pi f_0 t_{3\pi/2} + \theta_c + \Delta\phi(t_{3\pi/2}) = \pm 2m\pi + \frac{3\pi}{2} \quad (3.24)$$

A probability density function of a sample corresponding to the zero crossing of a rise edge is given by the following equation (3.25). (For example, refer to a reference literature c10.)

$$\frac{1}{2\pi\sqrt{A_c^2 - x_c^2(t)}}\bigg|_{x_c(t)=0} \quad (3.25)$$

Therefore, a time duration required for randomly sampling a clock signal under test to collect phase noises $\Delta\phi(t_{3\pi/2})$ of N points is given by the following equation (3.26).

$$(2\pi A_c)(NT_0) \quad (3.26)$$

That is, since only zero crossing samples can be utilized for a jitter estimation, at least $(2\pi A_c)$ times of test time period is required compared with an usual measurement.

As shown in FIG. 26, the magnitude of a set of phase noises which can be sampled by the zero crossing method is smaller than an entire set of phase noises. Therefore, a peak-to-peak jitter $$J_{pp}, 3\pi/2$$

which can be estimated is equal to or smaller than a true peak-to-peak jitter $J_{PP}$.

$$J_{pp} = \max_k(\Delta\phi(k)) - \min_l(\Delta\phi(l))$$

$$J_{pp}, 3\pi/2 \leq J_{pp} \quad (3.27)$$

The worst drawback of the zero crossing method is that a time resolution of the period measurement cannot be selected independently on a period of a signal under test. The time resolution of this method is determined by a period of the signal under test, i.e., the zero crossing. FIG. 27 is a diagram in which the zero crossings of the rise edges are plotted on a complex plane. The sample in the zero crossing method is only one point indicated by an arrow, and the number of samples per period cannot be increased. When a number $n_j$ is given to the zero crossing of a rise edge, the zero crossing method measures a phase difference expressed by the following equation (3.28).

$$n_i(2\pi) \quad (3.28)$$

As a result, an instantaneous period measured by the zero crossing method comes to, as shown in FIG. 25(b), a rough approximation obtained by use of a step function.

In 1988, David Chu invented a time interval analyzer (for example, refer to reference literatures c12 and c13). In the time interval analyzer, when integer values $n_i$ of the zero crossings $n_i(2\pi)$ of the signal under test are counted, the elapsed time periods $t_i$ are also simultaneously counted. By this method, the time variation of the zero crossing with respect to the elapsed time period could be plotted. Further, by using $(t_i, n_i)$, a point between measured data can smoothly be interpolated by spline functions. As a result, it was made possible to observe an instantaneous period approximated in higher order. However, it should be noted that David Chu's time interval analyzer is also based on the zero crossing measurement of a signal under test. Although the interpolation by spline functions makes it easier to understand the physical meaning, the fact is that only the degree of approximation of an instantaneous period is increased. Because, the data existing between the zero crossings have not been still measured. That is, the time interval analyzer cannot either exceed the limit of the zero crossing method. An opposite example for interpolating the instantaneous data will be discussed later.

Next, a method of measuring a jitter in frequency domain will be described.

An RMS jitter $J_{RMS}$ of a clock signal is measured in frequency domain. For example, in a data communication, a deviation from an ideal timing point becomes a problem as an RMS jitter $J_{RMS}$. Therefore, as shown in FIG. 81b, when a jitter-free square wave signal has a waveform shown by a dotted line, a rising timing of a jittery waveform fluctuates. In this case, a deviating width of an actual rising point (solid line) against a normal rising point (dotted line) is obtained as an RMS jitter $J_{RMS}$. FIGS. 28 and 29 show an example of an RMS jitter measured by using a spectrum analyzer and a measuring system using a spectrum analyzer, respectively. A clock signal under test is inputted to a phase detector as a reference frequency. In this case, the phase detector and the signal generator compose a phase-locked loop. A phase difference signal between the clock signal under test detected by the phase detector and the signal from the signal generator is inputted to the spectrum analyzer to observe a phase noise spectrum density function. An area below the phase noise spectrum curve shown in FIG. 28 corresponds to an RMS jitter $J_{RMS}$. The frequency axis expresses the offset frequencies from the clock frequency. That is, zero (0) Hz corresponds to the clock frequency.

A phase difference signal $\Delta\phi(t)$ between the clock signal under test $X_C(t)$ expressed by the equation (3.23) and a reference signal expressed by the following equation (3.29) is outputted from the phase detector.

$$x_{ref}(t) = A \cos(2\pi f_c t + \theta_0) \quad (3.29)$$

At this point in time, since the reference signal being applied to a phase-locked loop circuit (PLL circuit) under test has a constant period, the phase difference signal $\Delta\phi(t)$ corresponds to a phase noise waveform. When the phase difference signal $\Delta\phi(t)$ observed during a finite time period T and is transformed into frequency domain, a phase noise power spectrum density function $G_{\Delta\phi\Delta\phi}(f)$ can be obtained.

$$S_{\Delta\phi}(f) = \int_0^T \Delta\phi(t)e^{-2\pi ft} dt \quad (3.30)$$

$$G_{\Delta\phi\Delta\phi}(f) = \lim_{T\to\infty} \frac{2}{T} E[|S_{\Delta\phi}(f)|^2] \quad (3.31)$$

From Parseval's theorem, a mean square value of a phase noise waveform is given by the following equation (3.32). (For example, refer to a reference literature c14.)

$$E[\Delta\phi^2(t)] \equiv \lim_{T\to\infty} \frac{1}{T} \int_0^T \Delta\phi^2(t) dt = \int_0^\infty G_{\Delta\phi\Delta\phi}(f) df \quad (3.32)$$

That is, it can be understood that by measuring a sum of the power spectrum, a mean square value of a phase noise waveform can be estimated. A positive square root of the mean square value (an effective value) is called RMS (a root-mean-square) jitter $J_{RMS}$.

$$J_{RMS} = \sqrt{\int_0^{f_{MAX}} G_{\Delta\phi\Delta\phi}(f) df} \quad (3.33)$$

When a mean value is zero, a mean square value is equivalent to a variance, and an RMS jitter is equal to a standard deviation.

As shown in FIG. 28, $J_{RMS}$ can be accurately approximated to a sum of $G_{\Delta\phi\Delta\phi}(f)$ in the proximity of the clock frequency (for example, refer to a reference literature c15). Actually, in the equation (3.33), the upper limit value $f_{MAX}$ of the frequency of $G_{\Delta\phi\Delta\phi}(f)$ to be summed is $(2f_c-\epsilon)$. Because, if $G_{\Delta\phi\Delta\phi}(f)$ is summed in the frequency range wider than the clock frequency, the harmonics of the clock frequency are included in $J_{RMS}$.

In a measurement of an RMS jitter in frequency domain, there are required a phase detector, a signal generator whose phase noise is small and a spectrum analyzer. As can be understood from the equation (3.33) and FIG. 28, a phase noise spectrum is measured by frequency-sweeping a low frequency range. For this reason, the measuring method requires a measurement time period of approximately 10 minutes, and cannot be applied to the test of a microprocessor. In addition, in the measurement of an RMS jitter in frequency domain, a peak-to-peak jitter cannot be estimated since the phase information has been lost.

As described above, in the conventional method of measuring a jitter, a peak-to-peak jitter is measured in time domain using an oscilloscope. The basic method of measuring a jitter in time domain is the zero crossing method. The biggest drawback of this method is that a time resolution of a period measurement cannot be made fine independently on the period of a signal under test. For this reason, a time interval analyzer for simultaneously counting the integer values $n_i$ of the zero crossings of the signal under test $n_i(2\pi)$ and the elapsed time periods $t_i$ was invented. However, the data existing between the zero crossings cannot be measured. That is, the time interval analyzer also cannot exceed the limit of the zero crossing method.

On the other hand, an RMS jitter is measured in frequency domain using a spectrum analyzer. Since the phase information has been lost, a peak-to-peak jitter cannot be estimated.

In addition, either case of measuring a jitter in time domain or measuring an RMS jitter in frequency domain requires a measurement time of approximately 10 minutes. In a test of a VLSI, a testing time of only approximately 100 msec is allocated to one test item. Therefore, there is a serious drawback in the conventional method of measuring a jitter that the method cannot be applied to a test of a VLSI in the manufacturing process thereof.

A clock frequency of a microcomputer has been shifting toward a higher frequency with a rate of 2.5 times per five years. Therefore, a clock jitter of a microcomputer cannot be measured unless the method of measuring a clock jitter is scalable with respect to the measuring time resolution. A peak-to-peak jitter has conventionally been measured in time domain using a oscilloscope or a time interval analyzer. In order to measure a peak-to-peak jitter of a clock signal having a higher frequency using those measuring devices, it is necessary to increase a sampling rate (the number of samples per second) or to decrease a sampling interval. That is, those hardware devices must be developed at least every five years.

Problems in measuring a jitter of CD or DVD will be described. In CD or DVD, a light beam is focused on a disk, and a reflected light returned from a pit is detected by an optical pick-up, and then the detected light is converted into an RF signal (an electrical signal) by a photo-diode. The pit on the disk is formed in the state that the pit is slightly elongated or shortened in its length direction. As a result, rising-up and falling-down characteristics (duty ratio) of the RF signal become asymmetric. For example, when an eye pattern of the RF signal is observed using an oscilloscope, its center is shifted along the y axis. Therefore, in order to evaluate a jitter of the disk, the rising edge and the falling edge of the RF signal must be distinguished. In the measurement of an RMS jitter using a spectrum analyzer, the rising edge and the falling edge of the RF signal cannot be distinguished.

In addition, as mentioned above, a clock frequency of a microcomputer has been increased with a rate of 2.5 times per five years. For measuring a peak-to-peak jitter of a clock signal having a higher frequency, it is necessary for an AD converter for inputting to a digital oscilloscope to operate at higher speed in accordance with the higher frequency of the clock signal and to have a resolution equal to or more than eight bits.

SUMMARY OF THE INVENTION

It is an object of the present invention to provide an apparatus for and a method of measuring a jitter wherein a peak-to-peak jitter or an RMS jitter can be measured in a short test time of approximately 100 msec or so.

It is another object of the present invention to provide an apparatus for and a method of measuring a jitter wherein data obtained from the conventional RMS jitter measurement or the conventional peak-to-peak jitter measurement can be utilized.

It is further another object of the present invention to provide a scalable apparatus for and a scalable method of measuring a jitter.

It is yet further another object of the present invention to provide an apparatus for and a method of measuring a jitter that can measure a peak-to peak jitter and/or an RMS jitter each corresponding to a rising edge or a falling edge of a waveform.

It is yet further another object of the present invention to provide an apparatus for measuring a jitter that does not require an AD converter.

It is yet further another object of the present invention to provide an apparatus for measuring a jitter that is compatible with a method of measuring a peak-to-peak jitter of a conventional zero crossing method shown in FIG. 24 and/or a method of measuring an RMS jitter of a phase detecting method shown in FIG. 29.

It is yet further another object of the present invention to provide an apparatus that can measure a cycle-to-cycle jitter.

It is yet further another object of the present invention to provide an apparatus for measuring a jitter that can measure a histogram of jitter.

DISCLOSURE OF THE INVENTION

In order to achieve the above objects, in one aspect of the present invention, there is provided an apparatus for measuring a jitter wherein a clock waveform $X_C(t)$ is transformed into a complex analytic signal using analytic signal transforming means to obtain, by linear phase eliminating means, a variable term that is obtained by eliminating linear phase from an instantaneous phase of this analytic signal, i.e., a phase noise waveform $\Delta\phi(t)$, and a jitter of the clock waveform is obtained, by jitter detecting means, from this phase noise waveform.

In another aspect of the present invention, there is provided a method of measuring a jitter comprising the steps of: transforming a clock waveform $X_C(t)$ into a complex analytic signal; estimating a variable term that is obtained by removing a linear phase from an instantaneous phase of this analytic signal, i.e., a phase noise waveform $\Delta\phi(t)$; and obtaining a jitter from the phase noise waveform.

An RMS jitter is obtained from the phase noise waveform. In addition, the phase noise waveform is sampled in the proximity of a zero crossing point of real part of an analytic signal, and a differential waveform of the sample phase noise waveform is calculated to obtain a peak-to-peak jitter from the differential phase noise waveform.

There are provided a scalable apparatus for and a scalable method of measuring a jitter that are constructed such that the clock waveform is frequency-divided by a frequency divider, and thereafter the frequency-divided clock waveform is transformed into an analytic signal.

In further another aspect of the present invention, the clock waveform is compared with a reference analog quantity by a comparator, and an output signal of the comparator is transformed into an analytic signal.

BRIEF DESCRIPTION OF THE DRAWINGS

FIG. 25($a$) is a diagram showing zero crossing points of a clock signal, and FIG. 25($b$) is a diagram showing instantaneous periods of those zero crossing points;

FIG. 30($a$) is a diagram showing a functional construction by which a real part of a random phase modulation signal is extracted, and FIG. 30($b$) is a diagram showing a functional construction by which a random phase modulation signal is extracted as an analytic signal;

FIG. 31 is a diagram showing an oscillation waveform of a VCO as an analytic signal;

FIG. 37($a$) is a diagram showing an input signal of an instantaneous phase estimator, FIG. 37($b$) is a diagram showing an instantaneous phase, FIG. 37($c$) is a diagram showing an unwrapped phase, and FIG. 37($d$) is a diagram showing the instantaneous phase estimator;

FIG. 38($a$) is a diagram showing an input phase $\phi(t)$ of a linear phase remover, FIG. 38($b$) is a diagram showing an output $\Delta\phi(t)$ of the linear phase remover, and FIG. 38($c$) is a diagram showing the linear phase remover;

FIG. 41 is a diagram showing differences between a sampling method in the zero crossing method and a sampling method in the method of the present invention;

FIG. 44($a$) is a diagram showing a relative error of period estimated from a restored waveform of up to a certain order of harmonics, and FIG. 44($b$) is a diagram showing a relative error of a root-mean-square value estimated from a restored waveform for a root-mean-square value of the original clock waveform up to a certain order of harmonics;

FIG. 45 is a diagram showing parameters of a MOSFET;

FIG. 60 is a diagram for comparing estimated values of the peak-to-peak jitter of a frequency-divided clock;

FIG. 61(*a*) is a waveform diagram showing a phase noise spectrum when $3\sigma$ is 0.15V, and FIG. 61(*b*) is a waveform diagram showing a phase noise spectrum when $3\sigma$ is 0.10V;

FIG. 99a is a diagram showing a waveform of a real part of an analytic signal, FIG. 99b is a diagram showing a phase noise waveform and its zero-crossing sample values, and FIG. 99c is a diagram showing a peak-to-peak jitter obtained by a differential calculation in the case of $T_s=T_{in}$;

FIG. 100(a), FIG. 100(b), FIG. 100(c), and FIG. 100(d) are diagrams showing a correlation among each sampling time point of the phase noise waveform $\Delta\phi(t)$ required in the differential calculation in the case of $T_s<T_{in}$, its sample value and a time point when the differential value is obtained;

BEST MODES FOR CARRYING OUT THE INVENTION

In the study and development of a PLL circuit, a conventional method of measuring a jitter is still utilized, and the compatibility between a data in a test stage and a data in a development stage is an important problem. Particularly, in order to make a design change in a short period of time and/or in order to improve a process to realize an improvement of the production yield, a test method which can share the test results is a key point. From this view point, the present invention provides a method and an apparatus which are reasonable as a clock test method.

In order to realize the compatibility with an RMS jitter, the shape of a phase noise power spectrum must be maintained in frequency domain. This can be solved by using an analytic signal already discussed. Next, in order to realize the compatibility with a peak-to-peak jitter measurement, a method of maintaining the zero crossing of a waveform is required. Incidentally, as already shown clearly, the fundamental wave of a clock waveform maintains zero crossing information of the original clock ("theorem of zero crossing"). Therefore, for a measurement of a peak-to-peak jitter, it is sufficient to estimate a phase angle utilizing only the fundamental wave of the clock waveform. For example, the equation (2.5.2) or (3.23) corresponds to this fundamental wave.

From the equation (2.5.2) or (3.23), it can be interpreted that a phase noise waveform $\Delta\phi(t)$ randomly changes a phase of a carrier wave corresponding to the clock frequency. As a result of this random phase modulation, a period of the carrier wave is fluctuated and hence a jitter is generated. An actually observable quantity is, as shown in FIG. 30(a), only a real part of the random phase modulation signal (for example, refer to a reference literature c16). However, if an imaginary part could also be observed simultaneously, a phase angle can easily be obtained. This concept corresponds to that the clock waveform is regarded as the aforementioned analytic signal. FIG. 30(b) illustrates a block diagram when the clock waveform is regarded as an analytic signal. When the inside of the PLL circuit is considered, as shown in FIG. 31, an oscillation waveform of a voltage-controlled oscillator (VCO) could be handled as the analytic signal.

Figure 32:
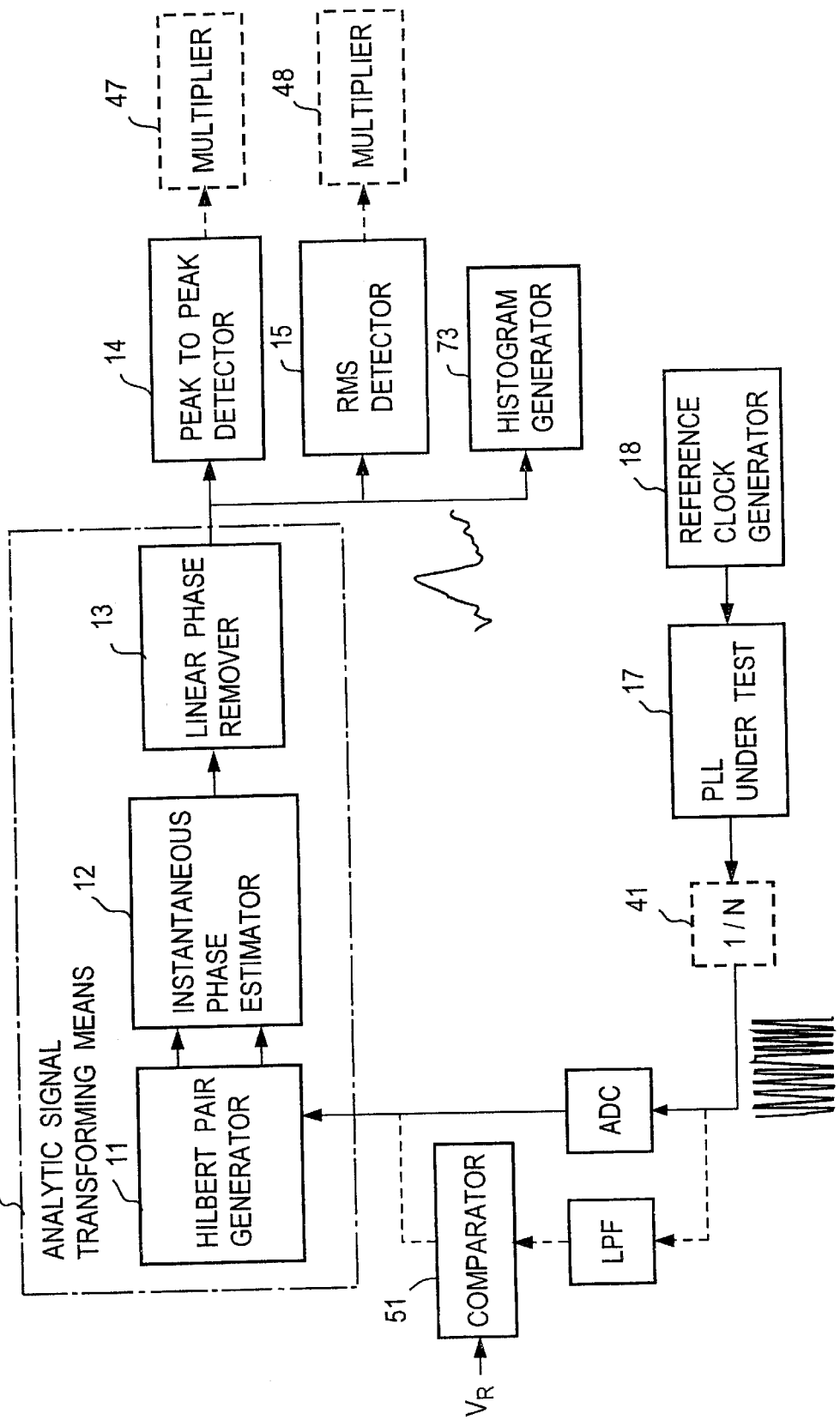
FIG. 32 is a block diagram showing a first embodiment of an apparatus for measuring a jitter according to the present invention.

In this case, the $\Delta\phi(t)$ randomly phase-modulates the clock waveform. Therefore, it is an object of the present invention to provide a method of deriving $\Delta\phi(t)$ from the clock waveform. FIG. 32 shows a block diagram of a first embodiment of an apparatus for measuring a jitter according to the present invention. For example, an analog clock waveform from a PLL circuit under test 17 is converted into a digital clock signal by an analog to digital converter ADC, and the digital clock signal is supplied to a Hilbert pair generator acting as analytic signal transforming means 11 by which the digital clock signal is transformed into a complex analytic signal. Regarding this analytic signal, an instantaneous phase of the analytic signal is estimated by an instantaneous phase estimator 12. A linear phase is removed from the instantaneous phase by a linear phase removing means 13 to obtain a variable part of the instantaneous phase, i.e., a phase noise waveform. A peak-to-peak jitter is detected from the phase noise waveform by a peak-to-peak detector 14. In addition, a root-mean-square jitter is detected from the phase noise waveform by a root-mean-square detector 15.

Figure 33:
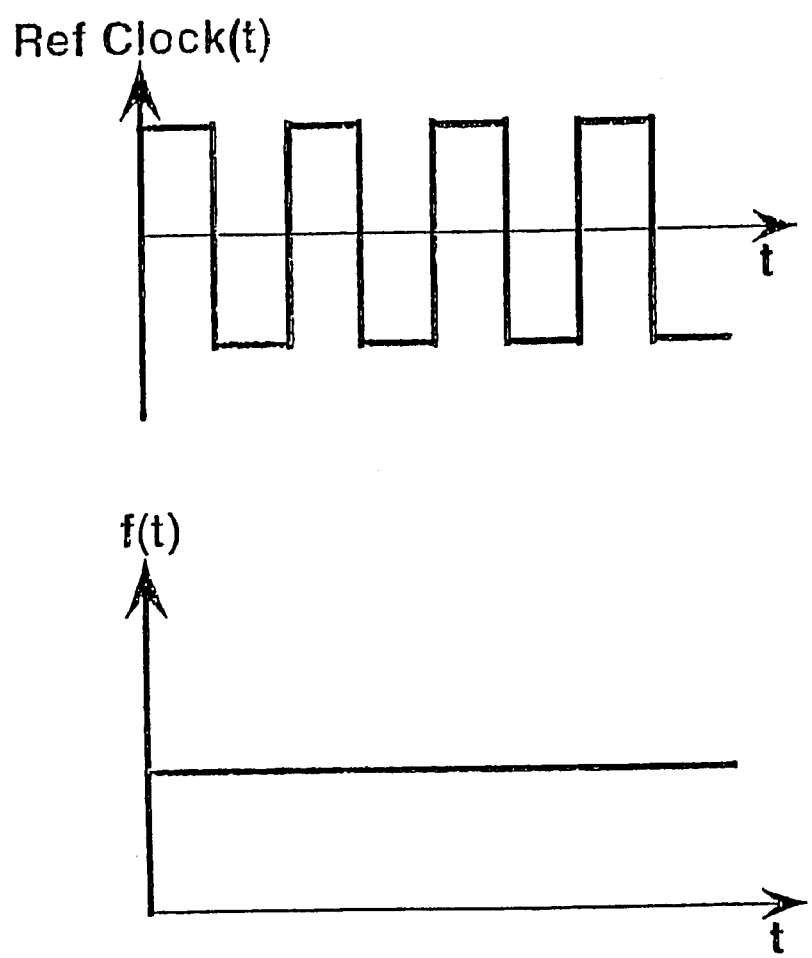
FIG. 33 is a diagram showing a constant frequency signal for measuring a jitter.
Figure 34:
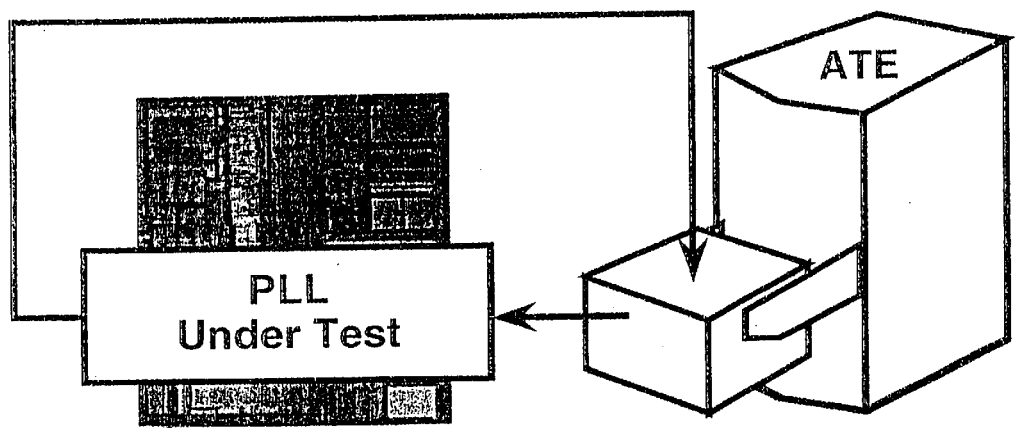
FIG. 34 is a typical model diagram showing a jitter measuring system wherein an apparatus for measuring a jitter according to the present invention is used.

As already mentioned above, a reference clock signal which continues to strictly maintain a constant period is applied to the PLL circuit under test. FIG. 33 shows the reference clock signal. As a result, the PLL circuit under test does not internally generate a phase error, and hence only a random jitter caused by a VCO appears on the clock waveform. An acquired clock waveform is transformed to an analytic signal, and its instantaneous phase is estimated to measure a jitter based on the dispersion from a linear phase. FIG. 34 shows a jitter test system to which the present invention is applied.

Each block can also be realized by an analog signal processing. However, in the present invention, each block is practiced by a digital signal processing. Because, a digital signal processing is more flexible than an analog signal processing, and its speed and accuracy can easily be changed in accordance with the hardware cast. Conjecturing from the present inventors' experience in developing a noise analyzing apparatus for a TV picture signal, the required number of bits in quantizing a clock waveform would be equal to or more than 10 bits.

Now, an algorithm for measuring a jitter used in the present invention will be described.

Figure 35A:
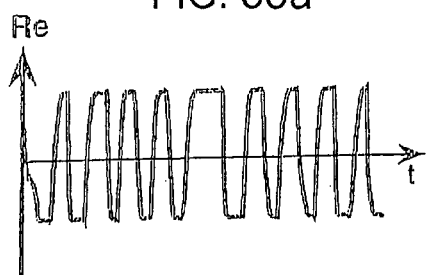
FIG. 35($a$) is a diagram showing a Hilbert pair generator, FIG. 35($b$) is a diagram showing an input waveform of the Hilbert pair generator, and FIG. 35($c$) is a diagram showing an output waveform of the Hilbert pair generator.
Figure 35B:
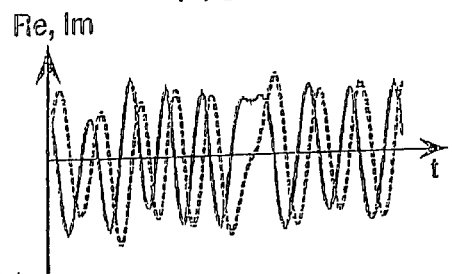
Figure 35C:
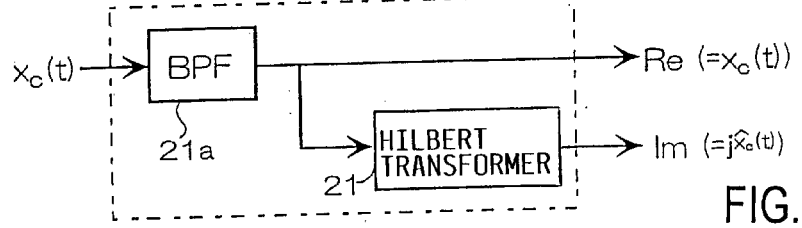

A Hilbert pair generator as analytic signal transforming means 11 shown in FIGS. 32 and 35 transforms a clock waveform $X_C(t)$ into an analytic signal $Z_C(t)$. From the equation (3.6), the Hilbert-transformed result of $X_C(t)$ is given by the following equation (3.34).

$$\hat{x}_c(t) = H[x_c(t)] = A_c \sin(2\pi f_c t + \theta_c + \Delta\phi(t)) \tag{3.34}$$

If $X_C(t)$ and $$\hat{x}_c(t)$$

are assumed to be a real part and an imaginary part of a complex number, respectively, an analytic signal is given by the following equation (3.35).

$$\begin{aligned} z_c(t) &= x_c(t) + j\hat{x}_c(t) \\ &= A_c\cos(2\pi f_c t + \theta_c + \Delta\phi(t)) + jA_c\sin(2\pi f_c t + \theta_c + \Delta\phi(t)) \end{aligned} \tag{3.35}$$

In this case, it is preferable as shown in FIG. 35 that the clock waveform $X_C(t)$ is passed through the bandpass filter 21a to remove high frequency components and a direct current component, and that the filter output is used as a real part of the analytic signal $Z_C(t)$ and an output of the Hilbert transformer 21 that is a result of Hilbert transform of the filter output is used as an imaginary part of the analytic signal $Z_C(t)$. When the fundamental wave frequency of the clock waveform $X_C(t)$ is assumed to be $f_0$, the passband of the bandpass filter 21a is $f_0/2$–$1.5f_0$. Further, there is a Hilbert transformer 21 in which a bandpass filter is provided. In this case, the clock waveform $X_C(t)$ is supplied to the Hilbert transformer 21 so that the clock waveform $X_C(t)$ is passed through the internal bandpass filter, and thereafter the filter output is Hilbert-transformed to be used as an imaginary part. On the other hand, the clock waveform $X_C(t)$ is passed through the bandpass filter to be used as a real part.

Figure 36A:
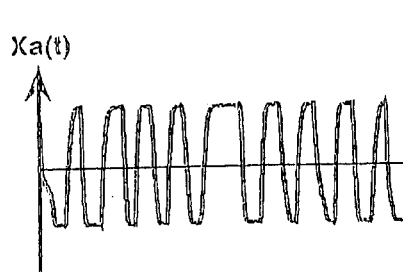
FIG. 36($a$) is a diagram showing a clock waveform, FIG. 36($b$) is a diagram showing a spectrum obtained by applying FFT to the clock waveform of FIG. 36($a$), FIG. 36($c$) is a diagram showing a spectrum obtained by bandpass-filtering the spectrum of FIG. 36($b$), and FIG. 36($d$) is a waveform diagram showing a waveform obtained by applying inverse FFT to the spectrum of FIG. 36($c$)
Figure 36B:
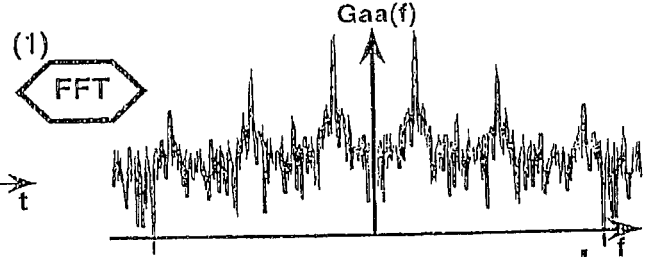
Figure 36D:
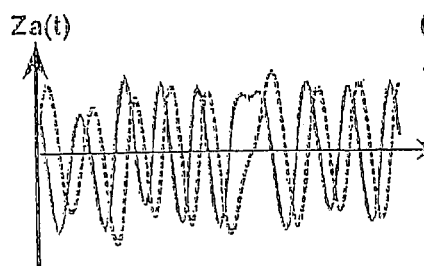
Figure 36C:
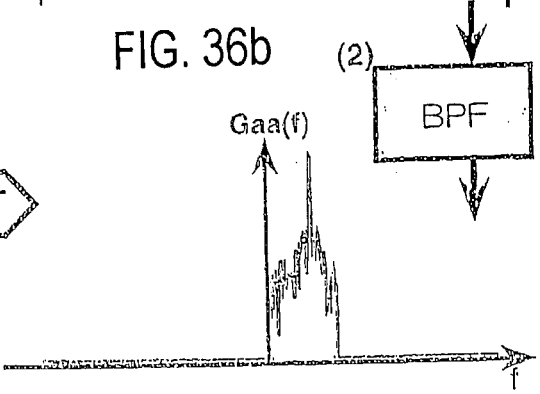
Figure 67:
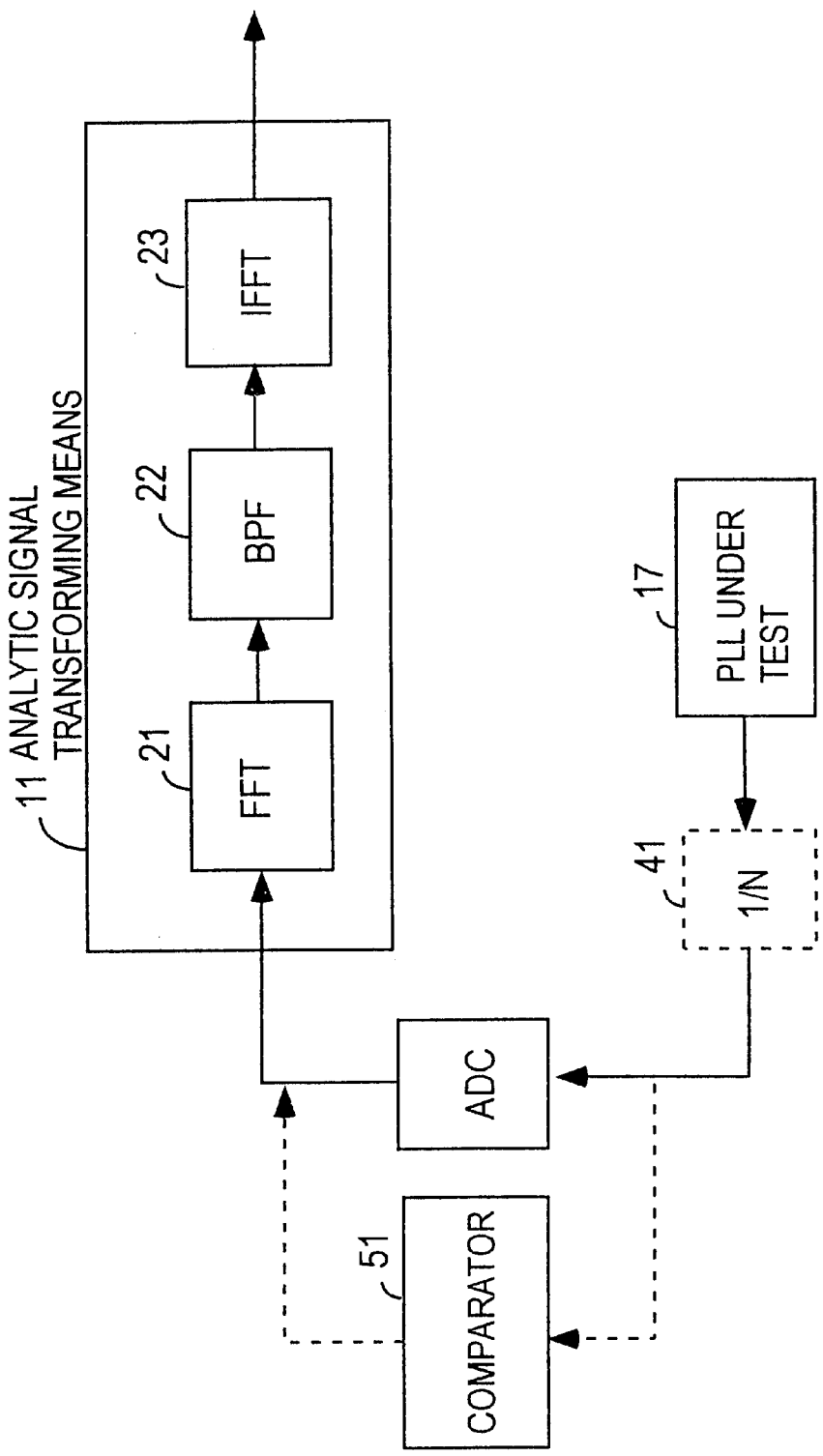
FIG. 67 is a block diagram showing a specific example of the analytic signal transforming means 11.

The following Algorithm 3 is a computation or calculation procedure utilizing "theorem of zero crossing (the fundamental wave of a waveform holds the zero crossing information of the original waveform)". That is, the Algorithm 3 is the calculation procedure utilizing this demonstration. In other words, the Algorithm 3 transforms only the fundamental wave of a clock waveform into an analytic signal. FIG. 36(a) shows the original clock waveform which has a shape close to a square wave. Namely, this analytic signal transforming means 11 fourier-transforms, as shown in FIG. 67, the clock waveform using the FFT part 21. FIG. 36(b) shows a two-sided power spectrum which is the result of the Fourier transform. Then the negative frequency components are cut-off by the bandpass filter 22. At the same time, as shown in FIG. 36(c), only the fundamental wave of the clock waveform is extracted by a bandpass filter 22. That is, in this step, Hilbert-transform and the bandpass filtering are simultaneously performed. When the spectrum shown in FIG. 36(c) is inverse-Fourier-transformed by an inverse FFT part 23, an analytic signal is obtained. Since only the frequency components in the proximity of the fundamental wave are extracted by the bandpass filtering, the analytic signal shown in FIG. 36(d) corresponds to the fundamental wave of the clock waveform, and $X_C(t)$ indicated by a solid line is a sum of sine. waves.

Algorithm 3 (Procedure to transform a real waveform into an analytic signal of the fundamental wave thereof):

1. By using fast Fourier transform, $X_C(t)$ is transformed into frequency domain;

2. Negative frequency components are cut to zero. Frequency components in the proximity of the clock frequency are extracted by a bandpass filtering, and other frequency components are cut to zero;

3. The spectrum is transformed into time domain using inverse fast Fourier transform.

An instantaneous phase estimator 12 estimates an instantaneous phase of $X_C(t)$ using $Z_C(t)$. That is, the following equation (3.36.1) is obtained.

$$\Theta(t) = [2\pi f_c t + \theta_c + \Delta\phi(t)] \bmod 2\pi \tag{3.36.1}$$

Figure 68:
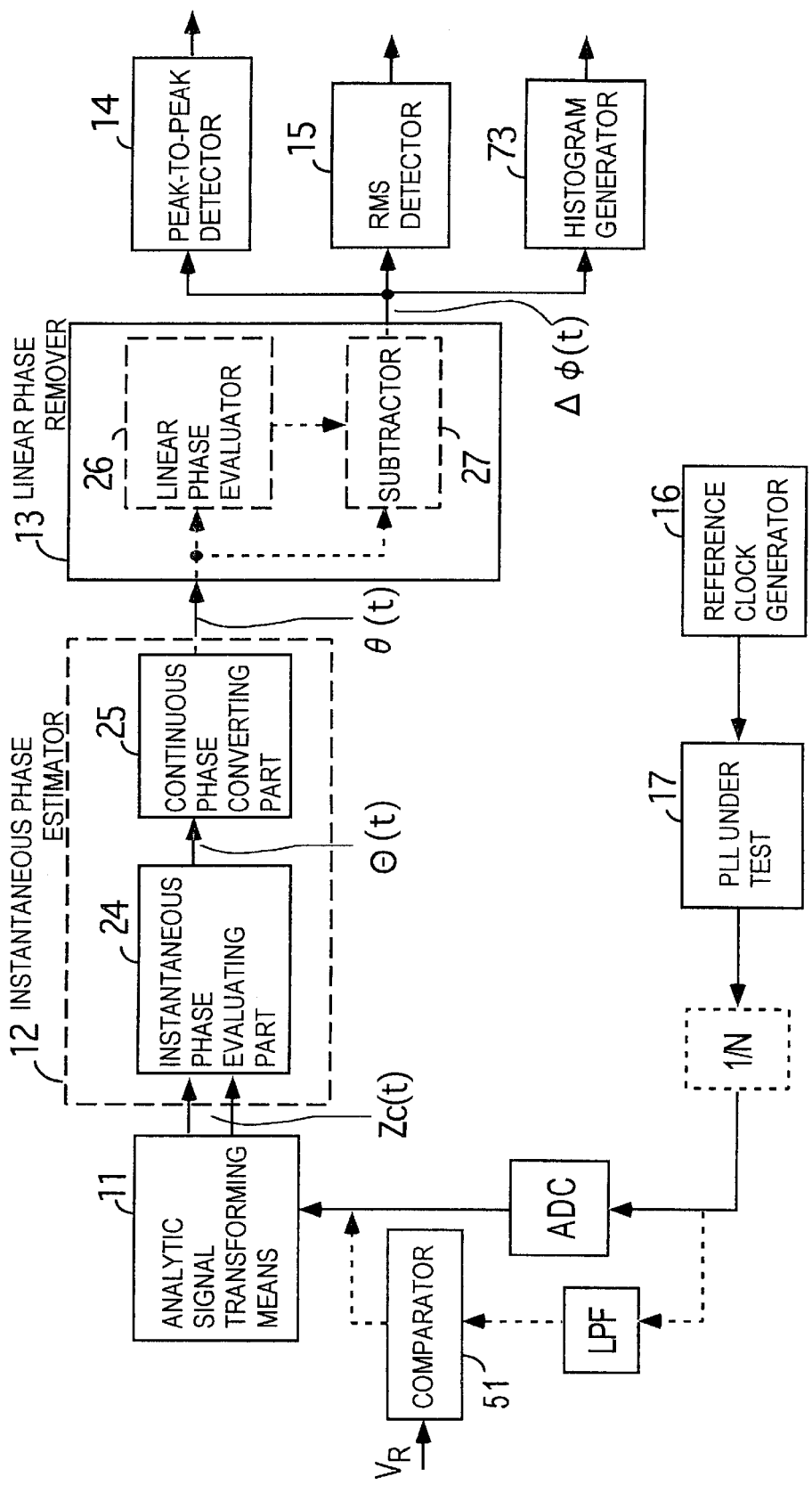
FIG. 68 is a block diagram showing respective specific examples of an instantaneous phase estimator 12 and a linear phase remover 13.

Next, the instantaneous phase estimator 12 applies the aforementioned phase unwrap method to the $\Theta(t)$. Namely, as shown in FIG. 68, the instantaneous phase estimator comprises an instantaneous phase evaluating part 24 for estimating an instantaneous phase of the analytic signal $Z_C(t)$ and a continuous phase converting part 25 for applying an unwrapping method to the estimated instantaneous phase $\Theta(t)$ to obtain a continuous phase $\theta(t)$. As a result of the continuous phase conversion, the following equation (3.36.2) is obtained.

$$\theta(t) = 2\pi f_c t + \theta_c + \Delta\phi(t) \tag{3.36.2}$$

FIGS. 37(b) and 37(c) show an instantaneous phase and an unwrapped phase, respectively. In addition, a linear phase remover 13 estimates, using the aforementioned linear trend estimating method, a linear phase $[2\pi f_c t + \theta_c]$ based on $\theta(t)$ by a linear phase estimating part 26. Next, if the linear phase is removed from $\theta(t)$ by a subtracting part 27, a variable term $\Delta\phi(t)$ of the instantaneous phase, namely, a phase noise waveform expressed by the following equation (3.36.3) can be obtained.

$$\theta(t) = \Delta\phi(t) \tag{3.36.3}$$

FIG. 37(b) shows the $\Delta\phi(t)$. The jitter measuring algorithm used in the present invention can estimate concurrently a peak-to-peak jitter $J_{PP}$ and an RMS jitter $J_{RMS}$ from the $\Delta\phi(t)$ by the peak-to-peak detector 14 and the root-mean-square detector 15. That is, the following equations (3.37) and (3.38) can be obtained.

$$J_{pp} = \max_{k}(\Delta\phi(k)) - \min_{l}(\Delta\phi(l)) \quad (3.37)$$

$$J_{RMS} = \sqrt{\frac{1}{N}\sum_{k=0}^{N-1}\Delta\phi^2(k)} \quad (3.38)$$

Hereinafter, the method according to the present invention is also referred to as $\Delta\phi(t)$ method.

Next, the method according to the present invention will be logically compared with the zero crossing method.

First, when only a rise edge of a signal (equal to the zero crossing) is sampled, it will be proven that the $\Delta\phi(t)$ method is equivalent to the zero crossing method. Now, when the period of the zero crossing is expressed as $T_{ZERO}$, a clock waveform $X_C(t)$ is expressed by the following equation (3.39).

$$x_c(t) = A_c \sin\left(\frac{2\pi}{T_{ZERO}}t\right) \quad (3.39)$$

Using the equation (3.35), an analytic signal expressed by the following equation (3.40) is obtained.

$$z_c(t) = x_c(t) + j\tilde{x}_c(t) \quad (3.40)$$
$$= A_c \sin\left(\frac{2\pi}{T_{ZERO}}t\right) - jA_c \cos\left(\frac{2\pi}{T_{ZERO}}t\right)$$

From the equation (3.10.3), an instantaneous frequency of $Z_C(t)$ is given by the following equation (3.41).

$$f(t) = \frac{\omega(t)}{2\pi} = \frac{d\Theta(t)}{dt} = \frac{x_c(t)\tilde{x}'_c(t) - \tilde{x}_c(t)x'_c(t)}{x_c^2(t) + \tilde{x}_c^2(t)} \quad (3.41)$$

Accordingly, f(t) can be expressed as follows.

$$f(t) = \frac{1}{T_{ZERO}} \quad (3.42)$$

That is, when only a rise edge of a signal is sampled, it has been proven that the $\Delta\phi(t)$ method is equivalent to the zero crossing method.

Figure 39A:
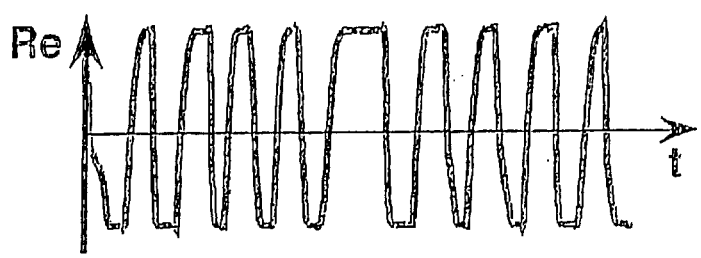
FIG. 39($a$) is a diagram showing an input clock waveform, FIG. 39($b$) is a diagram showing an output of its $\Delta\phi(t)$ method, and FIG. 39($c$) is a diagram showing an output period of the zero crossing method.
Figure 39B:
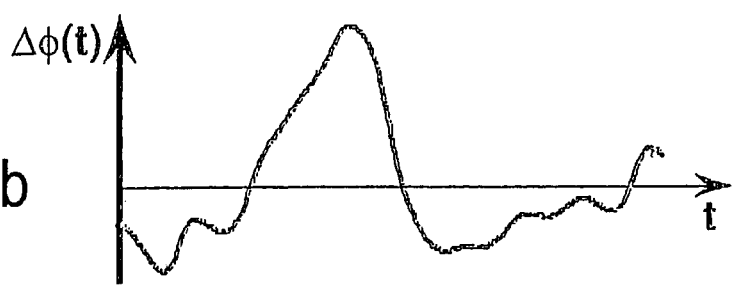
Figure 39C:
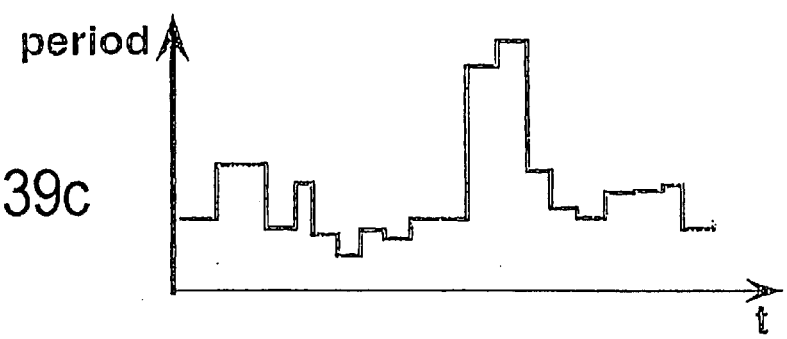

In the zero crossing method, a time resolution of the period measurement cannot arbitrarily.be selected. The time resolution of this method is determined by the zero crossing of the signal under measurement. On the other hand, in the $\Delta\phi(t)$ method, both time resolution and phase resolution can be improved by increasing the number of samples per period. FIG. 39 shows a comparison between the data of the conventional zero crossing method and the data of the $\Delta\phi(t)$ method. It can be seen that the time resolution on the time axis and the phase resolution on the longitudinal axis have been improved.

Here, let's compare an upper limit of the sampling interval of the $\Delta\phi(t)$ method with that of the zero crossing method. The upper limit of the sampling interval of the $\Delta\phi(t)$ method can be derived from the conditions described above. That is, in order to uniquely perform a phase unwrap, a phase difference between adjacent analytic signals $Z_C(t)$ must be smaller than $\pi$. In order for $Z_C(t)$ to satisfy this condition, at least two samples must be sampled in equal interval within a period. For example, since the frequency of $X_C(t)$ given by the equation (3.23) is $f_C$, the upper limit of the sampling interval is $1/2f_C$. On the other hand, the upper limit of the equivalent sampling interval of the zero crossing method is $1/f_C$.

Figure 1:
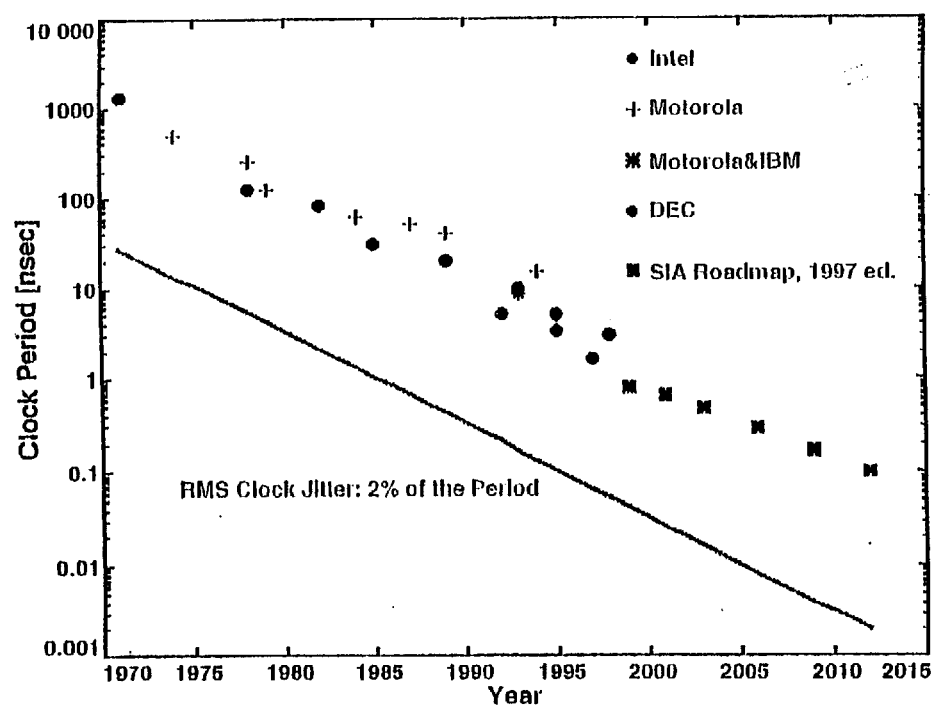
FIG. 1 is a diagram showing a relationship between a clock period of a microcomputer and an RMS jitter.
Figures 2, 3:
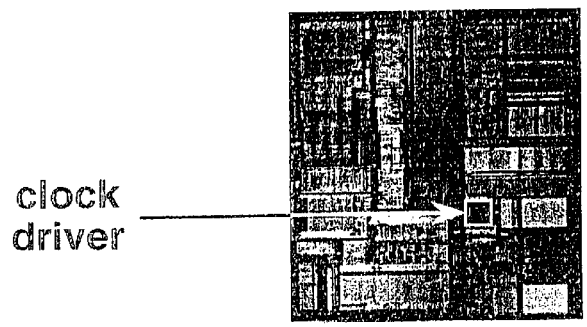
FIG. 2 is a diagram showing a Pentium processor and its on-chip clock driver circuit.
FIG. 3 is a diagram showing comparisons between a PLL of a computer system and a PLL of a communication system.
Figure 4:
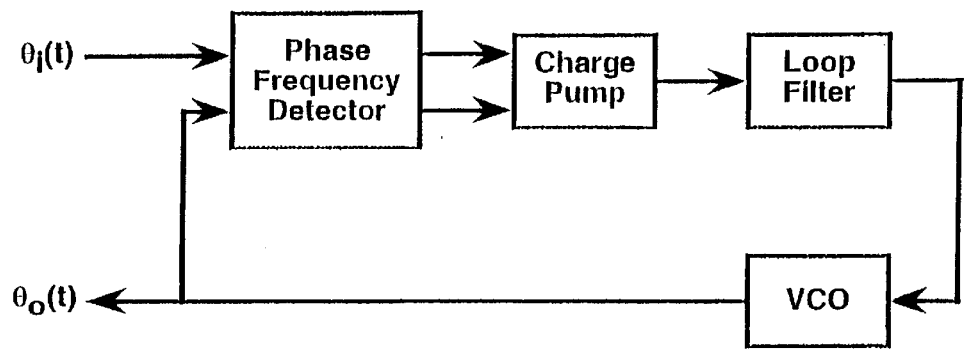
FIG. 4 is a diagram showing a basic configuration of a PLL circuit.
Figure 5:
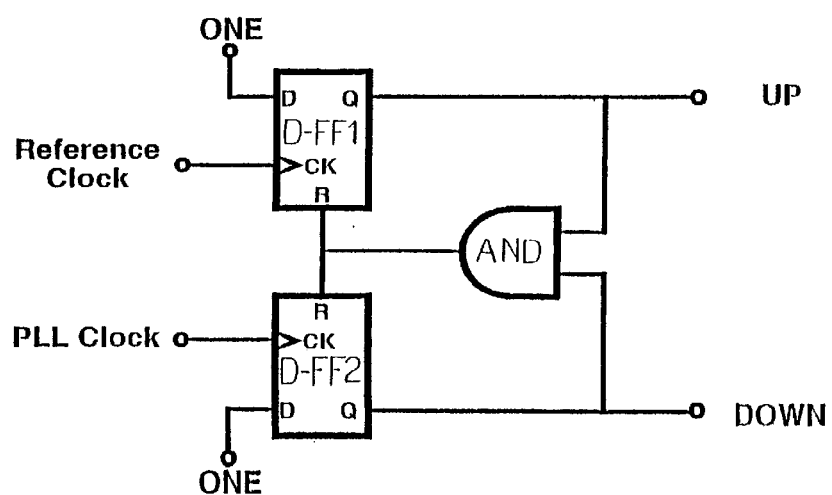
FIG. 5 is a block diagram showing an example of a phase-frequency detector.
Figure 6:
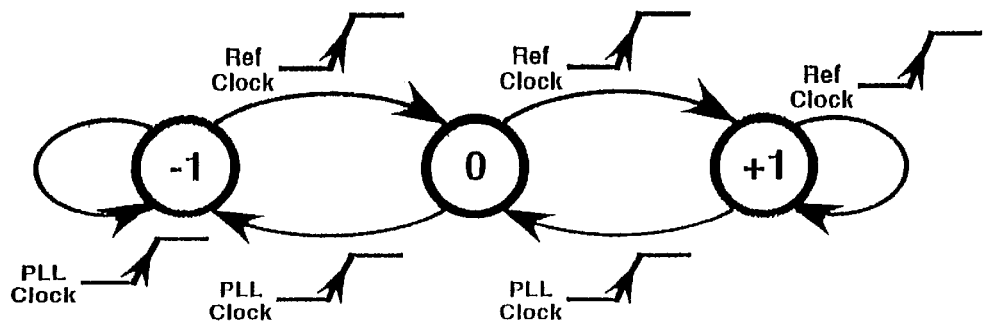
FIG. 6 is a state transition diagram of the phase-frequency detector.
Figure 7:
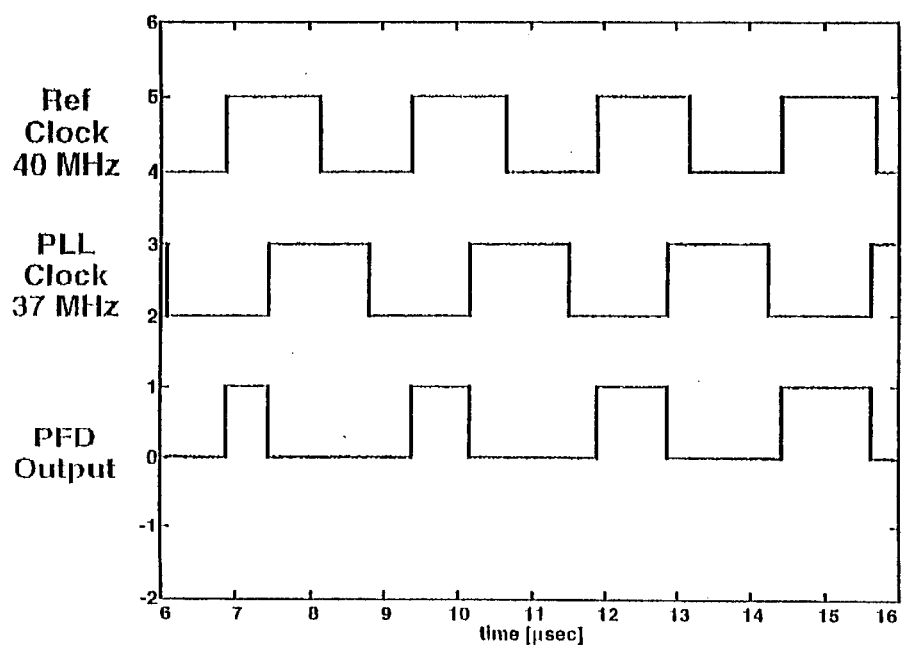
FIG. 7 shows the operation waveforms of the phase-frequency detector when a frequency error is negative.
Figure 8A:
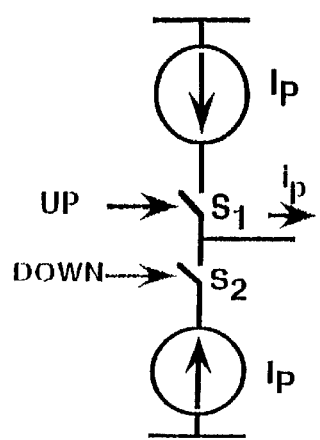
FIG. 8($a$) is a diagram showing a charge pump circuit, and FIG. 8($b$) is a diagram showing a relationship between a switch control signal and an output current of the charge pump circuit.
Figure 8B:
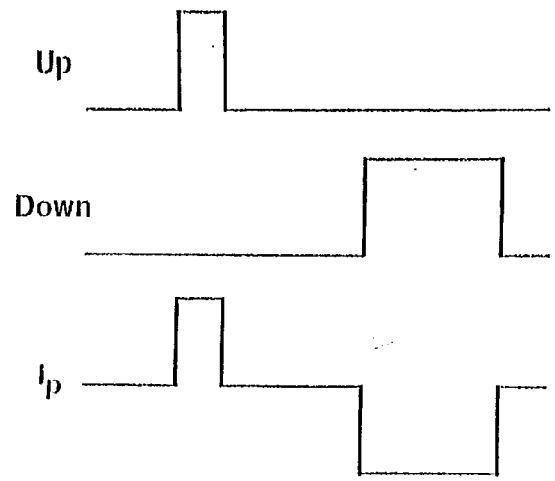
Figure 9A:
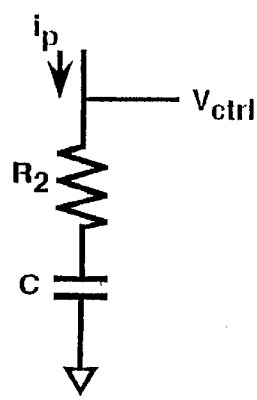
FIG. 9($a$) is a diagram showing a loop filter circuit, and FIG. 9($b$) is a diagram showing a relationship between a constant current inputted to the circuit of FIG. 9($a$) and an output control voltage.
Figure 9B:
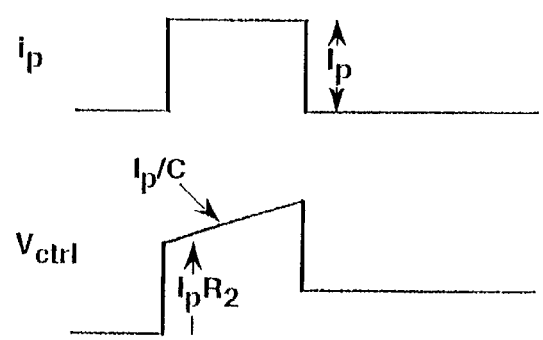
Figure 10:
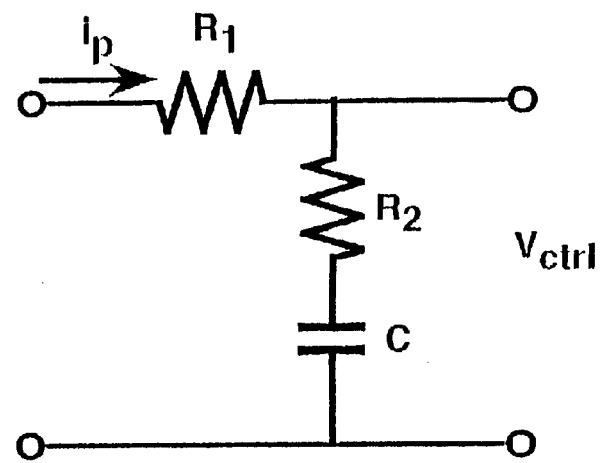
FIG. 10 is a circuit diagram showing a passive lag filter.
Figure 11:
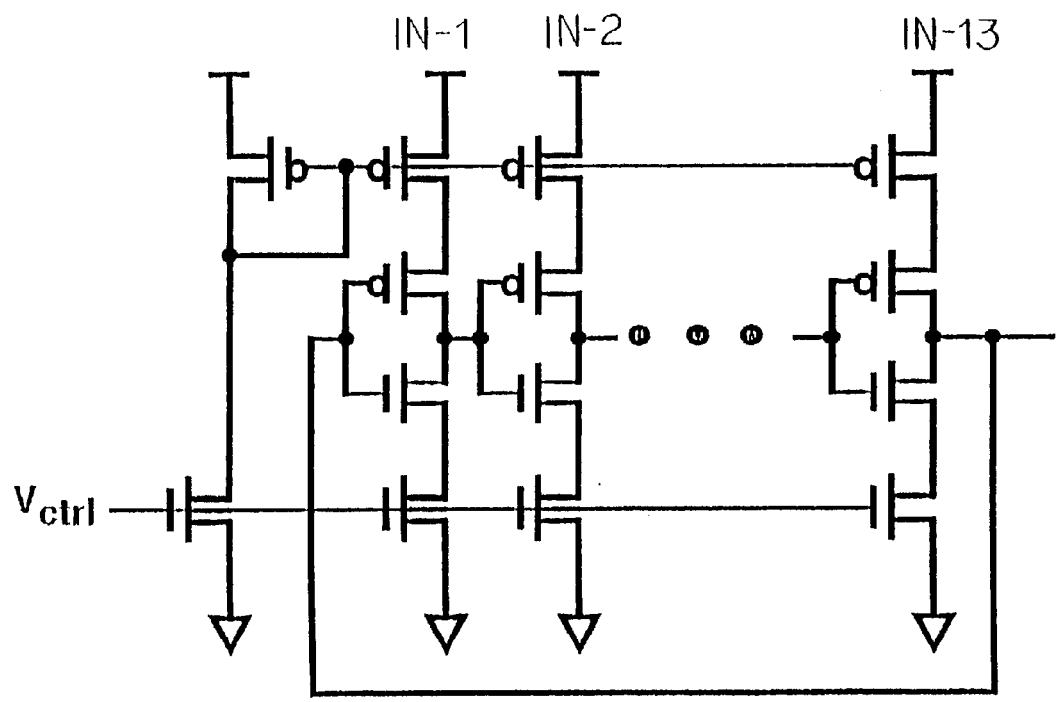
FIG. 11 shows an example of a VCO circuit.
Figure 12:
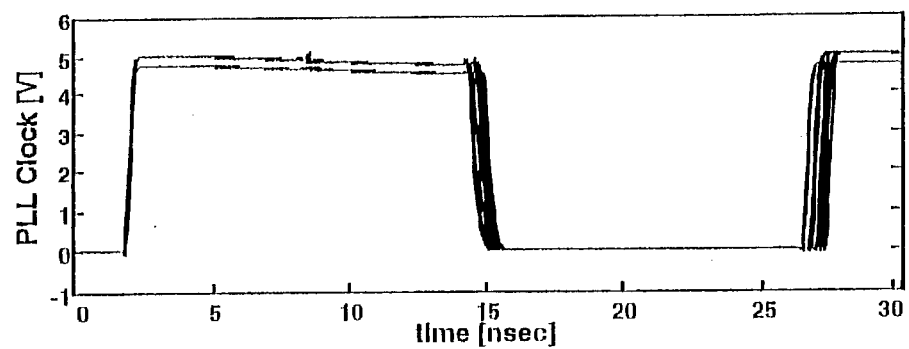
FIG. 12 shows an example of a jitter of a clock.
Figure 13:
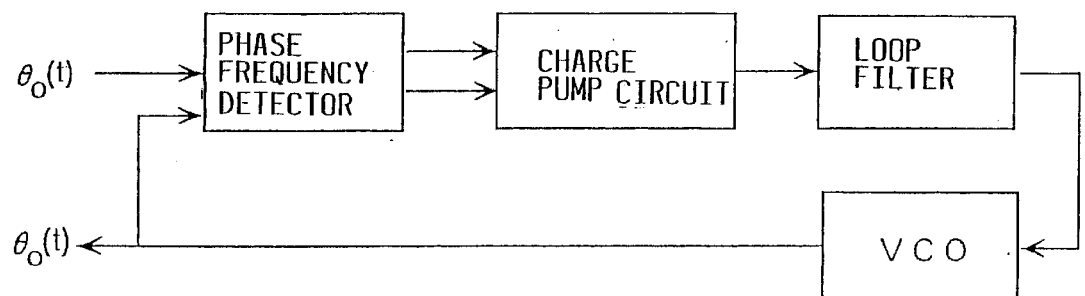
FIG. 13 is a diagram for explaining a method of measuring a jitter.
Figure 14:
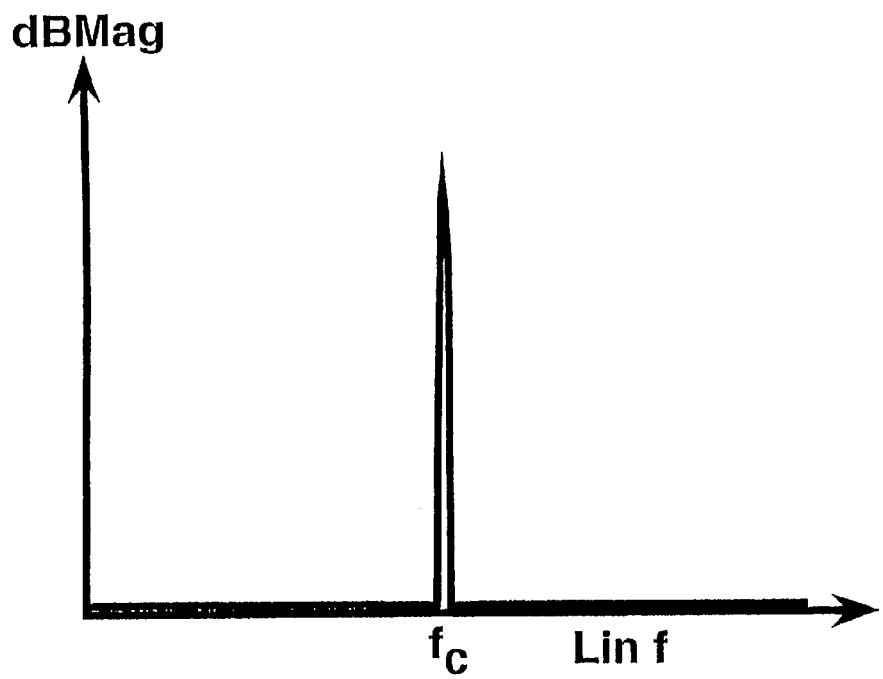
FIG. 14 is a diagram showing a spectrum of an output signal of an ideal oscillator.
Figure 15:
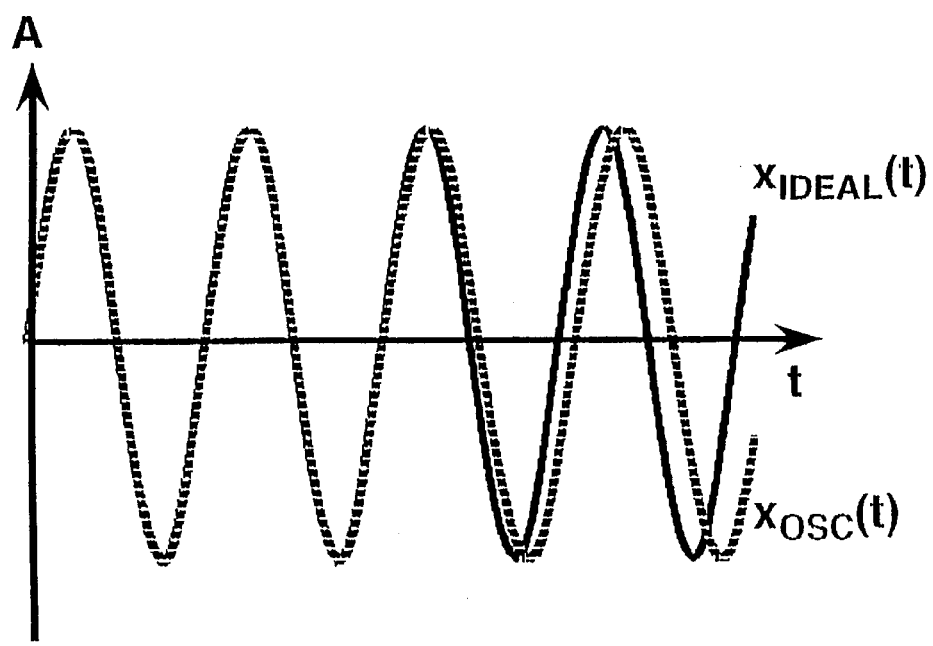
FIG. 15 is a diagram showing a variation of zero crossing caused by a phase noise.
Figure 16:
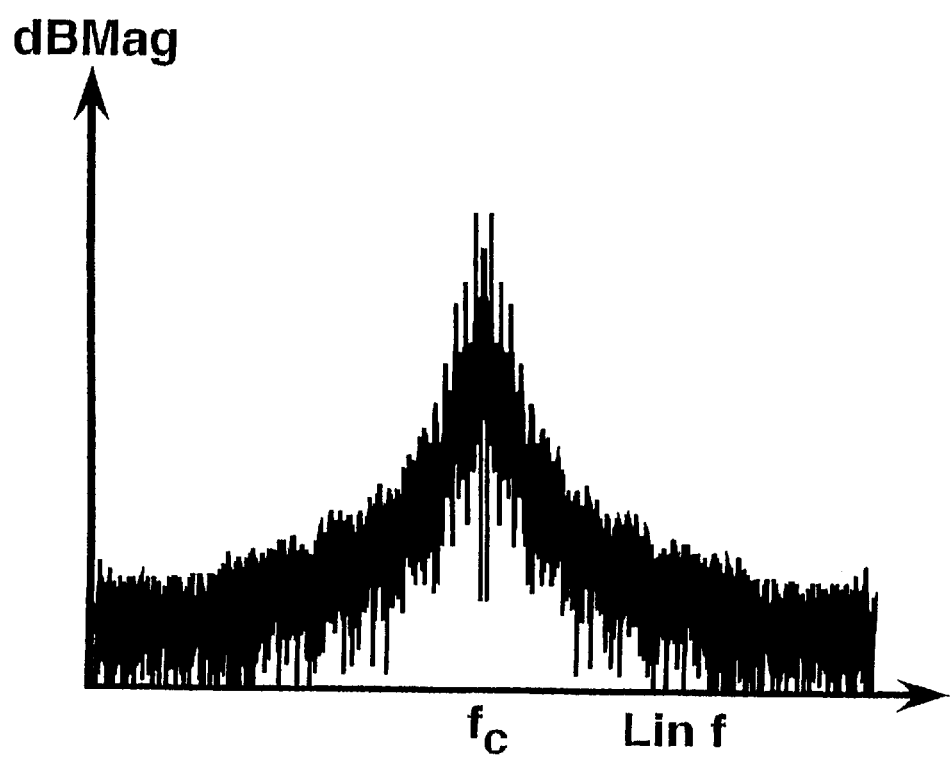
FIG. 16 is a diagram showing a diffusion of a spectrum caused by a phase noise.
Figure 17:
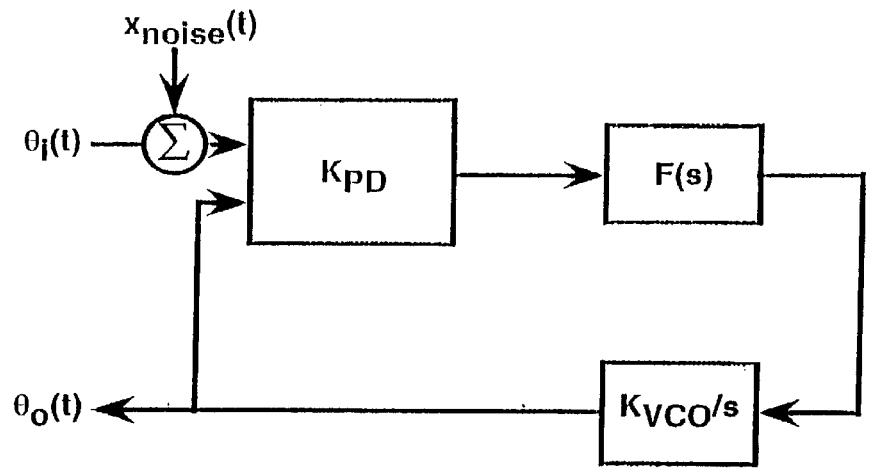
FIG. 17 is a block diagram showing a VCO circuit in which a noise is added to its input end.
Figure 18:
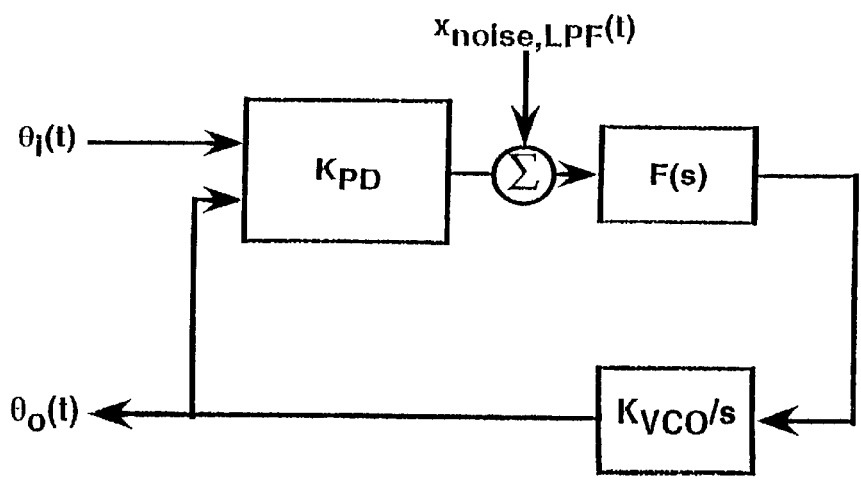
FIG. 18 is a block diagram showing another VCO circuit equivalent to the VCO circuit in which a noise is added to its input end.
Figure 19:
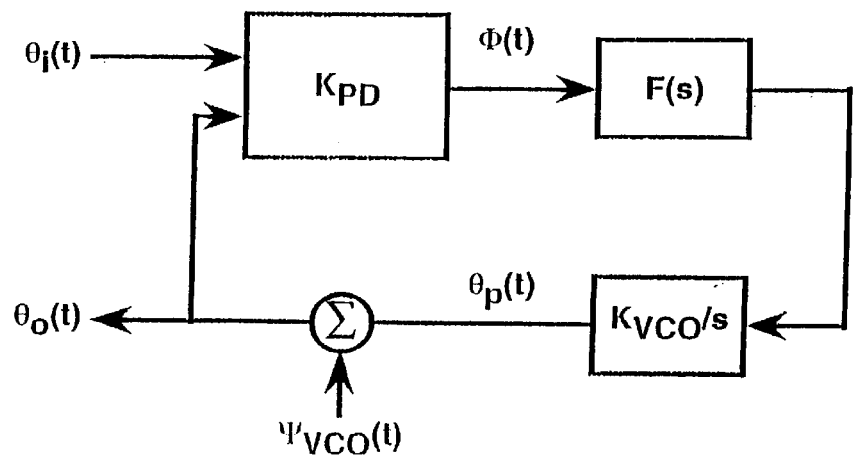
FIG. 19 is a block diagram showing a VCO circuit having an internal phase noise.
Figure 20:
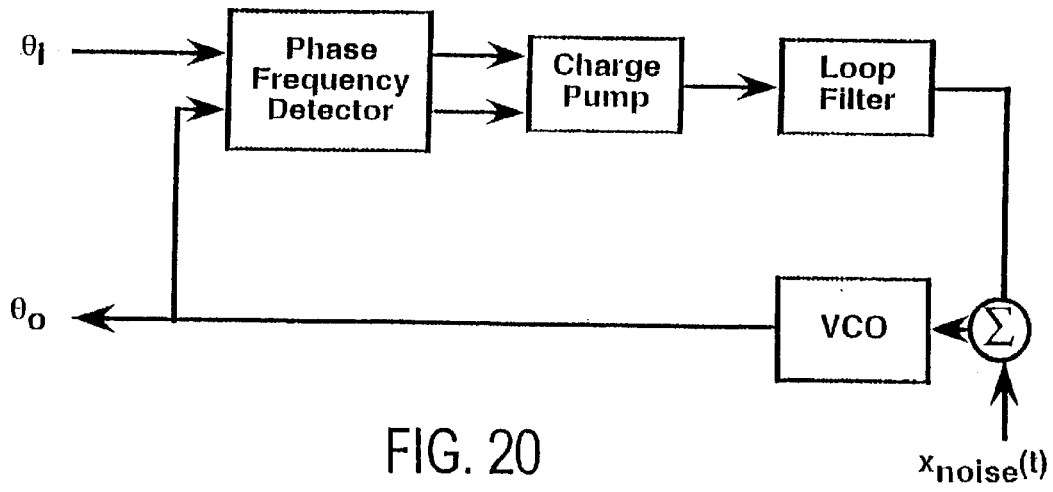
FIG. 20 is a block diagram showing a PLL circuit which simulates a jitter.
Figure 28:
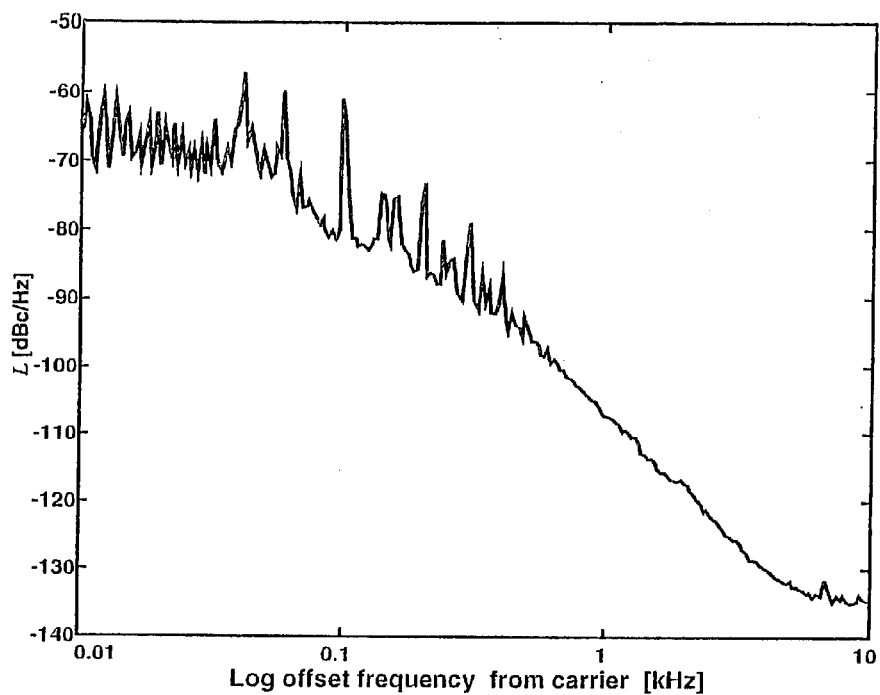
FIG. 28 is a waveform diagram showing a measured example of an RMS jitter in frequency domain.
Figure 29:
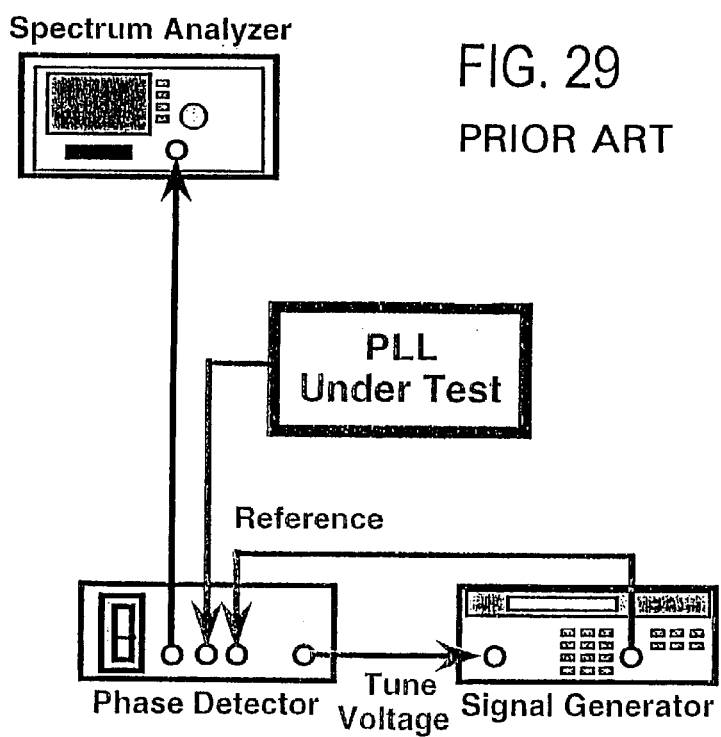
FIG. 29 is a typical model diagram showing a measuring system of an RMS jitter.

Next, a sampling method using a quadrature modulation will be described. The clock frequency of a microcomputer has been being shifted to a higher frequency with the rate of 2.5 times per 5 years. Therefore, unless the method of measuring a jitter is scalable with respect to a measuring time resolution, a clock jitter of a microcomputer cannot be measured. A method of making the method of measuring a jitter scalable is the quadrature modulation. As can be seen from FIGS. 28 and 16, in a jittery clock waveform, a phase noise spectrum is diffused from the clock frequency as a central frequency. That is, a jittery clock waveform is a band-limited signal. For this reason, there is a possibility to decrease the lower limit of the sampling frequency by combining the quadrature modulation with a lowpass filter.

Figure 40A:
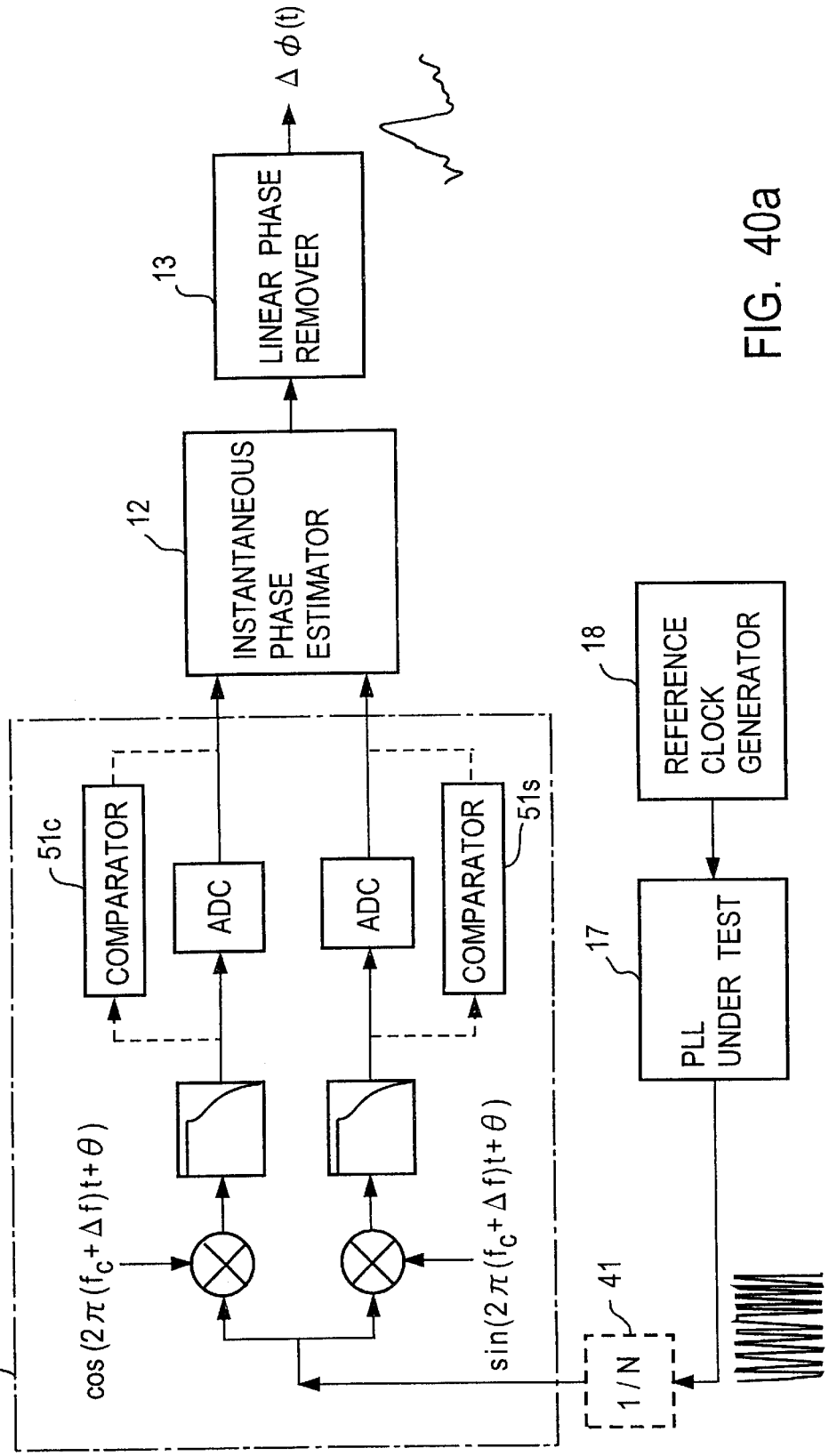
FIG. 40($a$) shows an apparatus for measuring a jitter in which a quadrature, modulation system is used in analytic signal transforming means, and FIG. 40($b$) is a block diagram showing an apparatus for measuring a jitter in which a heterodyne system is used in the input stage thereof.

FIG. 40(a) is a block diagram showing a phase estimator for estimating $\Delta\phi(t)$ of a clock waveform using a quadrature modulation system. Inputted $X_C(t)$ is multiplied by the following equation (3.43) in a complex mixer.

$$\cos(2\pi(f_c+\Delta f)t+\theta)+j\sin(2\pi(f_c+\Delta f)t+\theta) \quad (3.43)$$

A complex output of the lowpass filter is given by the following equation (3.44).

$$\frac{A_c}{2}[\cos(2\pi\Delta ft + (\theta - \theta_c) - \Delta\phi(t)) + j\sin(2\pi\Delta ft + (\theta - \theta_c) - \Delta\phi(t))]$$

(3.44)

That is, the $X_C(t)$ is transformed to an analytic signal $Z_C(t)$ by the quadrature modulation and the lowpass filter, and the frequency is decreased to $\Delta f$. Thereafter, the analog signal is converted to a digital signal, and an instantaneous phase of the $X_C(t)$ is estimated by an instantaneous phase estimator so that an estimated instantaneous phase $\Theta(t)$ expressed by the following equation (3.45) can be obtained.

$$\Theta(t)=[2\pi\Delta ft+(\theta-\theta_C)-\Delta\phi(t)]\mod 2\pi \quad (3.45)$$

Similarly to the previous example, a phase unwrap is applied to the $\Theta(t)$ and a linear phase is removed by a linear phase remover so that the following equation (3.46) can be obtained.

$$\theta(t)=-\Delta\phi(t) \quad (3.46)$$

Figure 40B:
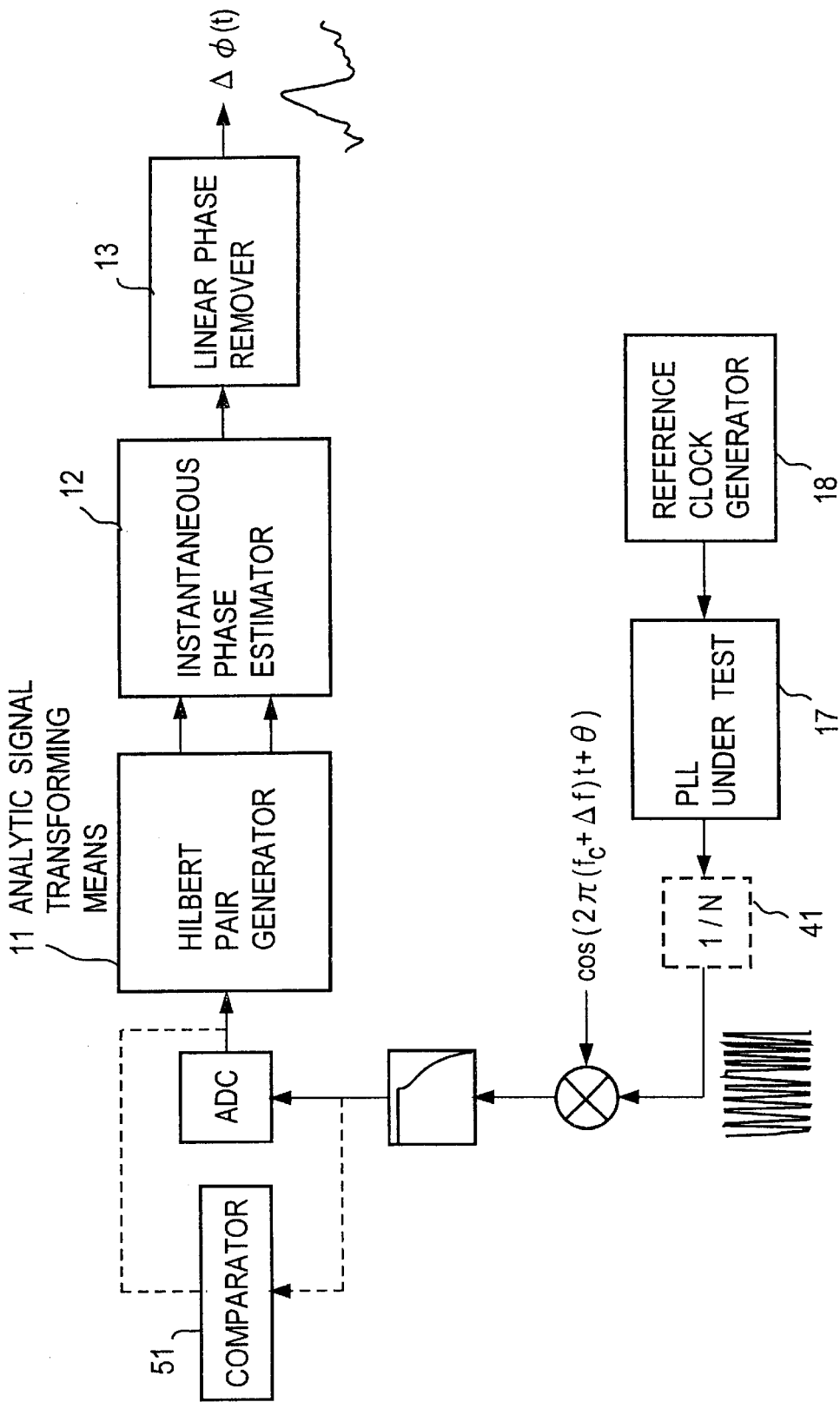

As mentioned above, it has been proven that the lower limit of the sampling frequency of the $\Delta\phi(t)$ method can be reduced from $2f_C$ to $2(\Delta f)$ by combining the quadrature modulation with a lowpass filter. Similarly, the lower limit of the equivalent sampling frequency of the zero crossing method can also be reduced from $f_C$ to $\Delta f$. A similar effect can also be obtained by combining a heterodyne system shown in FIG. 40(b) with a lowpass filter. Namely, an inputted clock waveform $X_C(t)$ is multiplied by $\cos(2\pi(fc+\Delta f)t+\theta)$ by the mixer, and a frequency difference component is extracted from the output of the mixer by a lowpass filter or a bandpass filter. The frequency difference component is converted into a digital signal by the ADC, and the digital signal is supplied, for example, to the Hilbert pair generator acting as the analytic signal transforming means 11.

Finally, measuring time periods $T_{meas}$ of the $\Delta\phi(t)$ method and the zero crossing method will be derived. The $T_{meas, ZERO}$ of the zero crossing method is given, by the following equation (3.47.1), as a time period required for collecting the $\Delta\phi(t)$ of N points corresponding to the lower limit of an equivalent sampling frequency $\Delta f$.

$$T_{meas,ZERO} \geq \frac{N}{\Delta f} \qquad (3.47.1)$$

On the other hand, regarding the Δφ(t) method, a case of K times of the number of samples per period will be discussed. Therefore, a time period required for sampling, in the Δφ(t) method, N points of the Δφ(t) with a frequency 2K(Δf) which is K times as high as the frequency of the lower limit of sampling frequency is given by the following equation (3.47.2).

$$T_{meas,\Delta\phi} = \frac{1}{2K}\left(\frac{N}{\Delta f}\right) \qquad (3.47.2)$$

That is, the Δφ(t) method can measure the Δφ(t) 2K times faster than the zero crossing method. In addition, in the Δφ(t) method, it can be understood that the measuring time resolution can be changed to be scalable by adjusting the K. On the contrary, the time resolution of the zero crossing method has been determined by Δf. FIG. 41 shows a comparison between the Δφ(t) method and the zero crossing method.

Next, a method of estimating a power spectrum density function of a phase noise waveform Δφ(t) will be explained. In the aforementioned Algorithm 3, since only the fundamental wave is extracted by a bandpass filtering, there is a drawback that a frequency range by which a spectrum distribution of the Δφ(t) can be observed is limited. Since an Algorithm 4 described below is aimed to observe a spectrum distribution of the Δφ(t), a bandpass filtering is not used therein. Conversely, the Algorithm 4 described below cannot be used for observing the Δφ(t).

When an analytic signal $Z_C(t)$ is estimated, fast Fourier transform is used. In this case, $X_C(t)W(t)$ (a waveform obtained by multiplying the $X_C(t)$ by a window function W(t)) is fast-Fourier-transformed. Generally, an amplitude of the W(t) has a value close to zero at the proximity of the first time point and the last time point (for example, refer to a reference literature c17). For this reason, the waveform $X_C(t)W(t)$ calculated by Inverse Fourier transform has a large error at the proximity of the first time point and the last time point, and hence the $X_C(t)W(t)$ cannot be used as a data. Also in the estimation of a $Z_C(t)$, $X_C(t)W(t)$ corresponding to the central portion, i.e., approximately 50% of the window function is multiplied by an inverse number of the window function, 1/W(t) to estimate the $Z_C(t)$, and the values of the both ends of $X_C(t)W(t)$ are obliged to be discarded.

In this method, only $Z_C(t)$ of 512 points can be estimated from $X_C(t)$ of 1024 points. In this case, it is assumed that $X_C(t)$ is recorded in a waveform recording buffer. In order to increase the number of samples for $Z_C(t)$, it is necessary to segment the waveform recording buffer such that the waveform partially overlaps with the preceding waveform, to calculate $Z_C(t)$ corresponding to each time interval, and finally to compose each $Z_C(t)$ to obtain the entire composite $Z_C(t)$.

When $Z_C(t)$ is estimated, a window function which applies only the minimum modulation to an amplitude of $X_C(t)$ should be used. The window function which can satisfy this condition is Hanning (a reference literature c17). This has only the minimum, i.e., 1, spectrum at each of the upper sideband and the lower sideband. In this case, approximately 25% of a waveform is overlapped.

Algorithm 4 (Procedure for estimating a spectrum of an analytic signal):

1. The $X_C(t)$ is taken out from the starting address of the waveform recording buffer 31 (FIG. 69);
2. The $X_C(t)$ is multiplied by a window function W(t) by a window function multiplying part 32;
3. The product $X_C(t)W(t)$ is transformed into frequency domain by a fast-Fourier-transforming part 33;
4. Only the negative frequency components are cut to zero;
5. The spectrum is transformed into time domain by a fast-inverse-Fourier-transforming part 35 to obtain $Z_C(t)W(t)$;
6. The $Z_C(t)W(t)$ is multiplied by an inverse number of the window function by a window function dividing part 36 to obtain $Z_C(t)$;
7. The $X_C(t)$ is taken out from the waveform recording buffer. In this case, the $X_C(t)$ is taken out such that the two adjacent $X_C(t)$ are overlapped with each other by approximately 25%; and
8. The above steps 2–7 are repeated until the entire $Z_C(t)$ is obtained.

A power spectrum is estimated for thus processed ZC(t) by a spectrum analyzing part 38.

Next, there will be described a specific example in which the effectiveness of the aforementioned method of measuring a jitter is verified through a simulation.

Figure 21:
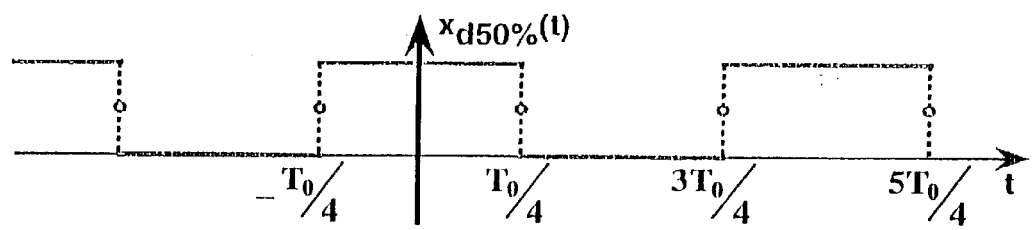
FIG. 21 is a diagram showing an ideal clock waveform.
Figure 42A:
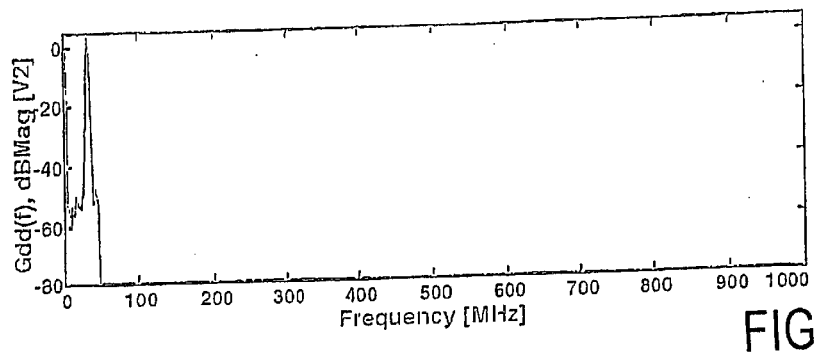
FIG. 42($a$) is a diagram showing the fundamental wave spectrum, and FIG. 42($b$) is a diagram showing a clock waveform of the fundamental wave spectrum.
Figure 42B:
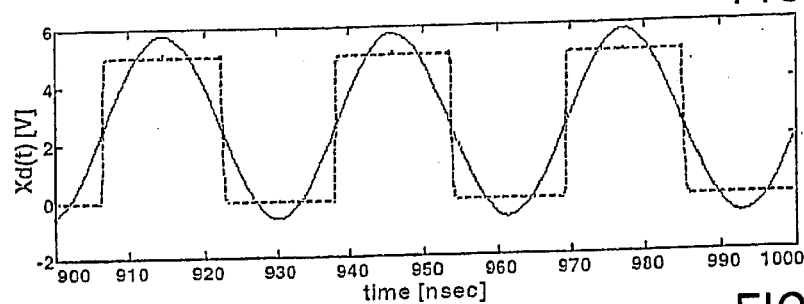
Figure 43A:
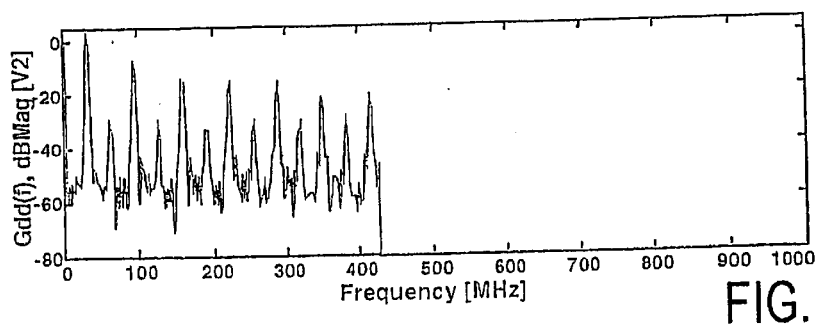
FIG. 43($a$) is a diagram showing a partial sum spectrum of up to 13th order harmonics, and FIG. 43($b$) is a diagram showing a clock waveform the partial sum spectrum of up to 13th order harmonics.
Figure 43B:
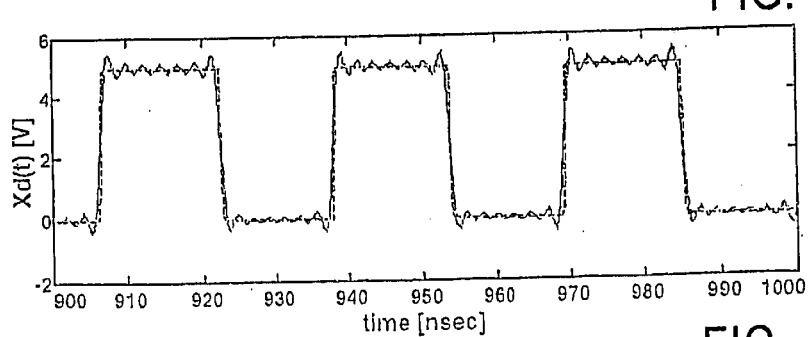

Relationship Between the Zero Crossing of a Clock Waveform and the Fundamental Wave of the Clock Waveform It will be verified using the ideal clock waveform shown in FIG. 21 that "the zero crossing of the fundamental wave of a waveform holds the zero crossing information of the original waveform (theorem of zero crossing)". That is, a clock waveform is Fourier-transformed, the fundamental frequency component is left, and the frequency components of the second and higher harmonics are cut to zero. This spectrum is inverse-Fourier-transformed to obtain the restored waveform in time domain. The period is estimated from the zero crossing of this waveform. FIG. 42(*a*) shows a spectrum from which the harmonics have been removed. FIG. 42(*b*) shows the restored waveform with the original clock waveform overlaid thereon. Similarly, a partial sum spectrum of up to 13th order harmonics and the restored waveform are plotted in FIGS. 43(*a*) and 43(*b*) respectively. Comparing each restored waveform with the original clock waveform, it is seen that the zero crossing is a fixed point. That is, a time point of the zero crossing is constant regardless of the number of orders of harmonics used in the partial sum.

A relative error between "a period of the original clock signal" and "a period estimated from a restored waveform" is obtained for each order of harmonics by incrementing the number of harmonics from 1 to 13. FIG. 44(*a*) shows the relative error values of the period. An error of the estimated period does not depend on the number of orders of harmonics. As a result, it has been verified that "the zero crossing of the fundamental wave gives a good approximation to the zero crossing of the original signal". The relative errors of root-mean-square values of a waveform are also given for a comparison purpose. FIG. 44(*b*) shows the relative errors of the root-mean-square values estimated from a restored waveform against the root-mean-square values of the original clock waveform. It is seen in the root-mean-square case that the relative error is not decreased unless the partial sum includes higher order harmonics.

Summarizing the above results, it could be understood that "if only the fundamental wave of a clock signal can be extracted, an instantaneous period can be estimated from the zero crossing of the original clock waveform. In this case, even if more harmonics are added in the estimation, the estimation accuracy is not improved". That is, "theorem of zero crossing" has been proven.

Figure 46:
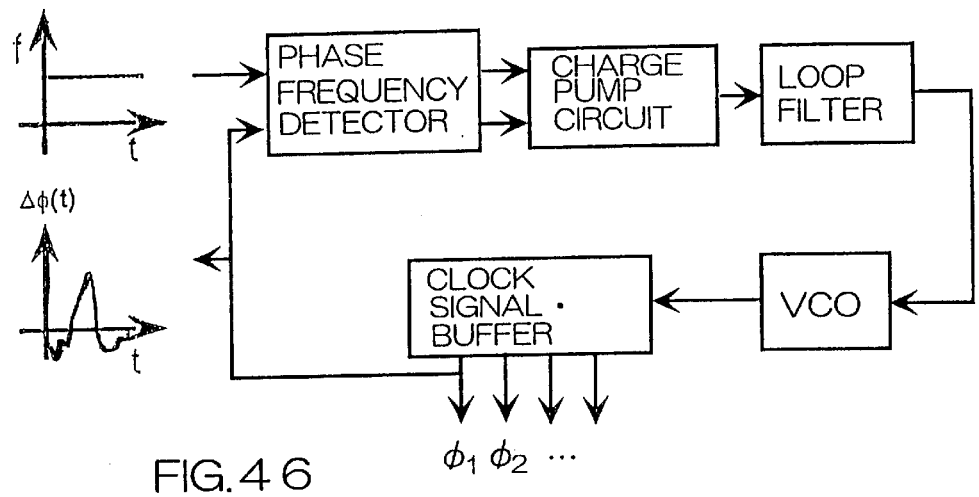
FIG. 46 is a block diagram showing a jitter-free PLL circuit.

Next, a case in which the method of measuring a jitter ($\Delta\phi(t)$ method) according to the present invention is applied to a jitter-free PLL circuit will be explained. As a PLL circuit, the PLL circuit disclosed in the explanation of the prior art is used. A PLL shown in FIG. 46 is composed by 0.6 $\mu$m CMOSs and is operated by a power supply of 5 V to obtain various waveforms in a SPICE simulation. FIG. 45 shows parameters of a MOSFET. An oscillation frequency of the VCO is 128 MHz. A frequency divider divides an oscillation waveform of the VCO into ¼ frequency to convert it into a PLL clock having 32 MHz frequency. The time resolution of the SPICE simulation waveform is 50 psec. Then, a phase noise waveform $\Delta\phi(t)$ is calculated from the simulation waveform. The estimation of the $\Delta\phi(t)$ is simulated using Matlab.

Figure 47A:
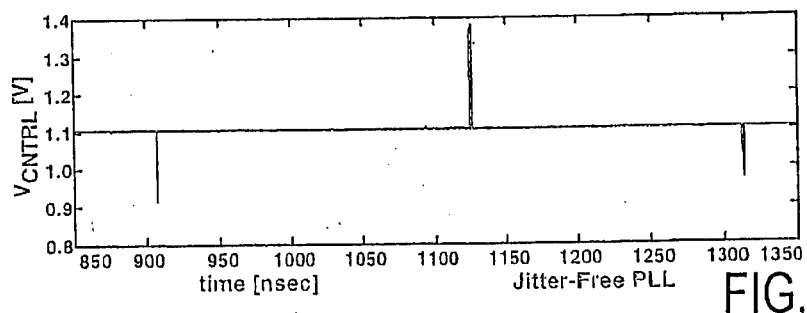
FIG. 47(*a*) is a diagram showing a waveform at input of a VCO in the jitter-free PLL circuit, and FIG. 47(*b*) is a diagram showing a waveform at output of the VCO in the jitter-free PLL circuit.
Figure 47B:
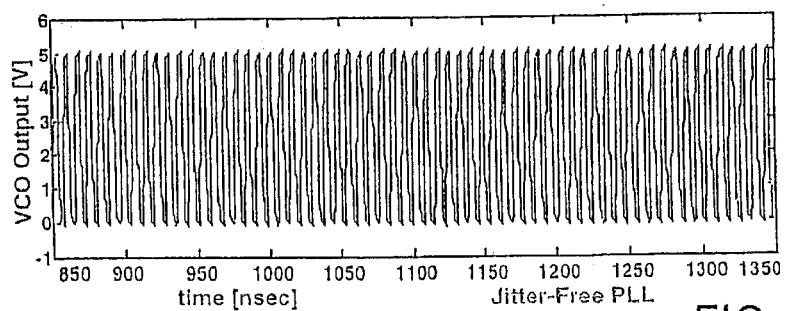
Figure 48A:
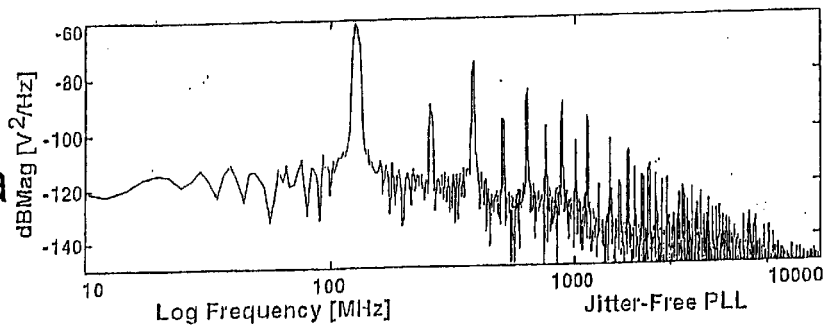
FIG. 48(*a*) is a diagram showing an output waveform of a VCO in the jitter-free PLL circuit, and FIG. 48(*b*) is a diagram showing a phase noise waveform of the VCO in the jitter-free PLL circuit.
Figure 48B:
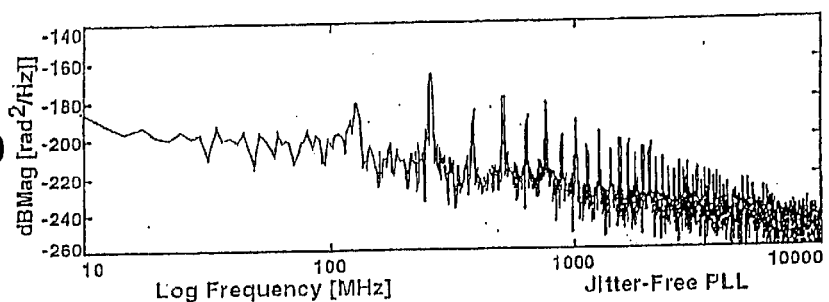
Figure 69:
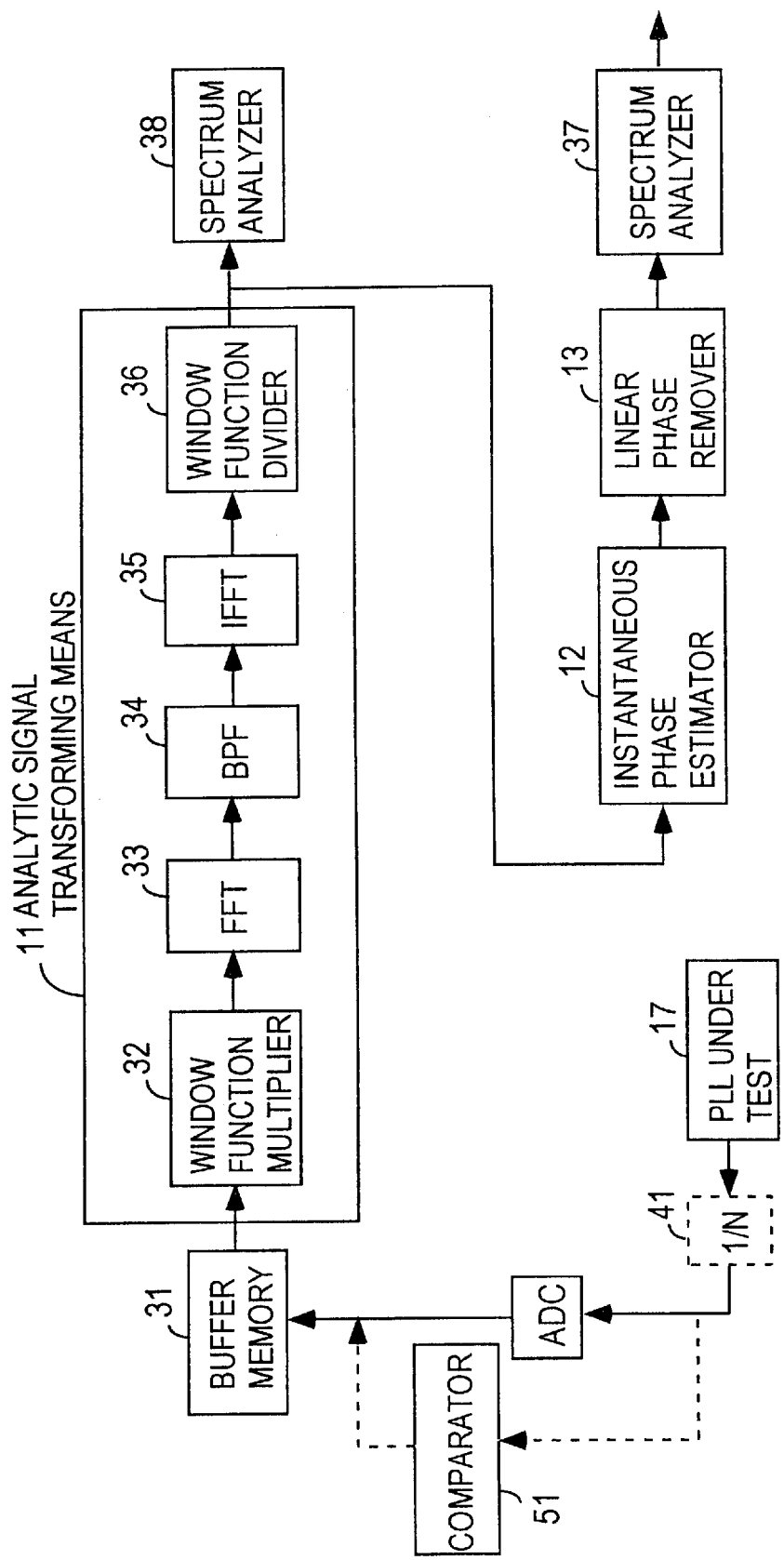
FIG. 69 is a block diagram showing another specific example of the analytic signal transformer means 11 and an example of an apparatus for measuring a jitter to which a spectrum analyzing part is added.

FIG. 47($a$) shows an input waveform to the VCO. FIG. 47($b$) shows an oscillation waveform of the VCO. FIG. 48($a$) shows an output power spectrum of the VCO. The oscillation waveform of the VCO of 8092 points is multiplied by "minimum 4 term window function" (for example, refer to a reference literature c18), and a power spectrum density function is estimated using fast Fourier transform. FIG. 48($b$) shows the power spectrum density function of the $\Delta\phi(t)$ estimated using the Algorithm 4. Namely, as shown in FIG. 69, an analytic signal $Z_c(t)$ is created by the analytic signal transforming means 11 using the algorithm 4. Then an instantaneous phase $\theta(t)$ of this analytic signal $Z_c(t)$ is estimated by the instantaneous phase estimator 12, and a linear phase is removed from the instantaneous phase $\theta(t)$ by the linear phase detector 13 to obtain the phase noise waveform $\Delta\phi(t)$. Then a power spectrum of the phase noise waveform $\Delta\phi(t)$ is obtained by the spectrum analyzing part 37. The condition of the fast Fourier transform operation is the same as that used for obtaining the output power spectrum density function of the VCO. Comparing FIG. 48($a$) with FIG. 48($b$), in the power spectrum of the $\Delta\phi(t)$, it is seen that the spectrum of the oscillation frequency of the VCO of 128 MHz is attenuated by approximately 120 dB. The power spectrum density function of the $\Delta\phi(t)$ has higher levels at lower frequencies due to an influence of a 1/f noise.

Figure 49A:
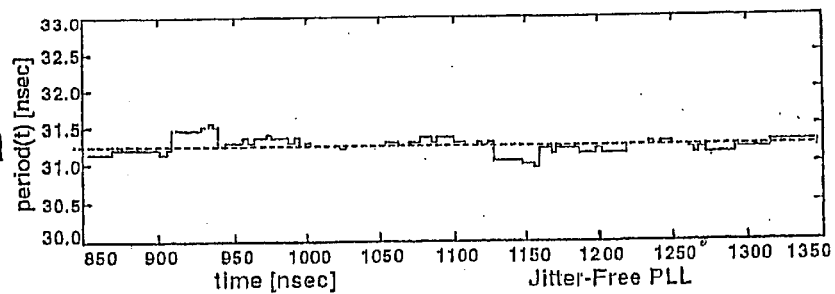
FIG. 49(*a*) is a diagram showing an instantaneous period of a phase noise of the jitter-free PLL circuit, and FIG. 49(*b*) is a diagram showing a waveform of the phase noise of the jitter-free PLL circuit.
Figure 49B:
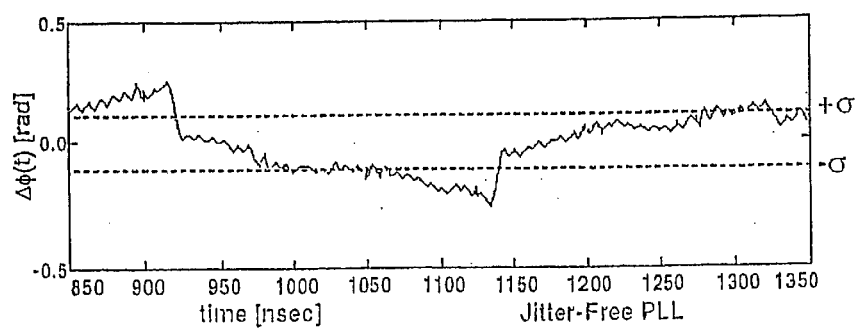

FIG. 49 shows diagrams for comparing the conventional zero crossing method with the method according to the present invention. FIG. 49($a$) shows a result of the instantaneous period measurement of an oscillation waveform of the VCO measured by the zero crossing method. FIG. 49($b$) shows the $\Delta\phi(t)$ estimated using the method of Algorithm 3 according to the present invention. A spectrum of a frequency range (10 MHz–200 MHz) in which the second order harmonic is not included was extracted by a bandpass filter and the $\Delta\phi(t)$ was obtained by inverse fast Fourier transform. It can be confirmed, from the fact that the instantaneous period and the $\Delta\phi(t)$ do not indicate a noise, that this PLL circuit does not actually have a jitter.

From FIG. 47($a$), it can be seen that a frequency-up pulse is applied to the VCO at the time point of approximately 1127 nsec. Two frequency-down pulses are applied to the VCO at the time points of approximately 908 nsec and 1314 nsec, respectively. This is based on the performance of the PLL circuit used in the simulation. Viewing the $\Delta\phi(t)$ shown in FIG. 49($b$), a phase change due to the influence of the frequency-up pulse appears at the time point of approximately 1140 nsec. Phase changes due to the influences of the two frequency-down pulses appear at the time points of approximately 920 nsec and 1325 nsec, respectively. These are deterministic data. On the other hand, in the. instantaneous period of FIG. 49($a$), a phase change due to the influence of the frequency-up pulse appears at the time point of approximately 1130 nsec. A phase change due to the influence of the frequency-down pulses appears only at the time point of approximately 910 nsec. An influence of a frequency-down pulse at approximately 1314 does not appear in the change of the instantaneous period.

Summarizing the above results, in the $\Delta\phi(t)$ method according to the present invention, it can be observed that when a phase noise is not present, the oscillation state changes in accordance with a frequency-up pulse or a frequency-down pulse. The $\Delta\phi(t)$ method has a higher resolution compared with the conventional zero crossing method. The power spectrum density function of the $\Delta\phi(t)$ is influenced little by the spectrum of the oscillation frequency of the VCO.

Next, a case in which the aforementioned method of measuring a jitter ($\Delta\phi(t)$ method) according to the present invention is applied to a jittery PLL circuit will be explained. In addition, the method of the present invention will be compared with the instantaneous period estimation using the zero crossing method to verify that the method of measuring a jitter according to the present invention is effective for a phase noise estimation.

As already mentioned above, a jitter can be simulated by applying an additive noise to the VCO to randomly modulate the phase of the oscillation waveform of the VCO. In the present invention, the jitter of the PLL circuit was simulated by applying an additive noise to an input end of the VCO oscillation circuit. A Gaussian noise was generated using the Matlab's function randn0. Further, based on SPICE simulation, a Gaussian noise was applied to an input end of the VCO of the PLL circuit shown in FIG. 50.

Figure 51A:
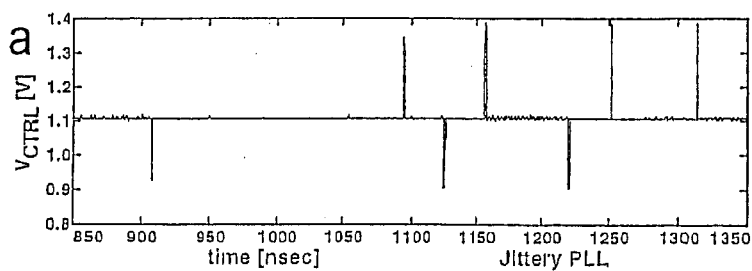
FIG. 51(*a*) is a diagram showing a waveform at input of a VCO in the jittery PLL circuit, and FIG. 51(*b*) is a diagram showing a waveform at output of a VCO in the jittery PLL circuit.
Figure 51B:
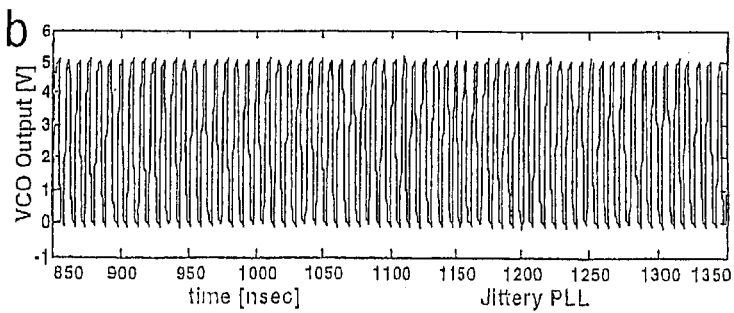
Figure 52A:
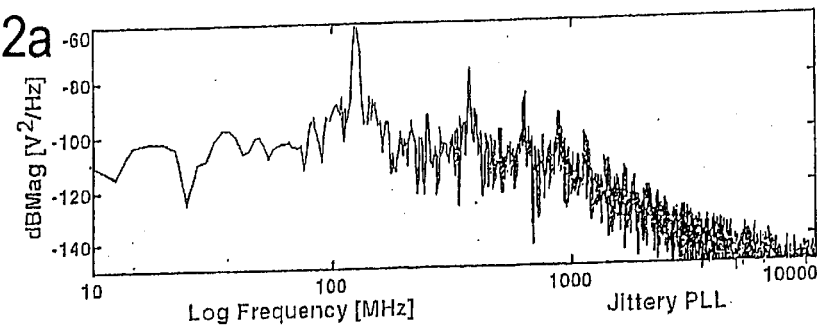
FIG. 52(*a*) is a diagram showing an output waveform of a VCO in the jittery PLL circuit, and FIG. 52(*b*) is a diagram showing a phase noise waveform of the output waveform of the VCO in the jittery PLL circuit.
Figure 52B:
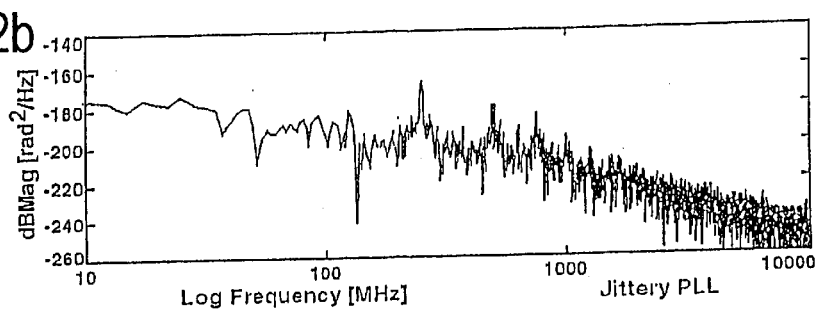

FIG. 51($a$) shows an input waveform to the VCO when 3$\sigma$ of the Gaussian noise is 0.05 V. FIG. 51($b$) shows an oscillation waveform of the VCO. Comparing FIG. 47($a$) with FIG. 51 ($a$), it is seen that the number of frequency-up pulses is increased from 1 to 4 and the number of frequency-down pulses is also increased from 2 to 3 due to the jitter. FIG. 52($a$) shows the output power spectrum of the VCO. The noise spectrum has been increased. FIG. 52($b$) shows a power spectrum density function of the $\Delta\phi(t)$. Comparing FIG. 48($b$) with FIG. 52($b$), it is seen that the power of the $\Delta\phi(t)$ has been increased. The power spectrum density function of the $\Delta\phi(t)$ has higher levels at lower frequencies.

Figure 53A:
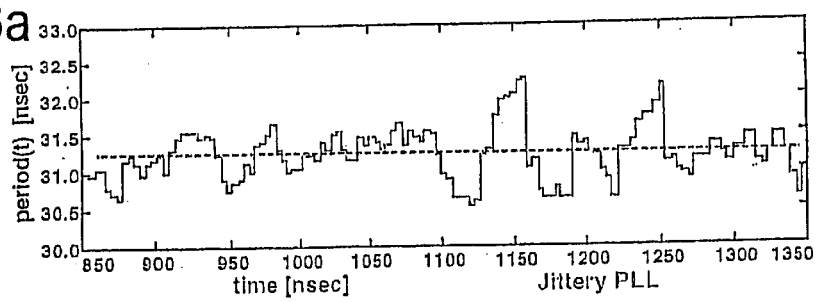
FIG. 53(*a*) is a diagram showing an instantaneous period of a phase noise of the jittery PLL circuit, and FIG. 53(*b*) is a diagram showing a waveform of the phase noise of the jittery PLL circuit.
Figure 53B:
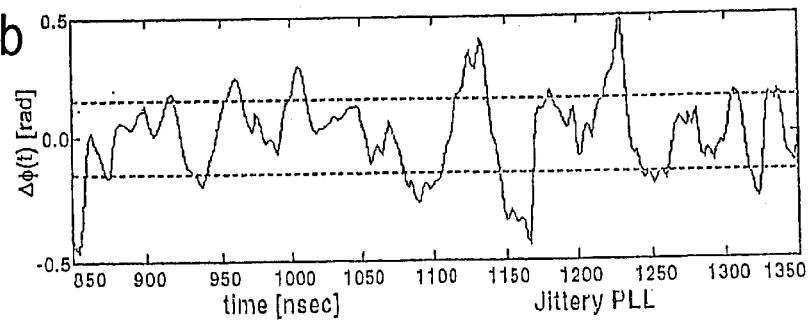

FIGS. 53($a$) and 53($b$) are diagrams for comparing the conventional zero crossing method with the method of measuring a jitter according to the present invention. FIG. 53($a$) shows a result of the instantaneous period measurement of an oscillation waveform of the VCO measured by the zero crossing method. FIG. 53($b$) shows the $\Delta\phi(t)$ estimated using the method of measuring a jitter according to the present invention. Comparing FIG. 53 with FIG. 49, it is seen that the corresponding waveform change is significantly different from one another. That is, when no jitter is present, an instantaneous period and/or the $\Delta\phi(t)$ shows low frequency components. On the other hand, when a jitter is present, an instantaneous period and/or the $\Delta\phi(t)$ shows relatively high frequency components. This means that the instantaneous period and/or the $\Delta\phi(t)$ shown in FIG. 53 corresponds to a phase noise. Further, if FIG. 53($a$) is carefully compared with FIG. 53($b$), the following can be seen. (i) The instantaneous period and the $\Delta\phi(t)$ are slightly similar to each other. However, (ii) the time resolution and the phase (period) resolution of the Δφ(t) are higher than those of the instantaneous period.

Summarizing the above results, the method of measuring a jitter (the Δφ(t) method) according to the present invention can estimate a phase noise with a high time resolution and a high phase resolution. Of course, the zero crossing method can also estimate a phase noise in the form of an instantaneous period. However, there is a disadvantage in the zero crossing method that the time resolution and the period estimating resolution are limited to the zero crossings.

Next, the conventional method of estimating a jitter will be compared with the method of measuring a jitter (the Δφ(t) method) according to the present invention. However, with respect to the estimation of an RMS jitter, the Δφ(t) method will be compared with the spectrum method, and with respect to the estimation of a peak-to-peak jitter, the Δφ(t) method will be compared with the zero crossing method.

Figure 54A:
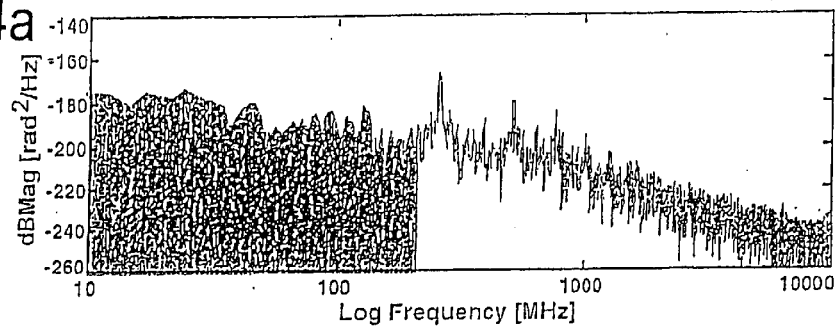
FIG. 54(*a*) is a diagram showing an RMS jitter estimated by a spectrum method, and FIG. 54(*b*) is a diagram showing $\Delta\phi(t)$ estimated by a phase noise waveform estimating method.
Figure 54B:
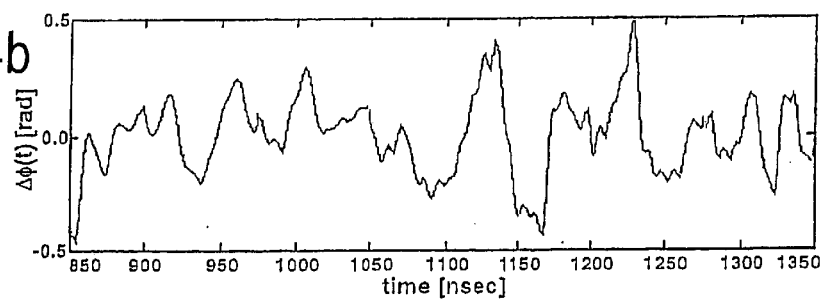
Figure 55:
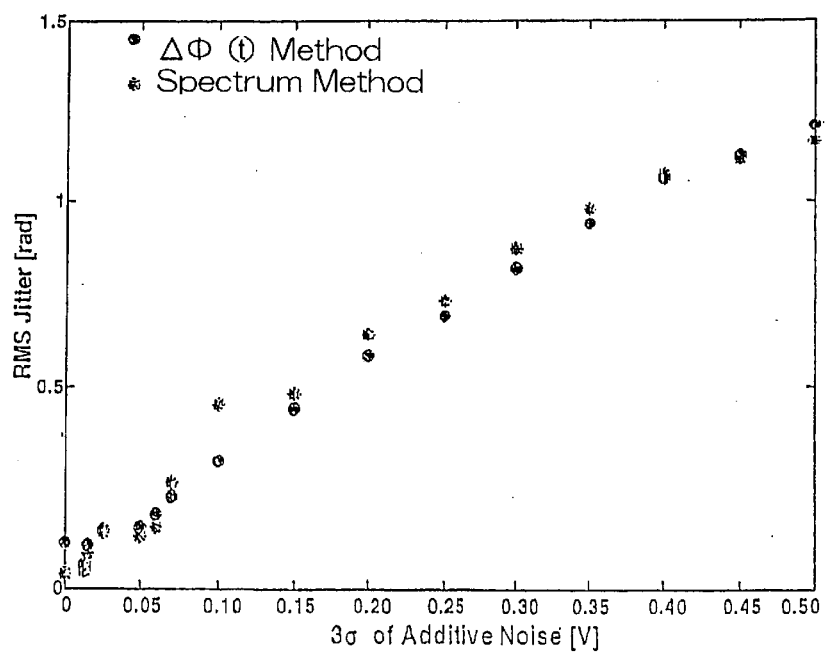
FIG. 55 is a diagram for comparing estimated values of the RMS jitter.

FIG. 54 shows conditions for comparing the estimated values of the RMS jitter. The power spectrum density function of the Δφ(t) estimated using the aforementioned Algorithm 4 is used as a spectrum of the conventional method. In the spectrum method, a sum of phase noise power spectrum in the frequency range (10 MHz–200 MHz) in which the second order harmonic is not included is obtained and an RMS jitter $J_{RMS}$ is estimated using the equation (3.33). The portion painted out in black in FIG. 54(a) is the spectrum corresponding to the frequency range. On the other hand, in the Δφ(t) method, an RMS jitter $J_{RMS}$ is estimated using the aforementioned Algorithm 3 and the equation (3.38). This corresponds to a root-mean-square value of the phase noise waveform Δφ(t). The 3σ of a Gaussian noise is applied to an input end of the VCO of the PLL circuit shown in FIG. 50 by changing its value from 0 to 0.5 V to estimate an RMS jitter value of an oscillation waveform of the VCO. As shown in FIG. 55, the Δφ(t) method and the spectrum method provide the estimated values substantially compatible with each other, respectively.

Figure 56A:
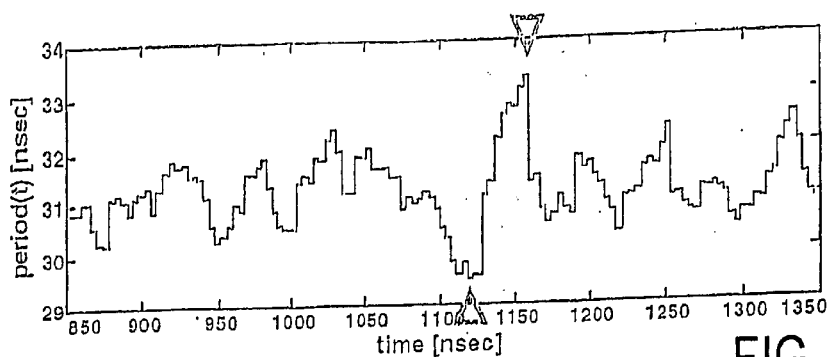
FIG. 56(*a*) is a diagram showing a peak-to-peak jitter estimated by the zero crossing method, and FIG. 56(*b*) is a diagram showing a peak-to-peak jitter estimated by the phase noise waveform estimating method.
Figure 56B:
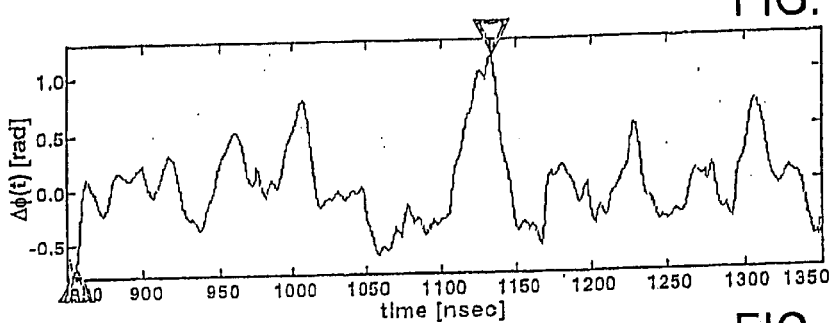
Figure 57:
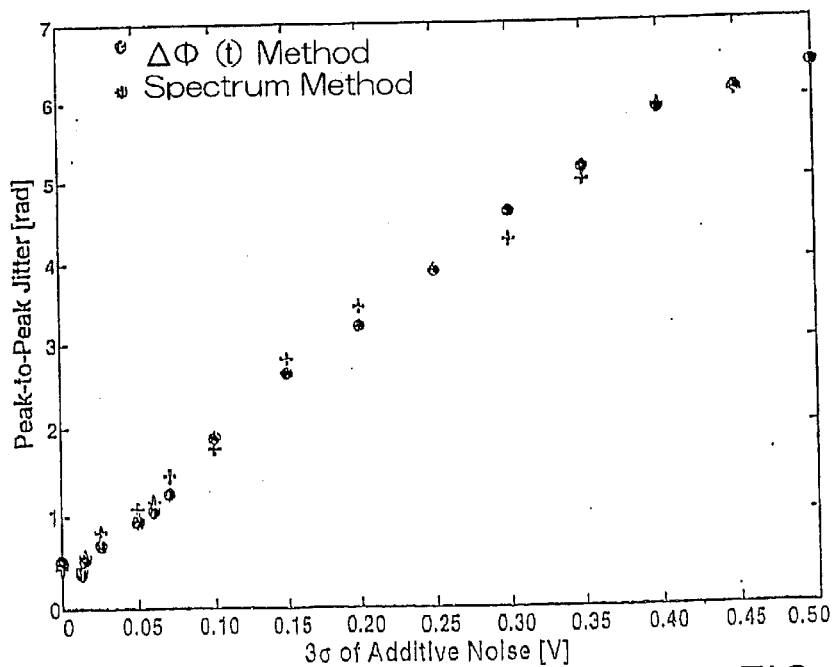
FIG. 57 is a diagram for comparing estimated values of the peak-to-peak jitter.

FIG. 56 shows diagrams for comparing estimated values of the peak-to-peak jitter. Triangular marks indicate respective peak values. The positions of the triangular marks are different between the Δφ(t) method and the spectrum method. This means that a peak-to-peak jitter is not necessarily be generated at the zero crossings. As shown in FIG. 57, the Δφ(t) method and the spectrum method provide the estimated values compatible with each other, respectively.

Summarizing the above results, the Δφ(t) method according to the present invention provides, in the estimation of an RMS jitter, estimated values compatible with those of the conventional spectrum method. Also in the estimation of a peak-to-peak jitter, the Δφ(t) method provides estimated values compatible with those of the zero crossing method.

Figure 50:
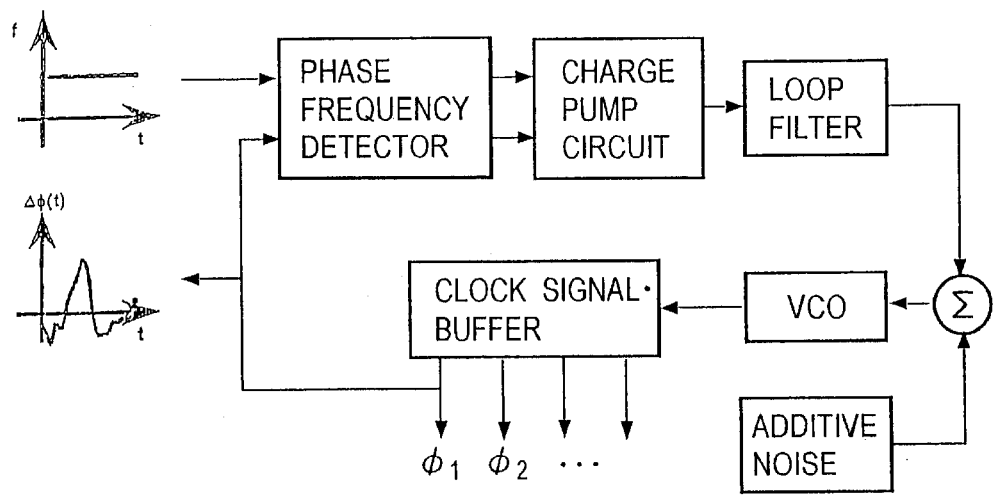
FIG. 50 is a block diagram showing a jittery PLL circuit.
Figure 66A:
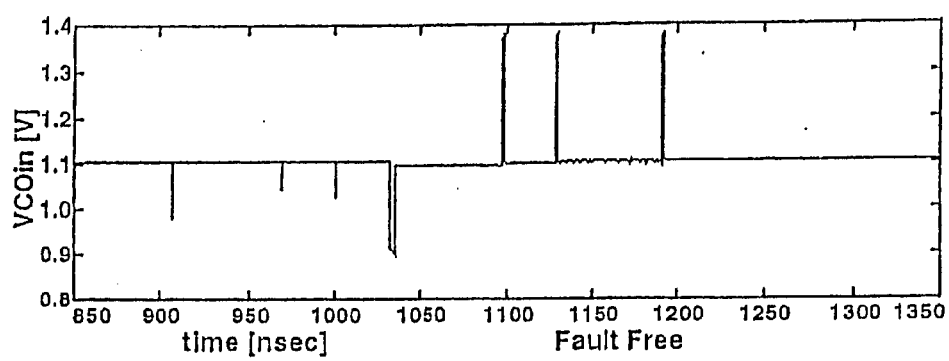
FIG. 66(*a*) is a waveform diagram showing a VCO input of a delay-fault free PLL circuit, and FIG. 66(*b*) is a waveform diagram showing a PLL clock of a delay-fault free PLL circuit.
Figure 66B:
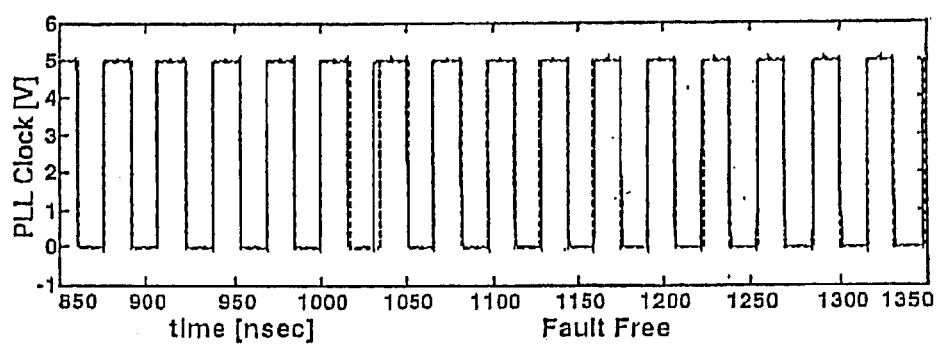

Next, the performance of the conventional method of estimating a jitter and the performance of the Δφ(t) method according to the present invention will be compared using a PLL clock which is frequency-divided into ¼ frequency. As the subject PLL circuit, the PLL circuit shown in FIG. 50 is used. The frequency divider of this circuit frequency-divides an oscillation waveform of the VCO into ¼ frequency to convert the oscillation frequency to a PLL clock having 32 MHz frequency. FIG. 66(b) shows the waveform of the PLL clock. In addition, in order to compare with the results of the aforementioned examples, the 3σ of an additive Gaussian noise is determined to be 0.05 V.

Assuming that the period of the oscillation waveform of the VCO is $\tau_{VCO}$, the period of the frequency-divided-by-four PLL clock $\tau_{PLL}$ is given by the following equation (3.48).

$$\tau_{PLL} = 4\left(\tau_{VCO} + \frac{\sum_{j}^{4} \varepsilon_i}{4}\right) \quad (3.48)$$

In this case, $\varepsilon_i$ represents a time fluctuation of a rise edge. From the equation (3.48), it can be understood that the frequency-division provides an effect to reduce the jitter of the clock.

Figure 58A:
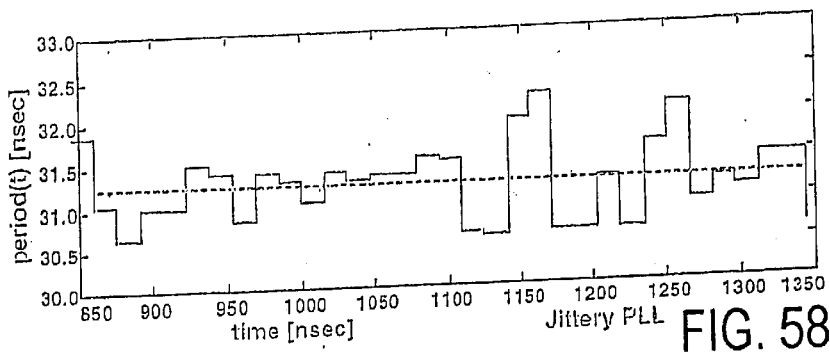
FIG. 58(*a*) is a diagram showing a result when an instantaneous period of a PLL clock is measured by the zero crossing method, and FIG. 58(*b*) is a waveform diagram showing a phase noise estimated by $\Delta\phi(t)$ method.
Figure 58B:
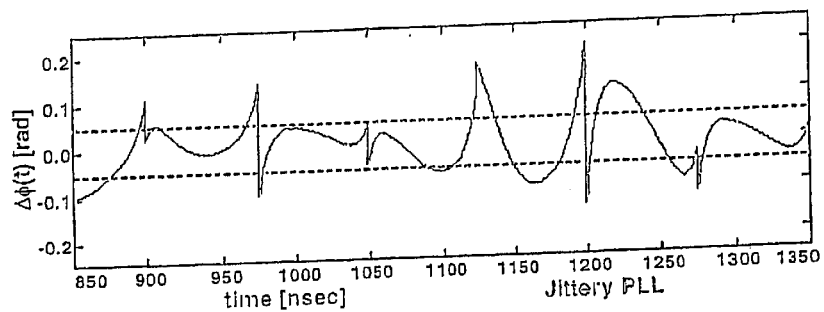

FIG. 58 shows diagrams for comparing the zero crossing method with the Δφ(t) method according to the present invention. FIG. 58(a) shows a result of the measurement of an instantaneous period of the PLL clock in the zero crossing method. FIG. 58(b) shows the Δφ(t) estimated using the aforementioned Algorithm 3 of the Δφ(t) method according to the present invention. A spectrum of a frequency range (20 MHz–59 MHz) in which the second order harmonic is not included is extracted by a bandpass filter, and the Δφ(t) is obtained by inverse fast Fourier transform. It is seen that the Δφ(t) of the PLL clock is significantly different from the Δφ(t) obtained from the oscillation waveform of the VCO shown in FIG. 53(b). The Δφ(t) of the PLL clock emphasizes phase discontinuity points. This is due to the frequency division. Because, the phase discontinuity points are in equal intervals and are corresponding to the regular frequency-division edges.

Figure 59:
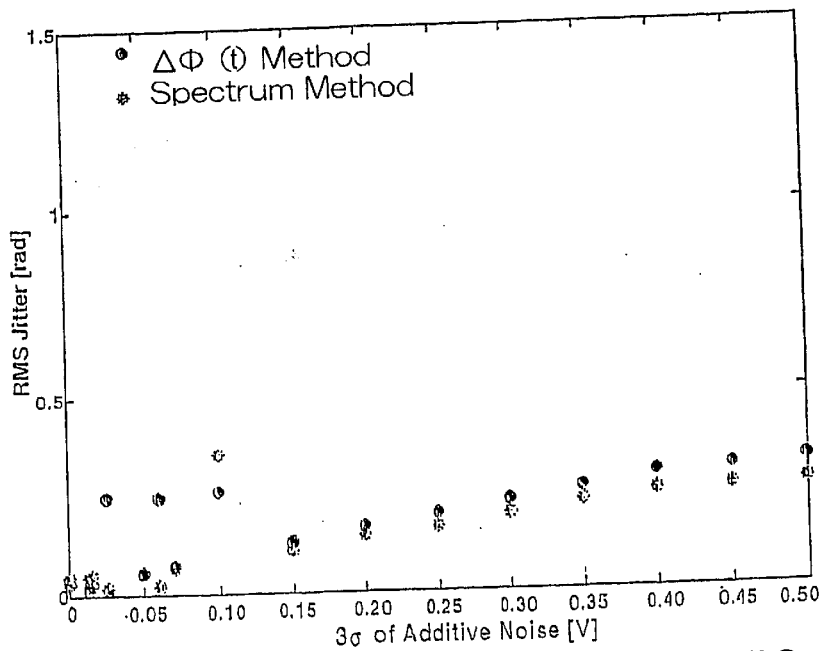
FIG. 59 is a diagram for comparing estimated values of the RMS jitter of a frequency-divided clock.

FIG. 59 shows a diagram for comparing the estimated values of the RMS jitter. In the spectrum method, (i) the Δφ(t) was estimated from the PLL clock using the Algorithm 4 of the Δφ(t) method according to the present invention; (ii) the Δφ(t) of 8092 points was multiplied by "the minimum 4 term window function" (for example, refer to a reference literature c18) and the power spectrum density function was estimated by fast Fourier transform. Next, (iii) in the spectrum method, a sum of phase noise power spectrum in the frequency range (20 MHz–59 MHz) in which the second order harmonic is not included was obtained and an RMS jitter $J_{RMS}$ was estimated using the equation (3.33). On the other hand, in the Δφ(t) method according to the present invention, an RMS jitter $J_{RMS}$ was estimated using the Algorithm 3 and the equation (3.38). As shown in FIG. 59, the Δφ(t) method and the spectrum method provide estimated values substantially compatible with each other. However, in the proximity of 0.05 V of 3σ of an additive Gaussian noise, the RMS jitter $J_{RMS}$ estimated by the Δφ(t) method is larger than the RMS jitter of the spectrum method. The reason for this will be explained together with the test result of the peak-to-peak jitter $J_{PP}$. Comparing FIG. 59 with FIG. 55, it is seen that the frequency-division to ¼ frequency in this specific example makes $J_{RMS}$ 1/3.7.

FIG. 60 shows a diagram for comparing the estimated values of the peak-to-peak jitter. The Δφ(t) method and the zero crossing method provide estimated values substantially compatible with each other. However, in the proximity of 0.05 V of 3σ of an additive Gaussian noise, the peak-to-peak jitter $J_{PP}$ estimated by the Δφ(t) method is larger than the peak-to-peak jitter of the zero crossing method. Next, the reason for this will be explained.

Figure 62:
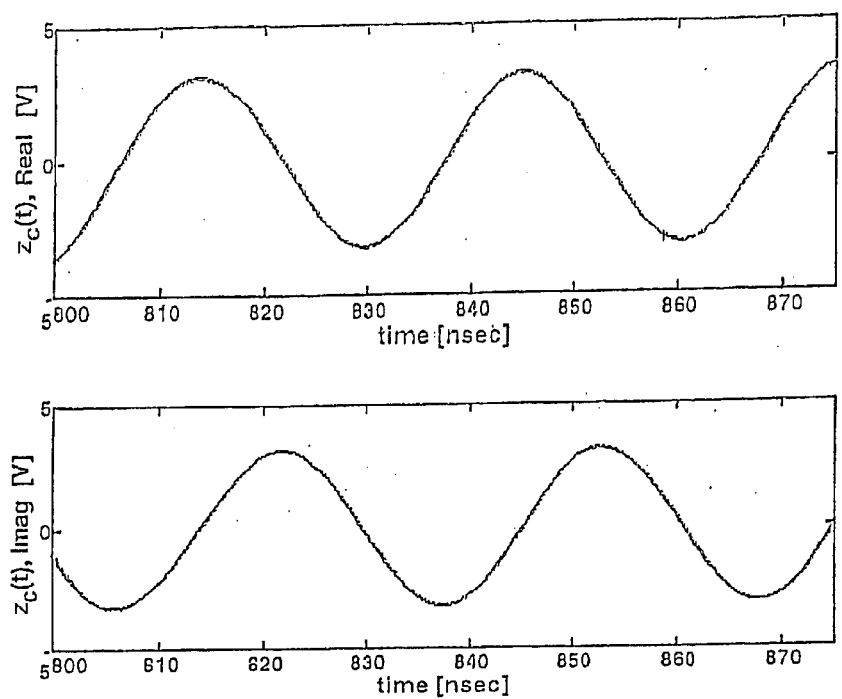
FIG. 62 is a waveform diagram showing an example of a Hilbert pair.

FIG. 61(a) shows a phase noise power spectrum when the 3σ is 0.05 V (substantially same estimated value as in the zero crossing method). A cursor in the figure indicates an upper limit frequency in estimating the Δφ(t). A weak phase modulation spectrum is recognized in the proximity of the cursor. FIG. 62 shows an analytic signal $Z_C(t)$ in this case. It is seen that the analytic signal $Z_C(t)$ has become a complex sine wave due to the weak phase modulation spectrum. For this reason, the instantaneous phase smoothly changes.

Figure 22:
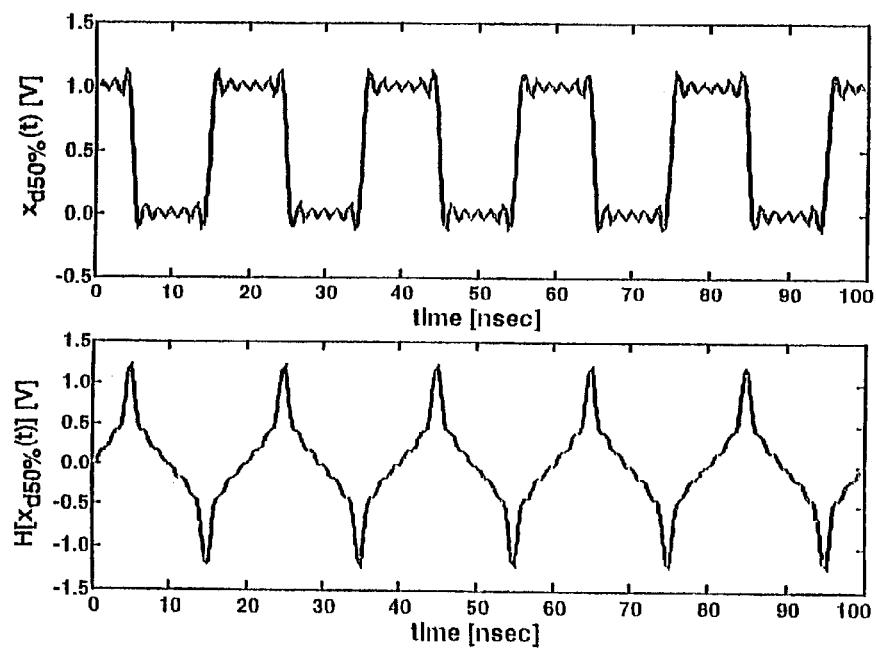
FIG. 22 is a waveform diagram showing a clock waveform and its Hilbert-transformed result.
Figure 23:
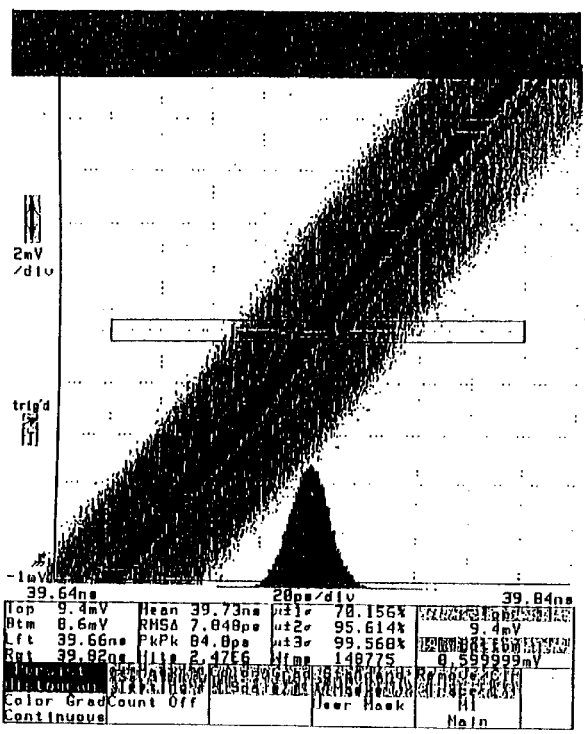
FIG. 23 is a diagram showing an example of a measured peak-to-peak jitter in time domain.
Figure 24:
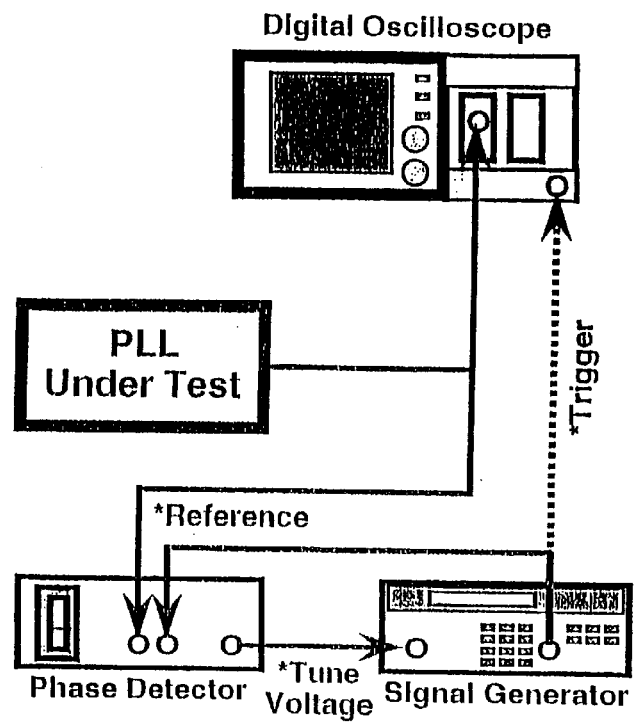
FIG. 24 is a typical model diagram showing a measuring system of a peak-to-peak jitter.
Figure 26:
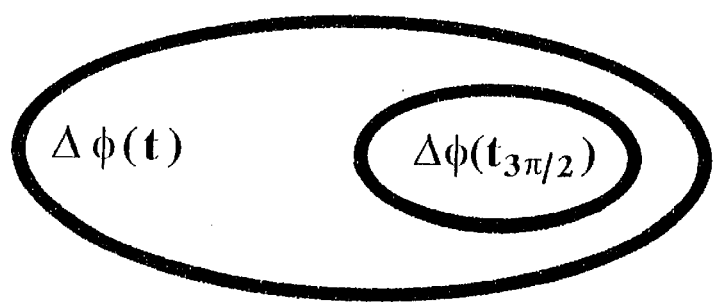
FIG. 26 is a diagram showing a set of phase noises and a set of phase noises which can be sampled by a zero crossing method.
Figure 27:
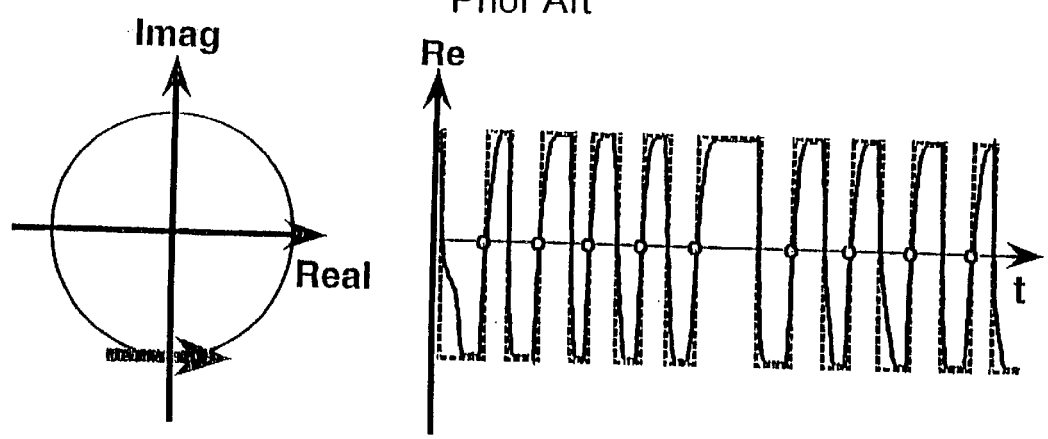
FIG. 27 is a diagram showing the zero crossing in a complex plane.
Figure 63:
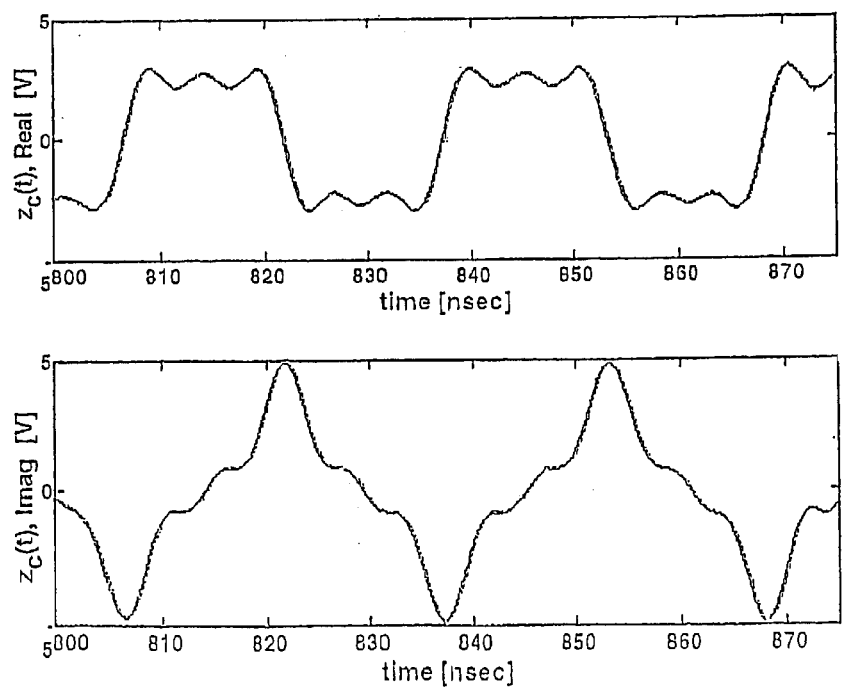
FIG. 63 is a waveform diagram showing another example of a Hilbert pair.
Figure 64A:
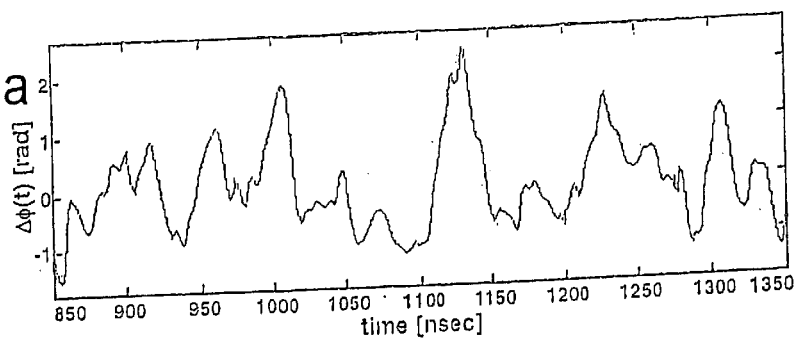
FIGS. 64(*a*) and 64(*b*) are a waveform diagram for explaining a difference between peak-to-peak jitters.
Figure 64B:
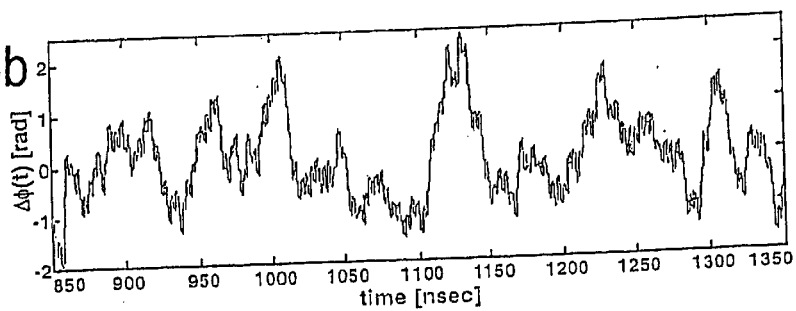
Figure 65:
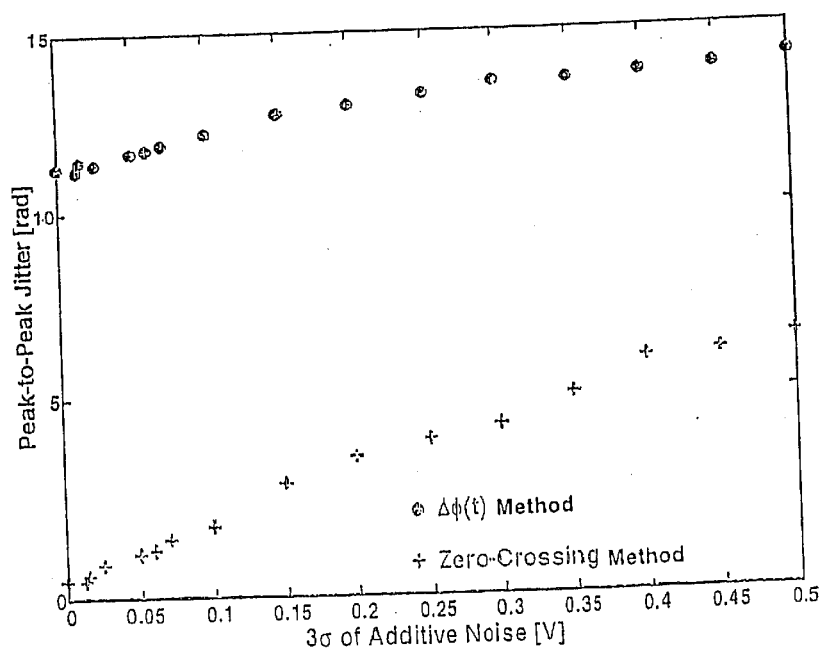
FIG. 65 is a diagram in which estimated values of the peak-to-peak jitter are plotted.

FIG. 61(b) shows a phase noise power spectrum when the 3σ is 0.10 V (larger estimated value than that in the zero crossing method). This phase noise power spectrum shows a shape of typical 1/f noise. The fundamental frequency of this 1/f noise is not the PLL clock frequency 32 MHz. However, the $Z_C(t)$ of the 1/f noise is given by the Hilbert pair of a square wave derived in the aforementioned example. Therefore, the $Z_C(t)$ shown in FIG. 63 takes the same shape as the Hilbert pair shown in FIG. 22. Since the $Z_C(t)$ has a complex shape, the instantaneous phase largely changes. Therefore, the $J_{PP}$ and the $J_{RMS}$ estimated by the $\Delta\phi(t)$ method take large values when the 3σ of an additive Gaussian noise is close to 0.05 V.

Comparing FIG. 60 with FIG. 57, it can be understood that the frequency-division to ¼ frequency in this specific example makes the $J_{PP}$ 1/3.2.

Summarizing the above results, it has been verified that the $\Delta\phi(t)$ method can also estimate an RMS jitter and a peak-to-peak jitter of a frequency-divided clock. The estimated value is compatible with the conventional measuring method. However, when the phase noise power spectrum takes a shape of 1/f noise, the $\Delta\phi(t)$ method indicates a larger value than in the conventional measuring method.

As is apparent from the above discussion, the effectiveness of the method of measuring a jitter (the $\Delta\phi(t)$ method) according to the present invention has been verified through a simulation. In addition, it has been verified that the zero crossing of the original waveform can be estimated from the zero crossing of the fundamental wave. This has provided an important base that the $\Delta\phi(t)$ method can estimate a peak-to-peak jitter compatible with the zero crossing method. Because, if the $\Delta\phi(t)$ is estimated using the spectrum of an entire frequency range rather than only fundamental wave, a waveform shown in FIG. 56(b) is obtained. That is, a ripple of higher frequencies is placed on top of the waveform. Further, as shown in FIG. 57, the compatibility with the zero crossing method cannot be realized. Moreover, it has been verified that, when the $\Delta\phi(t)$ method is applied to a jittery PLL circuit, the $\Delta\phi(t)$ method is effective for the phase noise estimation. In addition, it has been made clear that the conventional method of measuring a jitter is compatible with the $\Delta\phi(t)$ method with respect to a peak-to-peak jitter and an RMS jitter. Further, it has been verified that a jitter of a frequency-divided clock can also be estimated with a compatibility.

Figure 70A:
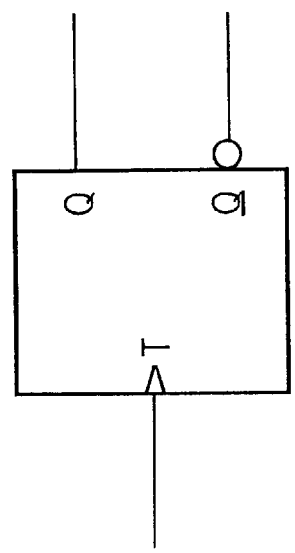
FIG. 70A is a diagram showing a ½ frequency divider.
Figure 70B:
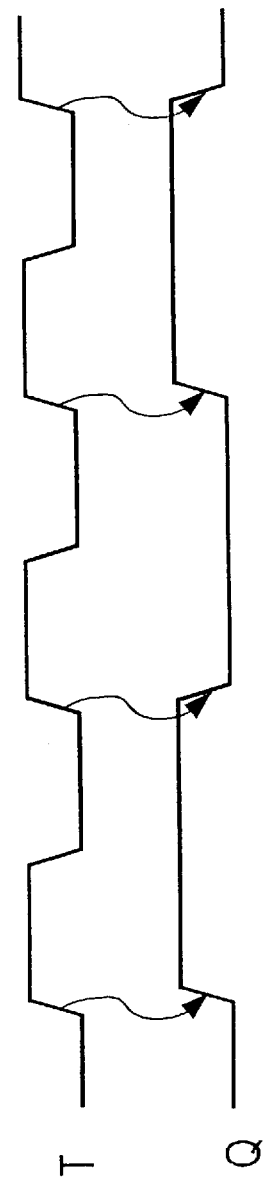
FIG. 70B is a diagram showing an input waveform T and an output waveform Q of the frequency divider shown in FIG. 70A.

Moreover, in the present invention, a scalable apparatus for and a scalable method of measuring a jitter are proposed. That is, for example, as shown by a dashed line in FIG. 32, a frequency of a clock waveform $X_c(t)$ from the PLL circuit under test 17 or the like is frequency-divided by the variable frequency divider 41 into 1/N (N is an integer) frequency, i.e., the clock period, is expanded to N times. If, as the frequency divider 41, for example, a T (toggle) flip-flop shown in FIG. 70A that is triggered by a rising edge is used, an input clock T is outputted, as shown in FIG. 70B, as a clock Q having a two time period. In this manner, by making the period of the clock waveform $X_C(t)$ N times (N is an integer equal to or greater than 2), an analog to digital converter ADC that operates at relatively low operating frequency (sampling frequency) can be used. That is, even if the frequency of the clock waveform $X_C(t)$ is high, its jitter may be measured by decreasing the frequency of the clock waveform $X_C(t)$ to 1/N so that the analog to digital converter ADC is operable.

When a peak-to-peak jitter and an RMS jitter of the clock waveform $X_C(t)$ are assumed to be $J_{PP1}$ and $J_{RMS1}$, respectively, and those jitters of this clock waveform $X_C(t)$ whose frequency is frequency-divided to 1/N of the frequency of the clock waveform $X_C(t)$ are measured, those jitters are given by the equations (4.1)

$$J_{PPN}=J_{PP1}/N, \quad J_{RMSN}=J_{RMS1}/N \quad (4.1)$$

Figure 71:
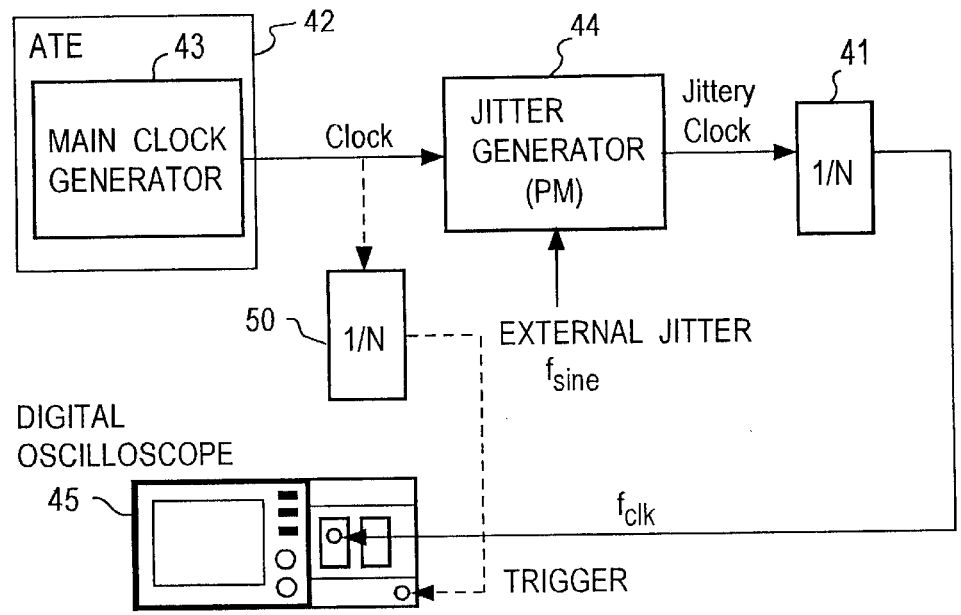
FIG. 71 is a block diagram showing a system configuration for measuring a jitter of the frequency-divided clock waveform by a digital oscilloscope.
Figure 72:
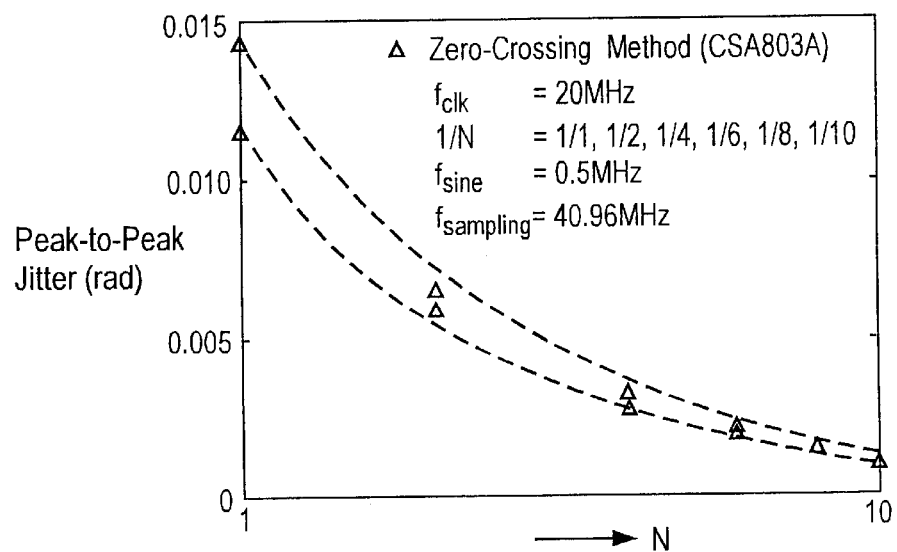
FIG. 72 is a diagram showing a relationship between a peak-to-peak jitter measured by the system shown in FIG. 71 and the number of frequency divisions N of the frequency divider.
Figure 73:
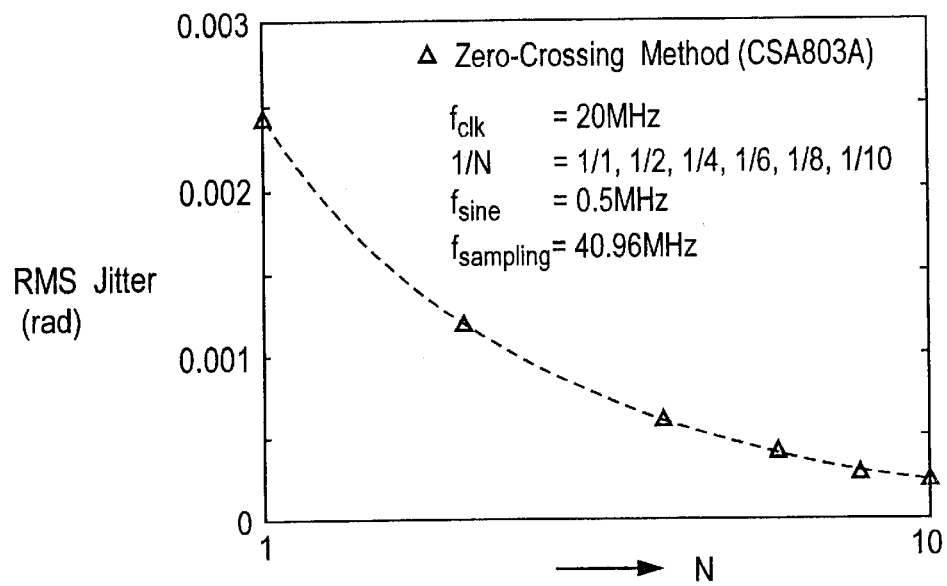
FIG. 73 is a diagram showing a relationship between an RMS jitter measured by the system shown in FIG. 71 and the number of frequency divisions N of the frequency divider.

This will be verified by a measuring system shown in FIG. 71. That is, a clock signal is generated from a main clock generator 43 in an ATE (Automatic Testing Equipment) 42. This clock signal is phase-modulated by a sine wave external jitter in a jitter generator 44 so that a jitter is added to the clock signal. The clock to which a jitter has been added is frequency-divided to 1/N, by a variable frequency divider 50. The frequency-divided output is supplied to a digital oscilloscope 45 as a signal under test. A clock signal from the main clock generator 43 is frequency-divided by the frequency divider 50 to 1/M and is supplied to the digital oscilloscope 45 as a trigger signal. A peak-to-peak jitter $J_{PP}$ and an RMS jitter $J_{RMS}$ are measured by the digital oscilloscope 45, and those measured results are shown in FIGS. 72 and 73, respectively. In FIGS. 72 and 73, a lateral axis indicates the number of frequency divisions N, and a longitudinal axis indicates values of jitter. A symbol Δ indicates a measured value, and a dotted line indicates a 1/N curve. With respect to each of the peak-to-peak jitter and RMS jitter, the measured jitter values corresponding to various N values are substantially equal to the values of 1/N curve, and hence it is verified that the equations 4.1 are concluded.

Figure 74:
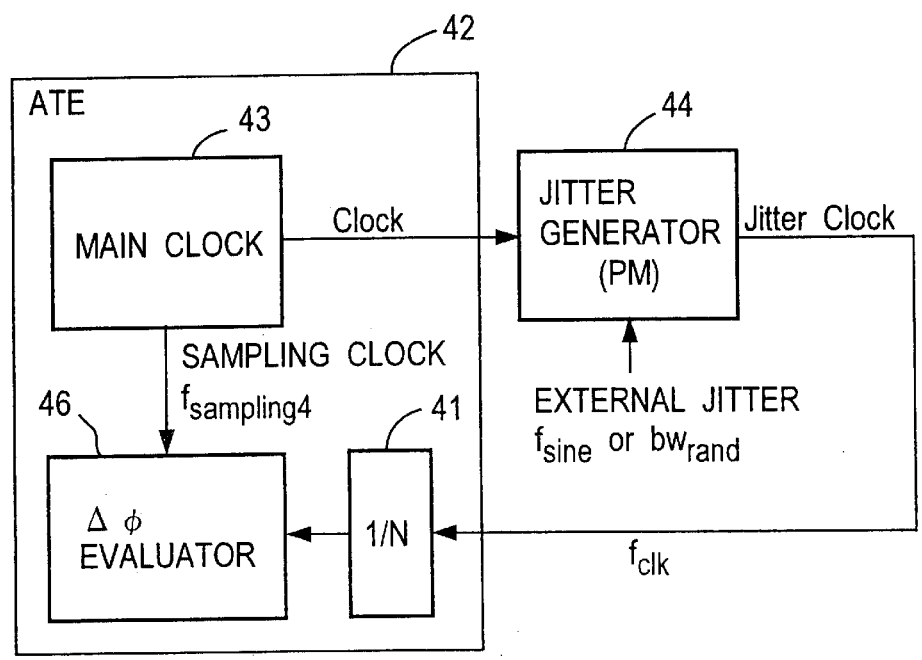
FIG. 74 is a block diagram showing a system configuration for measuring a jitter of the frequency-divided clock waveform using a $\Delta\phi$ evaluator.
Figure 75:
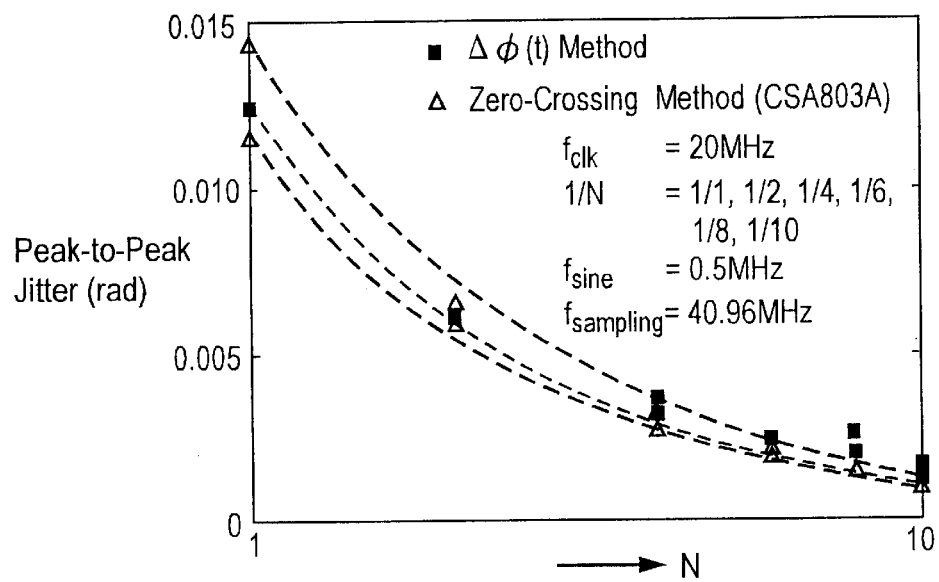
FIG. 75 is a diagram showing a relationship between a peak-to-peak jitter measured by the system shown in FIG. 74 and the number of frequency divisions N of the frequency divider.
Figure 76:
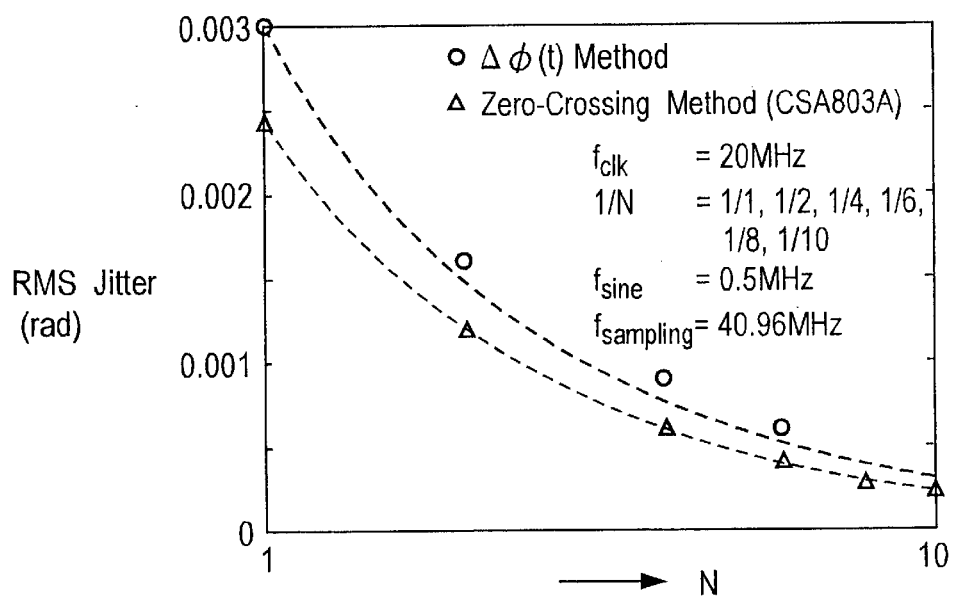
FIG. 76 is a diagram showing a relationship between an RMS jitter measured by the system shown in FIG. 74 and the number of frequency divisions N of the frequency divider.

In addition, as shown in FIG. 74, a jitter has is added to the clock signal from the main clock generator 43 in the jitter generator 44 by a sine wave $f_{sine}$ or a band-limited random noise $bw_{rand}$. The clock signal to which a jitter has been added is frequency-divided by the variable frequency divider 41. Then a phase noise waveform $\Delta\phi(t)$ is obtained by a $\Delta\phi$ evaluator 46 with respect to the frequency-divided clock signal, and the peak-to-peak jitter and the RMS jitter are evaluated. The $\Delta\phi$ evaluator 46 comprises, for example, the analog to digital converter ADC, the analytic signal transforming means 11, the instantaneous phase estimator 12, the a linear phase remover 13, the peak-to-peak detector 14, and the root-mean-square detector 15 shown in FIG. 32. The peak-to-peak jitter values and the RMS jitter values in this case obtained for various numbers of frequency divisions N are shown in FIGS. 75 and 76, respectively. In those figures, a symbol ○ indicates a value obtained by the $\Delta\phi$ evaluator 46, and a symbol Δ indicates a value obtained by the zero crossing method. A dotted line in FIG. 75 indicates a 1/N curve. It could be understood from those FIGS. 75 and 76 that a jitter can accurately be measured by combining the frequency divider 41 and the $\Delta\phi(t)$ method.

That is, in FIG. 32, a clock signal $X_C(t)$ from the PLL circuit under test 17 is frequency-divided by the frequency divider 41 to 1/N frequency. This frequency divided clock signal is converted into a digital signal, and further, this digital signal is transformed to a complex analytic signal by the Hilbert pair generator 11 to obtain an instantaneous phase of the analytic signal. A linear component is removed from the instantaneous phase to obtain a phase noise waveform $\Delta\phi(t)$. Then, a peak-to-peak jitter of the clock signal $X_C(t)$ can be obtained by detecting a peak-to-peak value of the $\Delta\phi(t)$, and then by multiplying, by the multiplier 47, the peak-to-peak value of the $\Delta\phi(t)$ by N. In addition, an RMS jitter of the clock signal $X_C(t)$ can be obtained by calculating a root-mean-square value of the $\Delta\phi(t)$, and then by multiplying, by the multiplier 48, the root-mean-square value of the $\Delta\phi(t)$ by N.

In this case, a scalable measurement can be performed by selecting the number of frequency divisions N of the frequency divider 41 in accordance with the frequency of the clock signal $X_C(t)$ so that the analog to digital converter ADC is operable.

Also in the embodiment shown in FIG. 40*a*, a clock signal from the PLL circuit under test 17 is, as shown by a dotted line, frequency-divided by the frequency divider 41 to 1/N frequency. And the analytic signal can be obtained by multiplying, in the mixer, the frequency-divided output by a sine wave signal and by multiplying, in the mixer, the frequency-divided output by a cosine wave signal. Similarly, in the embodiment shown in FIG. 40*b*, a clock signal from the PLL circuit under test 17 is frequency-divided by the frequency divider 41 to 1/N frequency. And the analytic signal may also be obtained by multiplying, in the mixer, the frequency-divided output by a cosine wave signal and by supplying the mixer output to the lowpass filter.

Next, in the present invention, an embodiment in which the AD converter is replaced by a comparator will be described. For example, as shown in dotted lines in FIGS. 32 and 68, a comparator 51 is used instead of the analog to digital converter ADC. Pulses having a constant period are applied to the comparator 51, and an inputted clock waveform $X_C(t)$ is compared with a reference analog quantity $V_R$ at, for example, a rising edge of the pulse. If a level of the clock waveform $X_C(t)$ is larger than that of the reference analog quantity $V_R$, for example, a predetermined high level is outputted, and if the level of the clock waveform $X_C(t)$ is smaller than that of the reference analog quantity $V_R$, a predetermined low level is outputted.

Further, there is a case that an inputted clock waveform $X_C(t)$ is distorted, and an amplitude of a harmonic component of the clock waveform $X_C(t)$ is larger than that of a fundamental wave component. From such a view point, it is better that a lowpass filter (or a bandpass filter) for extracting a fundamental wave component of the clock waveform $X_C(t)$ is provided at the input side of the comparator 51. An output signal of the comparator 51 is inputted to the analytic signal transforming means 11, and is processed similarly to the output signal of the analog to digital converter ADC to obtain a jitter of the inputted clock waveform $X_C(t)$.

Figure 77:
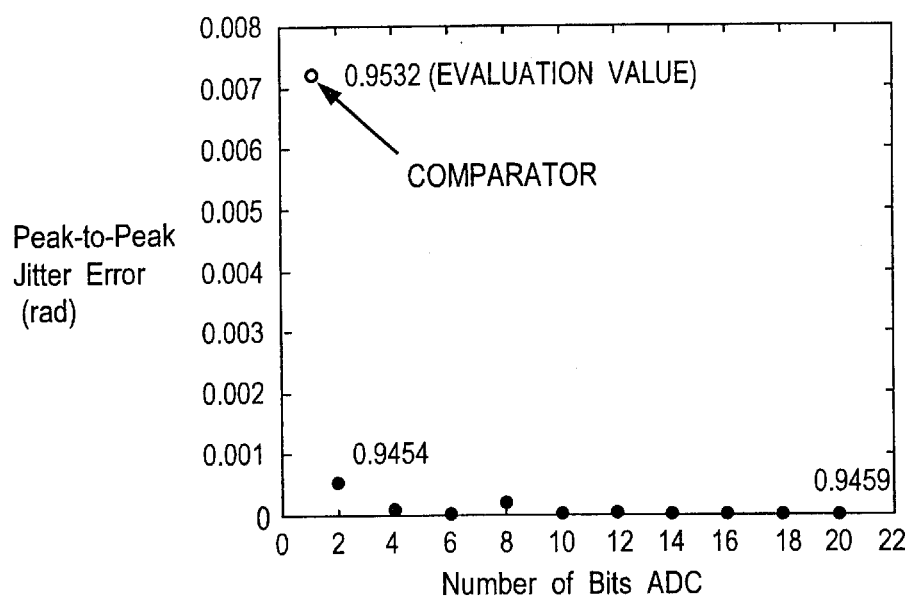
FIG. 77 is a diagram showing respective results when a clock signal close to a sine wave is supplied to an analog to digital converter and a comparator, where peak-to-peak jitters are measured.
Figure 78:
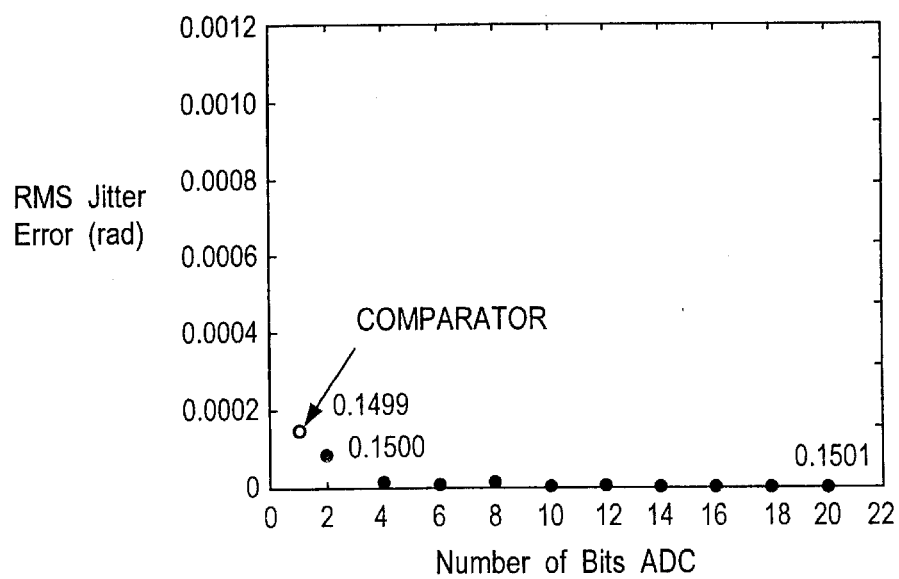
FIG. 78 is a diagram showing respective results when a clock signal close to a sine wave is supplied to an analog to digital converter and a comparator, where RMS jitters are measured.

Jitters of an output of the VCO (Voltage Control Oscillator) that is close to a sine wave are obtained in the case where the analog to digital converter ADC is used in the measuring apparatus shown in FIG. 32, and in the case where the comparator is used in the measuring apparatus shown in FIG. 32. The measured result of the peak-to-peak jitter is shown in FIG. 77 and the measured result of the RMS jitter is shown in FIG. 78. In those figures, a black circle indicates the case of the analog to digital converter ADC, a white circle indicates the case of the comparator 51, and a lateral axis indicates the number of bits of the analog to digital converter ADC.

In FIG. 77, when the analog to digital converter ADC was used, a peak-to-peak jitter in the case of two bit ADC was 0.9454, and a peak-to-peak jitter in the case of eight bit ADC was 0.9459. In the case of the comparator 51, a peak-to-peak jitter was 0.9532. Even if the comparator 51 is used, the measured result coincides in the accuracy of two digits with that of the case in which the analog to digital converter ADC is used. As a result, it is understood that the jitter measurement is possible in this level of accuracy even using the comparator 51. As can be understood from FIG. 78, even the comparator 51 is used, there can also be obtained an RMS jitter that coincides in the accuracy of two digits with that of the case in which the analog to digital converter ADC is used.

Figure 79:
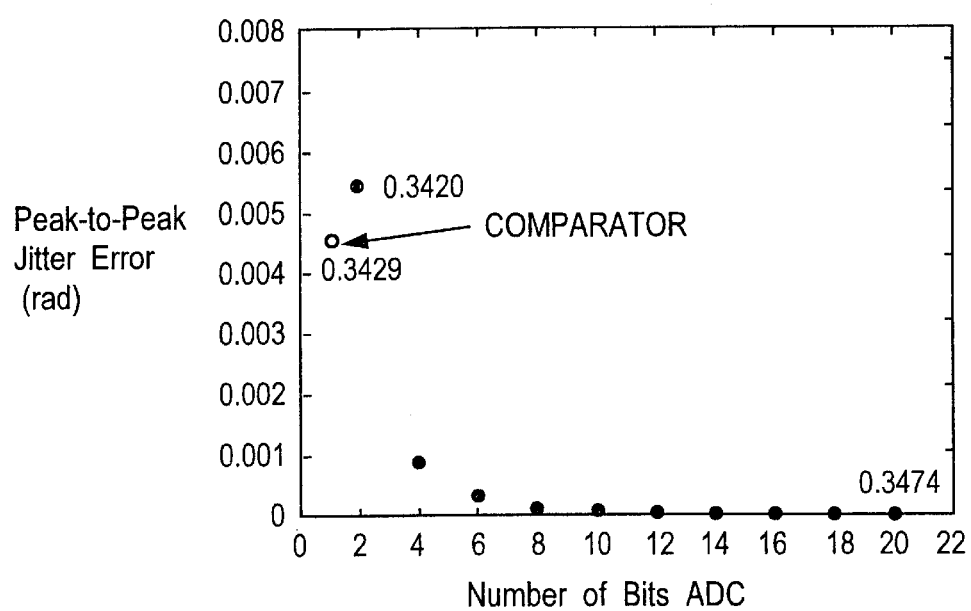
FIG. 79 is a diagram showing respective results when a clock signal having a square wave shape is supplied to an analog to digital converter and a comparator, where peak-to-peak jitters are measured.
Figure 80:
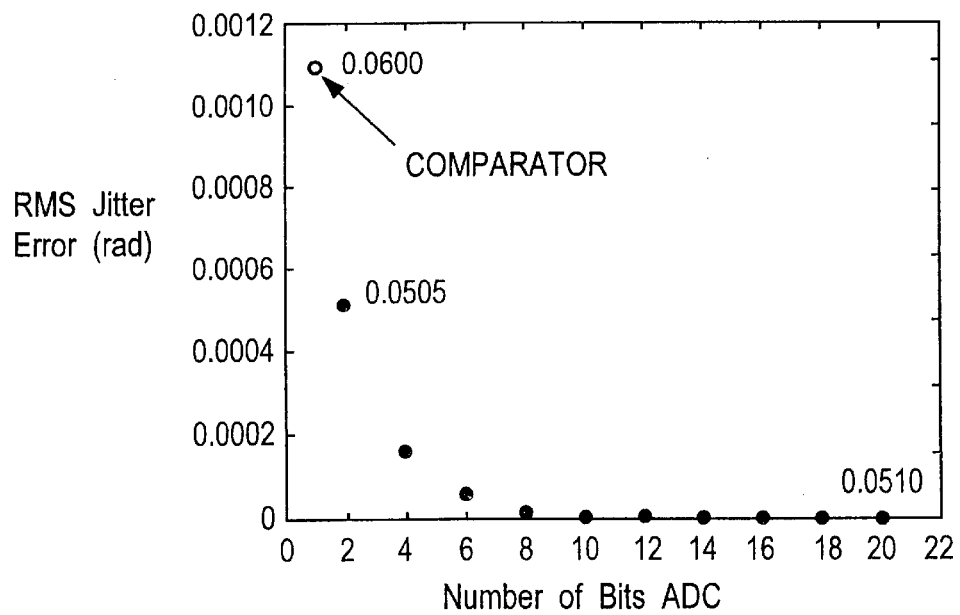
FIG. 80 is a diagram showing respective results when a clock signal having a square wave shape is supplied to an analog to digital converter and a comparator, where RMS jitters are measured.

FIGS. 79 and 80 respectively show a measured result of peak-to-peak jitter and a measured result of RMS jitter similarly measured when an output signal of the PLL circuit 17 that is close to a square waveform is used as the analog clock waveform $X_C(t)$, and this signal is frequency-divided by the frequency divider 41. A peak-to-peak jitter is 0.3429 in the case where the comparator 51 is used. Also, a peak-to-peak jitter is 0.3420 in the case where the analog to digital converter ADC is used and the ADC has a two bit output. In addition, a peak-to-peak jitter is 0.3474 in the case where the analog to digital converter ADC is used and the ADC has an eight bit output. In those cases, it could also be understood that even if the comparator 51 is used, a peak-to-peak jitter can be measured in the accuracy of two digits. Similarly, an RMS jitter is 0.0500 in the case where the comparator 51 is used. Also, an RMS jitter is 0.0505 in the case where the analog to digital converter ADC is used and the ADC has a two bit output. In addition, an RMS jitter is 0.0510 in the case where the analog to digital converter ADC is used and the ADC has an eight bit output. It could also be understood that even if the comparator 51 is used, an RMS jitter can be measured in the accuracy of two digits.

In the case of using the comparator 51, an analog clock waveform $X_C(t)$ may also be frequency-divided by the frequency divider 41 to be supplied to the comparator 51. In addition, as shown by dotted lines in FIG. 40(*a*), a comparator 51*c* may be used, after multiplying a clock waveform $X_C(t)$ by a cosine wave in the mixer and then passing through a lowpass filter, instead of the converter ADC for converting the lowpass filter output of this signal into a digital signal, and a comparator 51*s* may be used, after multiplying a clock waveform $X_C(t)$ by a sine wave in the mixer and then passing through a lowpass filter, instead of the converter ADC for converting the lowpass filter output of this signal into a digital signal. This processing case can be applied to either case where the frequency divider 41 is used or the frequency divider is not used. Moreover, as shown by dotted lines in FIG. 40(*b*), a comparator 51 may be used instead of the converter ADC for converting into a digital signal a frequency-converted output of a clock waveform $X_C(t)$ converted to a low frequency band signal by a mixer and a lowpass filter. This processing case can also be applied to either case where the frequency divider 41 is used or the frequency divider is not used. Furthermore, in order to generate an input signal of the analytic signal transforming means 11 shown in FIGS. 67 and 69, as shown by dotted lines in those figures, a comparator 51 may also be used instead of the analog to digital converter ADC to supply an output of the comparator 51 to the analytic signal transforming means 11. In those cases, the clock waveform $X_C(t)$ may also be frequency-divided by the frequency divider 41 to be supplied to the comparator 51.

As described above, the method of measuring a jitter of a clock according to the present invention comprises the signal processing steps of: transforming a clock waveform $X_C(t)$ into a complex analytic signal using the analytic transforming means 11; and estimating a variable term $\Delta\phi(t)$ of an instantaneous phase. This method has the following characteristics.

(i) The $\Delta\phi(t)$ method does not require a trigger signal. (ii) A peak-to-peak jitter and an RMS jitter can simultaneously be estimated from the $\Delta\phi(t)$. (iii) A peak-to-peak jitter value estimated using the $\Delta\phi(t)$ method is compatible with an estimated value in the conventional zero crossing method. (iv) An RMS jitter value estimated using the $\Delta\phi(t)$ method is compatible with an estimated value in the conventional zero crossing method.

(v) In the measurement of a jitter by a conventional spectrum analyzer, it is necessary to sweep frequencies and to slowly sweep frequencies in order to increase resolution. Hence it takes approximately five to ten minutes for the measurement. However, according to the present invention, even if the measurement requires 1000 periods at the frequency of, for example, 10 MHz of the clock signal $X_C(t)$, the measuring time period is no more than 100 msec, and the measurement can be completed within the time allocated for a VLSI test. (vi) When the frequency of the clock signal $X_C(t)$ is high, a jitter can be measured by frequency-dividing the clock signal $X_C(t)$ by N, and by supplying the frequency-divided clock signal to a $\Delta\phi$ evaluator. Particularly, even if the frequency of the clock signal $X_C(t)$ is different by case, a scalable measurement can be performed by changing the number of frequency divisions.

(vii) In the example shown in FIG. 70, the rising and falling of the frequency-divided signal Q are determined by only the rising edge of the clock signal T. Therefore, in the case of using the frequency divider 41, a jitter of only rising edge or falling edge of the clock signal $X_C(t)$ can be measured by defining the number of frequency divisions as 2W (W is an integer equal to or greater than 1).

(viii) In the case of using the comparator 51, since a high speed comparator can be realized more easily than a high speed comparator ADC, and in addition a high speed comparator is equipped in a generic automatic testing equipment (ATE), even if the clock signal $X_C(t)$ is high speed, the clock signal $X_C(t)$ may be supplied to the comparator provided in the ATE, and the output of the comparator may be supplied to the analytic signal transforming means 11.

Figure 81A:
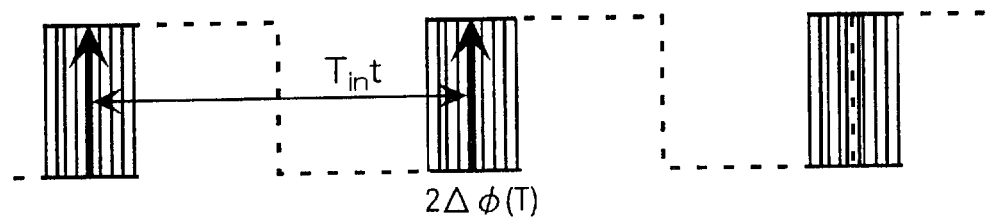
FIG. 81*a* is a diagram showing a jitter of relative time of a zero crossing.
Figure 81B:
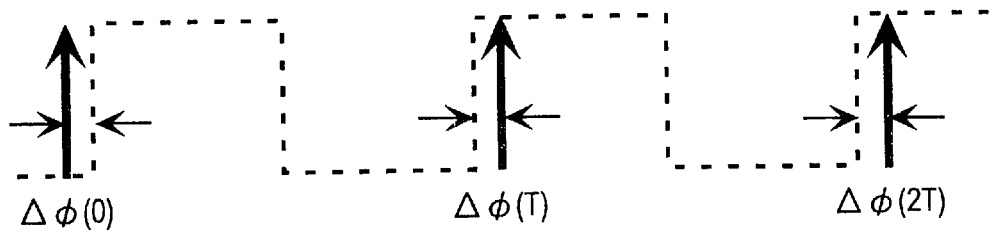
FIG. 81*b* is a diagram showing a jitter against an ideal timing.
Figure 82:
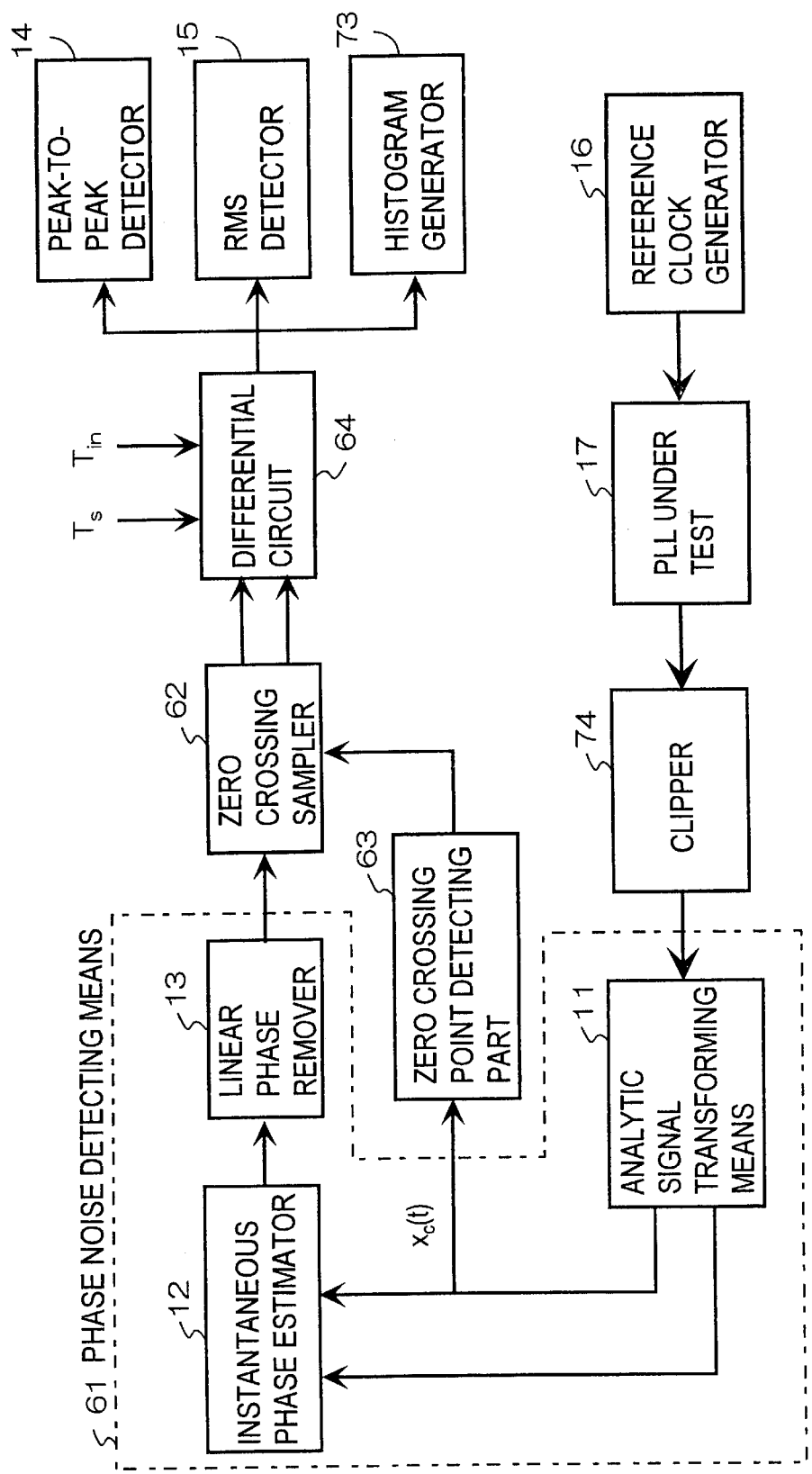
FIG. 82 is a block diagram showing a functional configuration of an embodiment in which the present invention is applied to a measurement of a peak-to-peak jitter.
Figure 83:
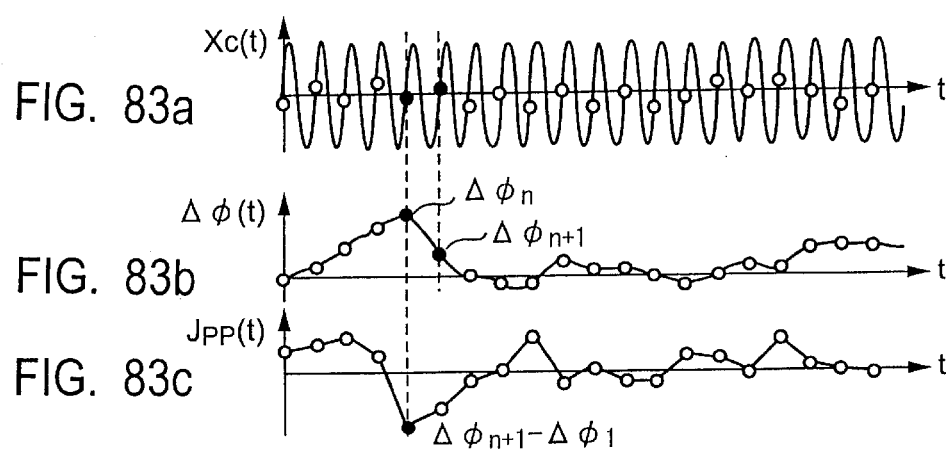
FIGS. 83(*a*), 83(*b*), 83(*c*) are diagrams showing approximate zero crossing points, samples of the phase noise waveform and their differentials in the embodiment shown in FIG. 82.

As explained before with reference to FIG. 81a, the conventional zero crossing method or the conventional time interval method is a method in which a relative fluctuation between zero crossings is detected. A peak-to-jitter $J_{PP}$ having compatibility with a peak-to-peak jitter $J_{PP}$ obtained by the conventional zero crossing method can be obtained utilizing the $\Delta\phi(t)$ method. For example, as shown in FIG. 82, a phase noise waveform $\Delta\phi(t)$ detected by the phase noise detecting means 61 comprising the analytic signal transforming means 11, the instantaneous phase estimator 12 and the linear phase remover 13 is inputted to a zero crossing sampler 62, by which the phase noise waveform $\Delta\phi(t)$ is sampled at a timing closest to a zero crossing point of the real part $X_C(t)$ of the analytic signal $Z_C(t)$. That is, a waveform of the real part $X_C(t)$ of the analytic signal is shown in FIG. 83a, and sample points (arithmetic processing time points) each being closest to a zero crossing point of the rising (or falling) waveform are detected by a zero crossing point detecting part 63. FIG. 83a shows, by circle marks o, the points each being closest to a detected zero crossing point. Those points are called approximate zero crossing points. A phase noise waveform $\Delta\phi(t)$ at each of the approximate zero crossing points is taken out, as shown by circle marks o in FIG. 83b, by the zero crossing sampler 62. Each of the taken out values is an amount of deviation from an ideal timing (zero crossing point) of the real part $X_C(t)$ of the jitter-free analytic signal. By obtaining a difference between each sample value and a sample value sampled immediately before it of the $\Delta\phi(t)$, a fluctuation between zero crossings, i.e., a peak-to-peak jitter $J_{PP}$ can be obtained. A $J_{PP}=\Delta\phi_{n+1}-\Delta\phi_n$ can be obtained from nth sample $\Delta\phi_n$ and (n+1)th sample $\Delta\phi_{n+1}$ of the $\Delta\phi(t)$ shown in FIG. 83b.

As shown in FIG. 82, a difference between a sample value and a sample value sampled immediately before it from the zero crossing sampler 62 can be obtained by a differential circuit 64 in the sequential order to obtain a peak-to-peak jitter $J_{PP}$. Regarding the obtained series of peak-to-peak jitters $J_{PP}$, a difference between the maximum value and the minimum value is detected by the peak-to-peak detector 14, and a root-mean square value is calculated by the root-mean-square detector 15. Namely, a differential waveform of the sample phase noise waveform from the zero crossing sampler 62 is calculated by the differential circuit 64, and the differential phase noise waveform is supplied to the detectors 14 and 15.

A detecting method of an approximate zero crossing point in the zero crossing point detecting part 63 will be described. Assuming that the maximum value of a waveform of an inputted real part $X_C(t)$ is 100% level, and the minimum value is 0% level, a 50% level V (50%) of a difference between the maximum value and the minimum value is calculated as a zero crossing level. A difference between a sample value and 50% level V (50%) and a difference between its adjacent sample value and 50% level V (50%), i.e., $(X_C(j-1)-V(50\%))$ and $(X_C(j)-V(50\%))$ are calculated, and further a product of those values $(X_C(j-1)-V(50\%))\times(X_C(j)-V(50\%))$ is calculated. When the $X_C(t)$ crosses 50% level, i.e., zero level, its sample value $X_C(j-1)$ or $X_C(j)$ changes from a negative value to a positive value or from a positive value to a negative value. Therefore, when the product is negative, it is detected that the $X_C(t)$ has passed the zero level, and a time point j-1 or j at which a smaller absolute value of the sample value $X_C(j-1)$ or $X_C(j)$ is detected is obtained as an approximate zero crossing point.

Figure 84:
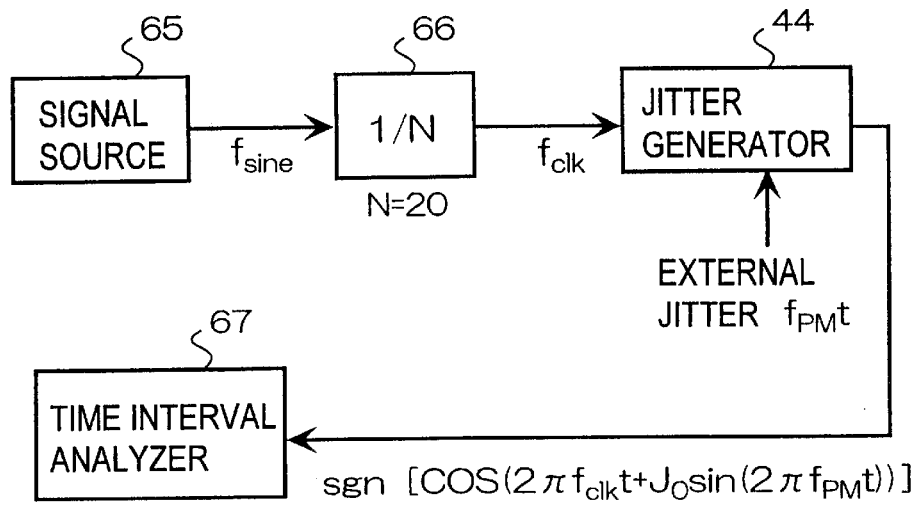
FIG. 84 is a diagram showing a configuration of an experiment of a peak-to-peak jitter measurement using a conventional time interval analyzer.
Figure 85:
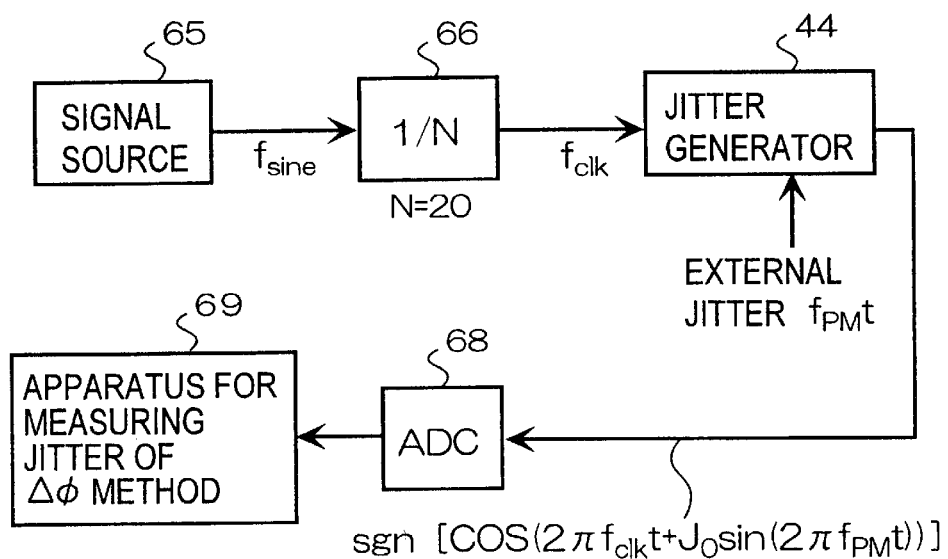
FIG. 85 is a diagram showing a configuration of an experiment of a peak-to-peak jitter measurement using an apparatus of the embodiment shown in FIG. 82.

A jitter was measured using the conventional time interval analyzer shown in FIG. 84, and a jitter was similarly measured, as shown in FIG. 85, using an apparatus shown in FIG. 82. In FIG. 84, a sine wave signal from a signal source 65 was frequency-divided and was converted by a frequency divider 66 into a clock signal having a ½0 frequency of that of the seine wave signal. This clock signal was phase-modulated using an external sine wave signal by a jitter generator 44 so that a jitter was added to the clock signal. The jitter of the clock signal to which the jitter had been added was measured by the time interval analyzer 67. In FIG. 85, a clock signal to which a jitter had been added was produced similarly to the process shown in FIG. 84. This clock signal was converted into a digital signal by an AD converter 68, and the jitter was measured by an apparatus 69 for measuring a jitter shown in FIG. 82. The experimental condition of this measurement was quite same as that of the measurement process shown in FIG. 84.

Figure 86:
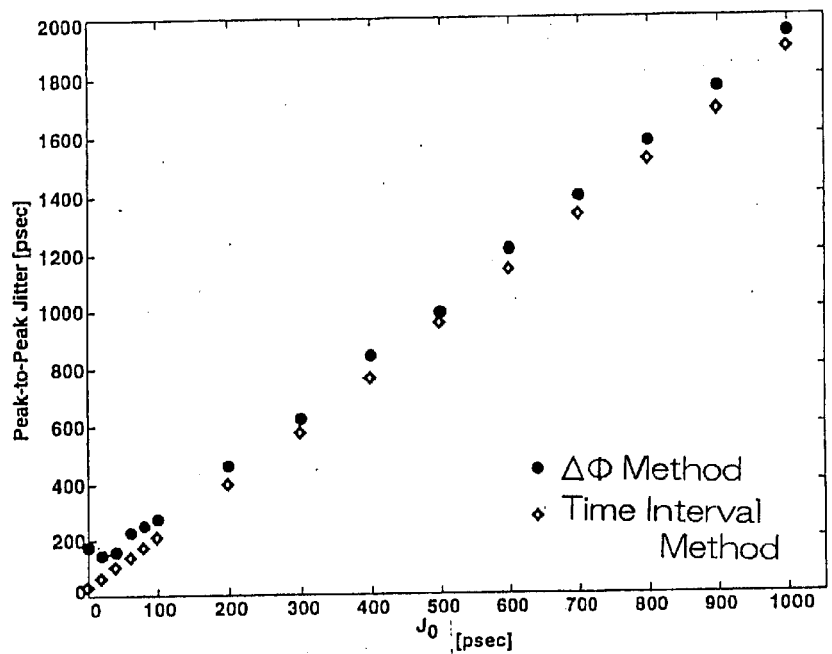
FIG. 86 is a diagram showing, by peak values of jitter, a measured experimental result of a peak-to-peak jitter.
Figure 87:
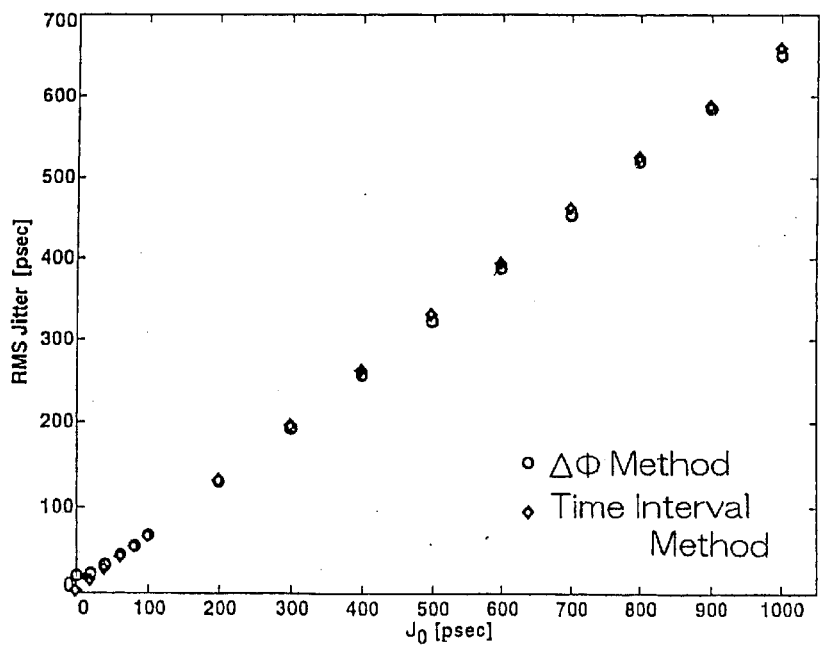
FIG. 87 is a diagram showing, by root-mean-square values of jitter, a measured experimental result of a peak-to-peak jitter.

Those experimental results are shown in FIGS. 86 and 87. In those figures, a lateral axis represents phase modulation indexes $J_0$ in the jitter generator 44. FIG. 86 shows measured peak-to-peak (difference between the maximum value and the minimum value) values. In FIG. 86, a mark ◇ indicates a value measured by the time interval analyzer 67, a mark o indicates a value measured by the apparatus 69 for measuring a jitter by the $\Delta\phi$ method. It can be understood that the measured value by the apparatus 69 for measuring a jitter by the $\Delta\phi$ method is nearly equal to the measured value by the time interval analyzer 67. FIG. 87 shows root-mean-square values of measured jitters. In FIG. 87, a mark ◇ indicates a value measured by the time interval analyzer 67, and a mark o indicates a value measured by the apparatus 69 for measuring a jitter the $\Delta\phi$ method. In this case, it can be said that the measured value by the apparatus 69 for measuring a jitter by the $\Delta\phi$ method is quite equal to the measured value by the time interval analyzer 67. That is, the apparatus of the present invention can provide the same value as that obtained by the conventional method (zero crossing method), and hence the same evaluation as that performed by the measured values in the conventional method can be done. In other words, the method of the present invention can provide measured values that are compatible with those obtained by the conventional method.

In addition, the number of zero crossing samples required to obtain such a result was 5000 for each of the peak-to-peak jitter case and the RMS jitter case in the measurement by the time interval analyzer 67, while the number of zero crossing samples in the present invention was 3179 for each of the peak-to-peak jitter case and the RMS jitter case in the measurement by the apparatus 69 for measuring a jitter by the $\Delta\phi$ method according to the present invention. The apparatus 69 for measuring a jitter by the $\Delta\phi$ method according to the present invention requires a smaller number of samples than the time interval analyzer does, and hence the measuring apparatus 69 of the present invention can perform a measurement quickly in that level.

Figure 88:
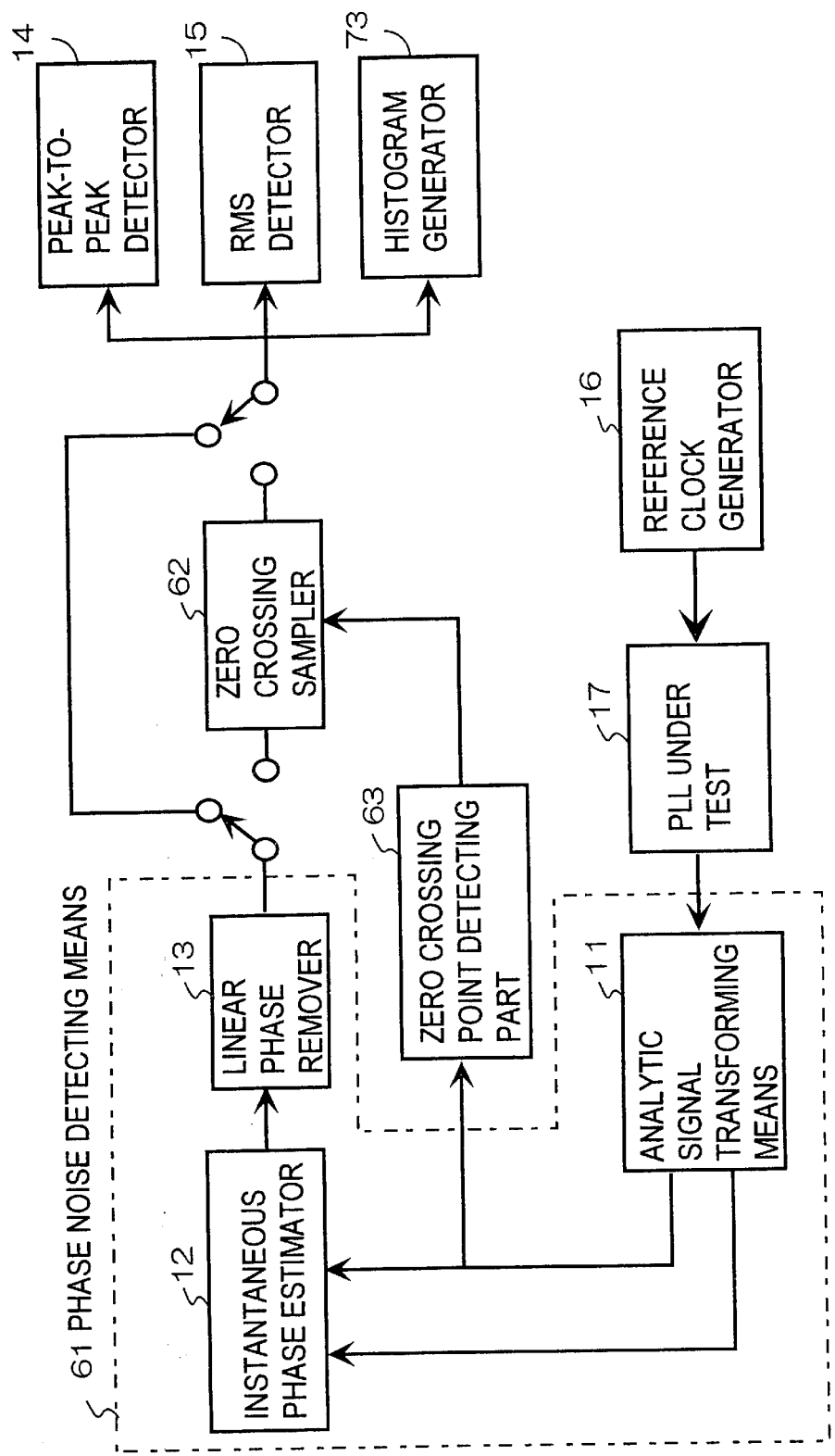
FIG. 88 is a diagram showing further another embodiment of the present invention.
Figure 89:
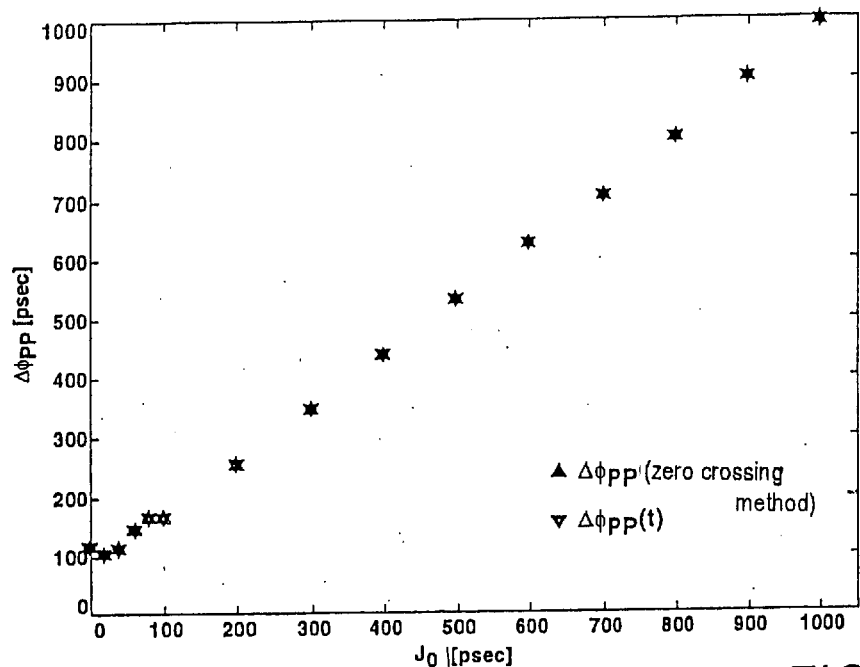
FIG. 89 is a diagram showing, by peak values of jitter, a measured experimental result of an RMS jitter.
Figure 90:
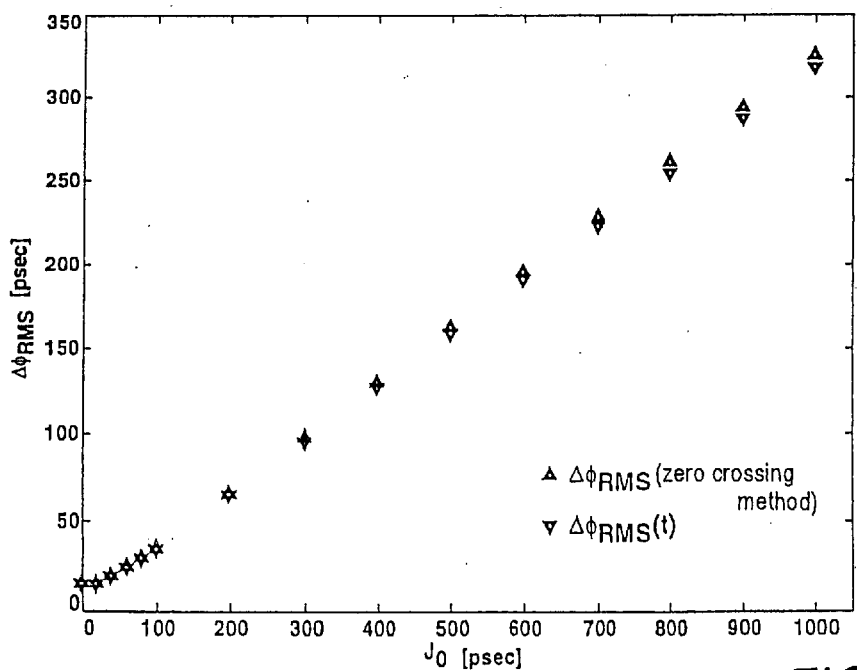
FIG. 90 is a diagram showing, by root-mean-square values of jitter, a measured experimental result of an RMS jitter.

As explained above with reference to FIG. 83b, each of the sample values taken out at approximate zero crossing points of a phase noise waveform $\Delta\phi(t)$ is an amount of deviation from each ideal timing. That is, those sample values are equal to the RMS jitter $J_{RMS}$ measured by the conventional phase detecting method, and hence the apparatus for measuring a jitter of the $\Delta\phi$ method is also compatible with the conventional phase detecting method. From this point of view, as shown in FIG. 88, a sample corresponding to a zero crossing point is taken out by the zero crossing sampler 62 from a phase noise waveform $\Delta\phi(t)$ supplied from the phase noise detecting means 61 to supply the sample to the detectors 14 and 15 as a sample phase noise waveform. However, as explained above with respect to the apparatus for measuring a jitter by the $\Delta\phi(t)$ method shown in FIG. 32, an RMS jitter $J_{RMS}$ can be measured without the zero crossing sampler 62. Therefore, as shown in FIG. 88, the apparatus for measuring a jitter may be constructed such that the phase noise waveform $\Delta\phi(t)$ can be switched by a switch 71, and the phase noise waveform $\Delta\phi(t)$ can be supplied, via the zero crossing sampler 62 or directly, to the detectors 14 and 15. Further, FIGS. 89 and 90 show detected values by the peak-to-peak detector 14 and the calculated results by the root-mean-square detector 15, respectively when each of the jitter measurements is performed, in the same condition, in the case where the zero crossing sampler 62 is used and the case where the zero crossing sampler 62 is not used. In those figures, a lateral axis represents phase modulation indexes $J_0$ in the jitter generator 44. A mark □ indicates a value measured using the zero crossing sampler 62, and a mark ▽ indicates a value measured without using the zero crossing sampler 62. FIG. 89 shows the detected values by the peak-to-peak detector 14, and FIG. 90 shows the calculated values by the root-mean-square detector 15. It could be understood that the similar results can be obtained either using the zero crossing sampler 62 or without using the zero crossing sampler 62.

Next, an apparatus configuration for measuring a cycle-to-cycle jitter $J_{CC}$ by this $\Delta\phi(t)$ method will be described with reference to FIG. 91. A cycle-to-cycle jitter $J_{CC}$ is a jitter fluctuation between adjacent clock cycles, i.e., a fluctuation of Nth time period against (N−1)th time period. Therefore, a cycle-to-cycle jitter $J_{CC}$ can be obtained by subtracting, by a differential circuit 72, a peak-to-peak jitter $J_{PP(N-1)}$ of (N−1)th time period (relative fluctuation between zero crossings) obtained from the differential circuit 64 in FIG. 91 from a peak-to-peak jitter $J_{PP(N)}$ of Nth time period, thereby obtaining the subtracted value $J_{PP(N)}-J_{PP(N-1)}$. That is, the differential circuit 72 calculates a differential waveform for the outputs of the differential circuit 64 to supply the calculated result to the detectors 14 and 15 as a second differential phase noise waveform. An example of the measured result of $J_{CC}$ is shown in FIG. 92. The differential circuit 72 may be connected to the output side of the differential circuit 64 of the apparatus shown in FIG. 82 so that a cycle-to-cycle jitter can be measured.

Figure 93:
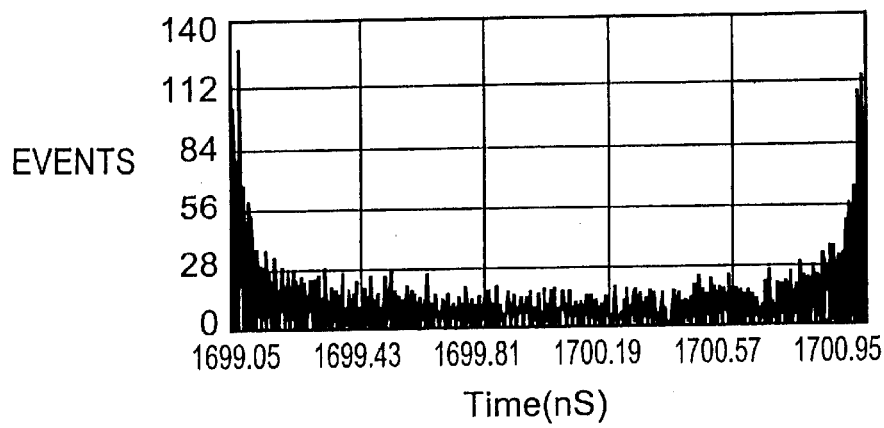
FIG. 93 is a diagram showing a histogram of sine wave jitter measured by a conventional apparatus.
Figure 94:
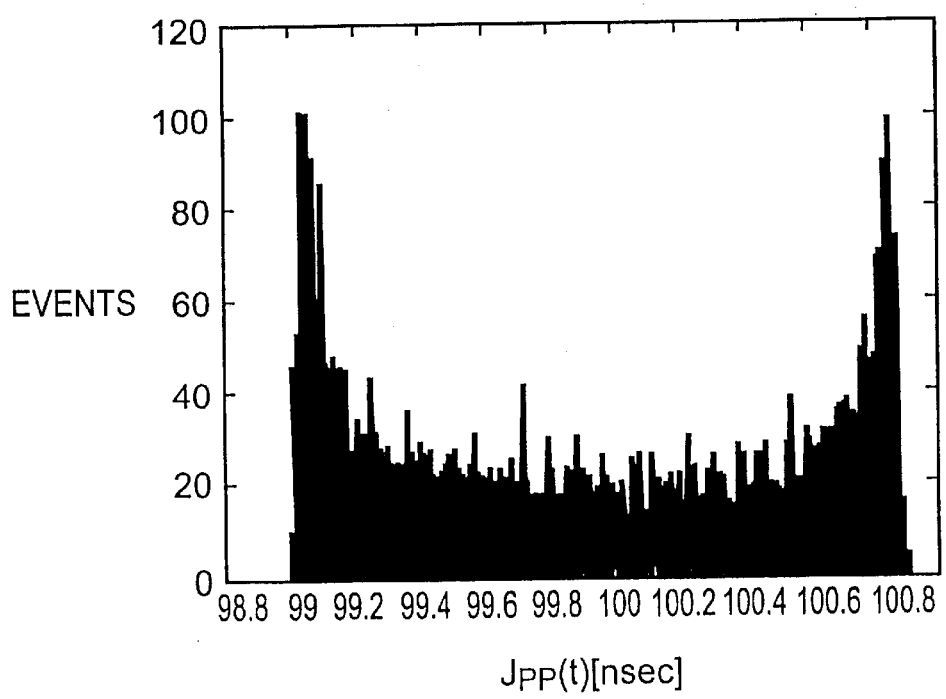
FIG. 94 is a diagram showing a histogram of sine wave jitter measured in the embodiment shown in FIG. 82.

The conventional method of measuring a jitter is based on a histogram measurement, but in the $\Delta\phi(t)$ method of the present invention, a histogram of measured jitters can also be created. A histogram of sine wave jitters measured by the conventional time interval analyzer is shown in FIG. 93. The lateral axis represents magnitude of $J_{PP}$. FIG. 94 shows a result of a histogram of jitters obtained by a histogram generator 73 when the same sine wave jitter is measured by the apparatus for measuring a jitter according to the $\Delta\phi(t)$ method shown in FIG. 82. It can be seen that each of the figures shows a shape of histogram of sine wave jitters.

Figure 95:
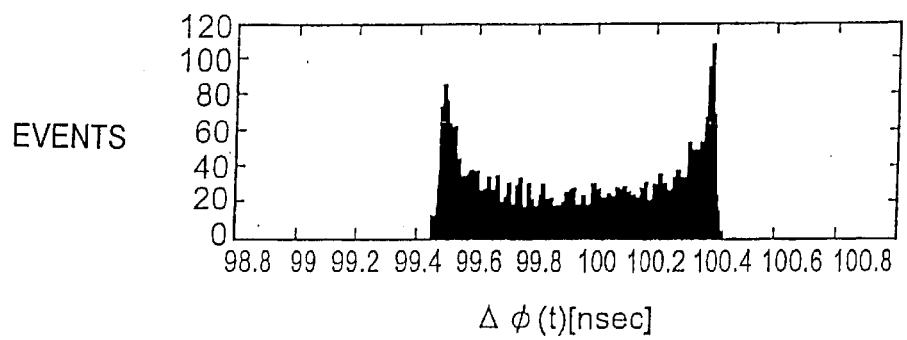
FIG. 95 is a diagram showing a histogram of the phase noise waveform $\Delta\phi(t)$ measured in the embodiment shown in FIG. 68.
Figure 96:
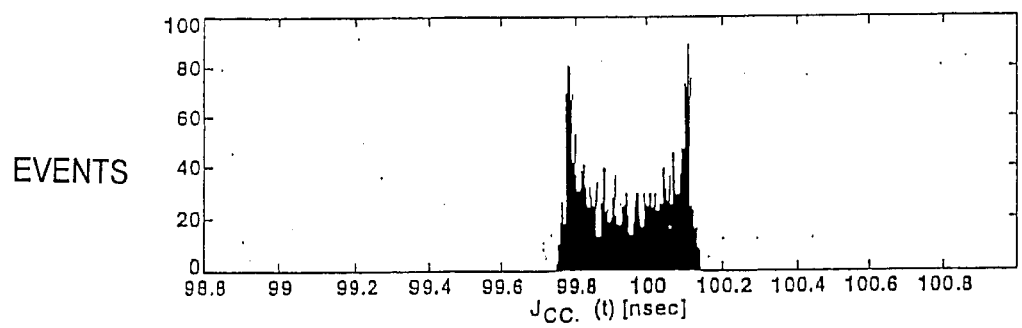
FIG. 96 is a diagram showing a histogram of cycle-to-cycle jitter measured in the embodiment shown in FIG. 91.
Figure 97:
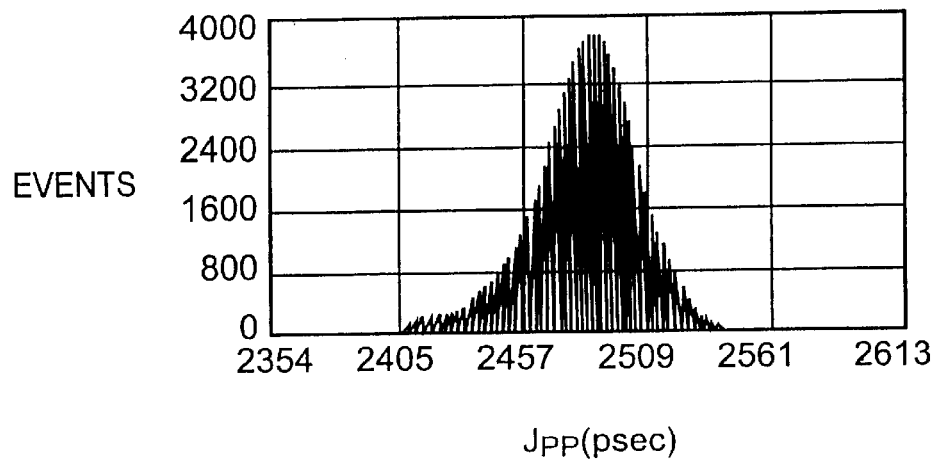
FIG. 97 is a diagram showing a histogram of random jitter measured by the conventional apparatus.
Figure 98:
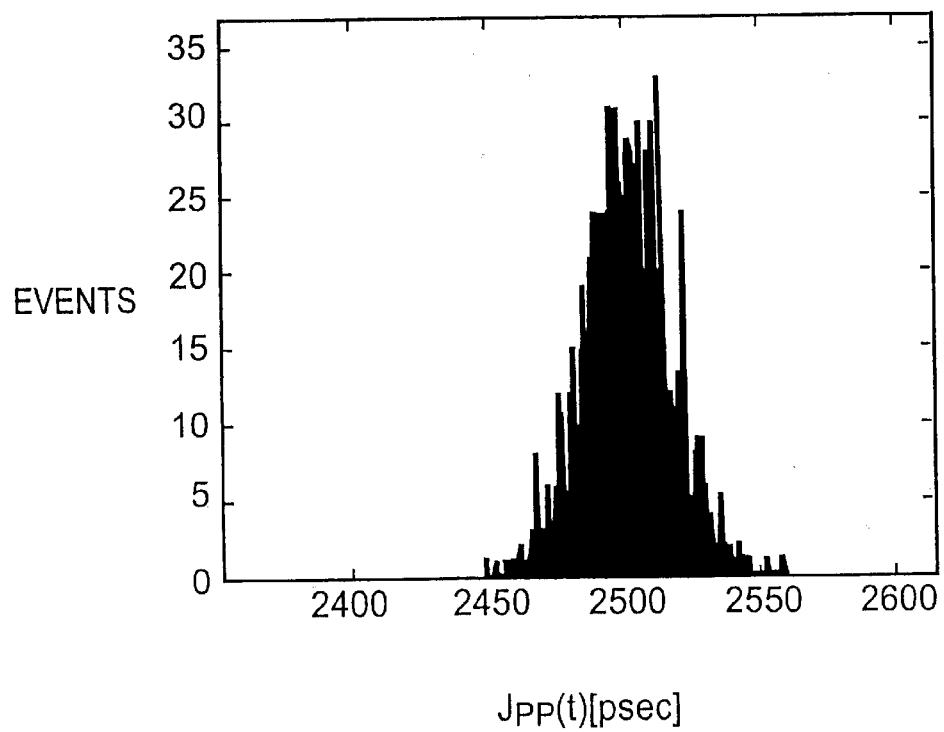
FIG. 98 is a diagram showing a histogram of random jitter measured in the embodiment shown in FIG. 82.

Moreover, FIG. 95 shows an example of histogram when a histogram of a phase noise waveform $\Delta\phi(t)$ obtained from the phase noise detecting means 61 shown in FIG. 32 is created by the histogram generator 73. In addition, FIG. 96 shows an example of histogram when cycle-to-cycle jitters $J_{CC}$ are measured by the apparatus for measuring a jitter using the $\Delta\phi(t)$ method, and a histogram of the $J_{CC}$ is created by the histogram generator 73. In this manner, various jitters can be measured by the apparatus for measuring a jitter using the $\Delta\phi(t)$ method according to the present invention, and histograms of those jitters can also be created. By the apparatus for measuring a jitter using the $\Delta\phi(t)$ method, a jitter evaluation based on a histogram of jitters obtained by the conventional apparatus for measuring a jitter can similarly be performed. The present invention is also effective for not only the measurement of a sine wave jitter but also for the measurement of a random jitter. This will be verified by showing a histogram of measured jitters. FIG. 97 shows a result of histogram measurement when a histogram of random jitters of a clock signal of a microcomputer is measured by the conventional time interval analyzer. FIG. 98 shows a result of histogram measurement when random jitters of the same clock signal are measured by the apparatus for measuring a jitter using the $\Delta\phi(t)$ method shown in FIG. 82, and a histogram thereof is created. It can be seen that each of those figures shows a histogram of random signals.

In the state that an envelope of an input signal is changed and the input signal is amplitude-modulated (AM), a sideband produced by the AM cannot be distinguished from a sideband produced by a phase modulation caused by a jitter, and hence there sometimes may occur that a measured result of a jitter becomes larger than an actual value. From such a viewpoint, there is shown in FIG. 82 a case where a clipper 74 is inserted in the input side of the phase noise detecting means 61 to remove an AM (amplitude modulation) component so that a PM (phase modulation) component can be remained for input to the phase noise detecting means 61. In the clipper 74, in either case of an analog signal or a digital signal, a value (magnitude) of an input signal is amplified to a value multiple of constant number. Regarding the amplified input signal, there is performed a process that a signal value larger than a predetermined first threshold value $V_{th}1$ is replaced by the first threshold value $V_{th}1$, and a signal value smaller than a predetermined second threshold value $V_{th}2$ (<$V_{th}1$) is replaced by the second threshold value $V_{th}2$. In this manner, the input signal is converted into an input signal having constant amplitude that has an envelope of no fluctuation in a time waveform, and hence a jitter can accurately be measured.

In the embodiment of FIG. 82, there is shown a case where in the differential circuit 64, an interval (time interval) $T_{in}$ between two samples for taking a differential thereof and a movement step $T_s$ for determining two time positions (calculation time points) for taking a differential next are inputted thereto, and various differentials can be taken by those values $T_{in}$ and $T_s$. FIG. 99a shows a waveform of a real part $X_C(t)$ of an analytic signal $Z_C(t)$, and sample values of its approximate zero crossing points (circle marks ○). FIG. 99b shows the phase noise waveform $\Delta\phi(t)$ and shows sample values of its approximate zero crossing points by circle marks ○. In this example, the phase noise waveform $\Delta\phi(t)$ has a sine wave shape. That is, FIG. 99b shows a case of sine wave jitter where a deviation from the ideal timing changes in sine wave shape. In this figure, there are 34 zero crossing samples of $\Delta\phi(t)$ in one period of the sine wave jitter. FIG. 99 shows a case where the movement step $T_s$ is a length of 17 sample points, and the differential interval $T_{in}$ is a length of 17 sample points. In this case, a differential value $\Delta\phi(j+T_{in})-\Delta\phi(j)$ is calculated from a zero crossing sample value $\Delta\phi(j)$ at a calculation time point j and a zero crossing sample value $\Delta\phi(j+T_{in})$ at a calculation time point $j+T_{in}$. Next, a differential value $\Delta\phi(j+2T_{in})-\Delta\phi(j+T_{in})$ that is a difference between a zero crossing sample, value $\Delta\phi(j+T_{in})$ at a calculation time point $j+T_{in}$ and a zero crossing sample value $\Delta\phi(j+2T_{in})$ at a calculation time point $j+2T_{in}$ i.e., at a time point after $T_{in}$ from the previous calculation point is calculated. In the conventional time interval analyzer or the like, as shown in this example, a time point after a differential interval $T_{in}$ from a calculation time point becomes a next calculation time point. That is, a movement step $T_s$ cannot be made smaller than a differential interval $T_{in}$.

In the present invention, a movement step $T_s$ can be made smaller than a differential interval $T_{in}$, i.e., $T_s<T_{in}$. That is, as shown in FIG. 100, in a zero crossing sampling time series of FIG. 100a, when the operation is started from a time point j, at time points of every movement step $T_s$ starting from the time point j i.e., at time points j, $j+T_s$, $j+2T_s$, . . . , samples of $\Delta\phi(t)$, i.e., $\Delta\phi(j)$, $\Delta\phi(j+T_s)$, $\Delta\phi(j+2T_s)$, . . . are taken out, respectively as shown in FIG. 100b, and those samples are stored in a buffer memory as a first sample series. In addition, at time points delayed by the differential interval $T_{in}$ from the time points j, $j+T_s$, $j+2T_s$, . . . , i.e., at time points $j+T_{in}$, $j+T_s+T_{in}$, $j+2T_s+T_{in}$, . . . , samples of $\Delta\phi(t)$, i.e., $\Delta\phi(j+T_{in})$, $\Delta\phi(j+T_s+T_{in})$, $\Delta\phi(j+2T_s+T_{in})$, . . . are taken out, respectively as shown in FIG. 100c, and those samples are stored in the buffer memory as a second sample series. Regarding the samples having the same sequential number in the first sample series and the second sample series, one sample value in the first sample series is subtracted from corresponding one sample value in the second sample series to obtain differential outputs under condition of $T_s<T_{in}$.

Figure 101A:
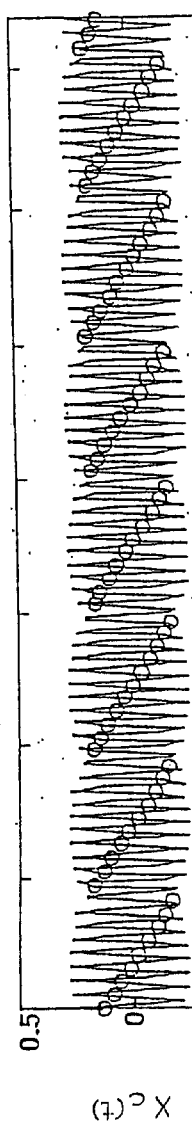
FIG. 101a is a diagram showing a waveform of a real part of an analytic signal.
Figure 101B:
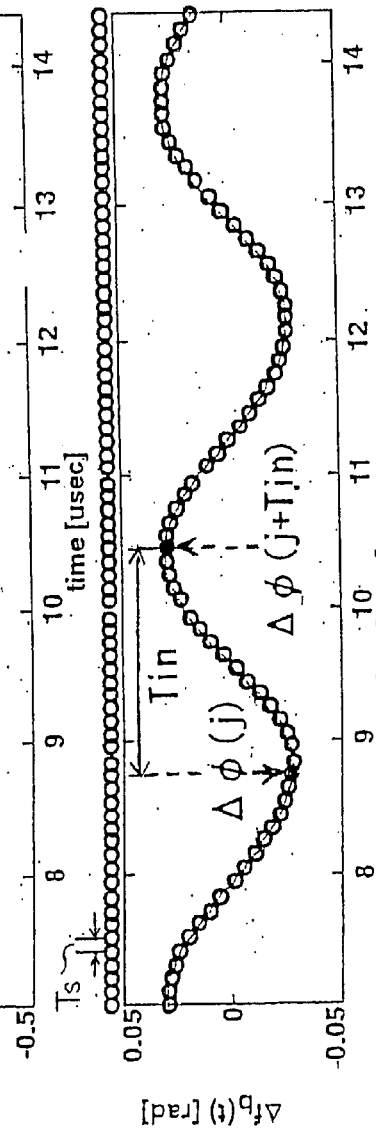
FIG. 101b is a diagram showing a phase noise waveform and its zero-crossing sample values.
Figure 101C:
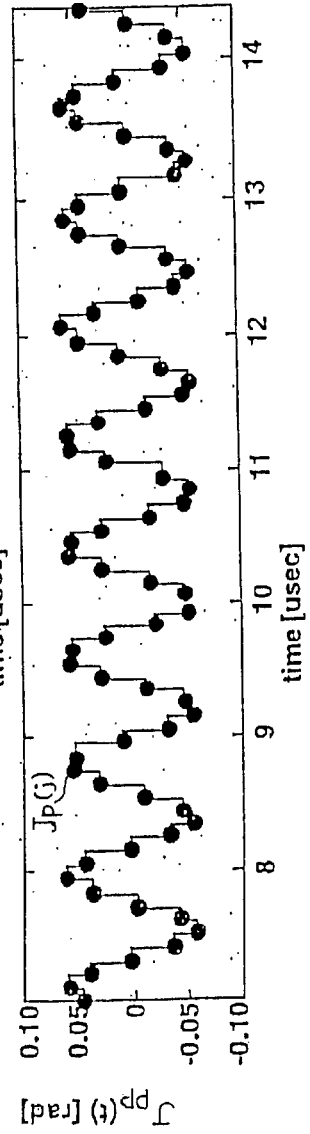
FIG. 101c is a diagram showing a peak-to-peak jitter obtained by a differential calculation in the case of $T_s=1$ and $T_{in}=17$.

In FIG. 101, a waveform of real part $X_C(t)$ of the analytic signal, a phase noise waveform $\Delta\phi(t)$, and zero crossing points are same as those in FIG. 99. FIG. 101 shows a case where a calculation movement step $T_s$ is a length of one zero crossing point and a differential interval $T_{in}$ is a length of 17 zero crossing points. In this case, as shown in FIG. 101c, there is obtained at every zero crossing point, a differential of $\Delta\phi(t)$, for example, $J_p(j)=\Delta\phi(j+T_{in})-\Delta\phi(j)$ in the differential interval $T_{in}$ (17 zero crossing points).

In order to clearly obtain a fluctuation of $\Delta\phi(t)$, it is necessary to make $T_{in}$ larger to some extent. However, in the conventional system shown in FIG. 99, $T_s$ is $T_s \geq T_{in}$, and hence $T_s$ also becomes large. Therefore, the number of differential values to be obtained in the same time period (data volume) is small, and hence the resolution is poor and the peak-to-peak values and the root-mean-square values of the Jp(j) are not accurate values.

Figure 102A:
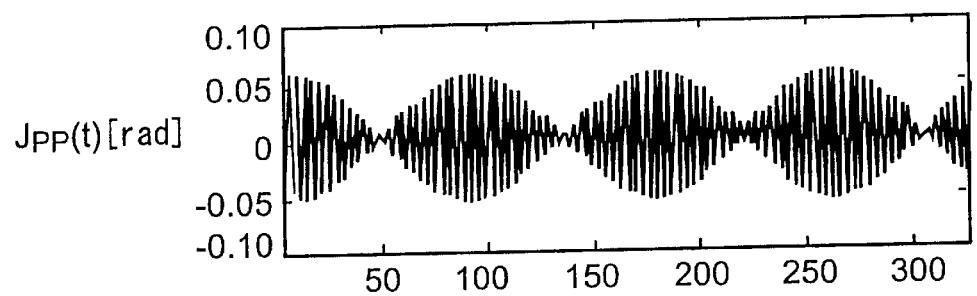
FIG. 102a is a diagram showing a peak-to-peak jitter obtained in the case of $T_s=T_{in}$ with respect to a sine wave jitter.
Figure 102B:
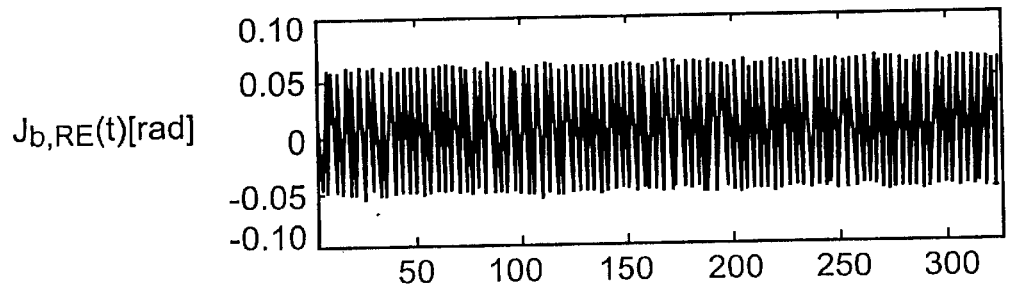
FIG. 102b is a diagram showing a peak-to-peak jitter obtained in the case of $T_s=1$ and $T_{in}=17$ with respect to a sine wave jitter.

Therefore, a peak-to-peak jitter $J_{PP}(t)$ obtained from the differentials shown in FIG. 99 is as shown in FIG. 102a due to the decreased number of differential values obtained, and the peak value is 1883 ps and the root-mean-square value is 638 ps. However, a peak-to-peak jitter $J_{PP}(t)$ obtained from the differentials shown in FIG. 101 under the same condition is as shown in FIG. 102b due to the increased number of differential values and short intervals, and the peak-to-peak value is 1940 ps and the root-mean-square value is 650 ps. In the case of FIG. 101, a high resolution and an accurate jitter can be obtained compared with the conventional case shown in FIG. 99.

Figure 103A:
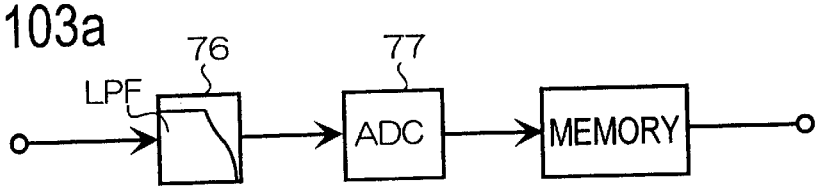
FIG. 103a is a diagram showing a configuration for performing an ordinary AD conversion.
Figure 103B:
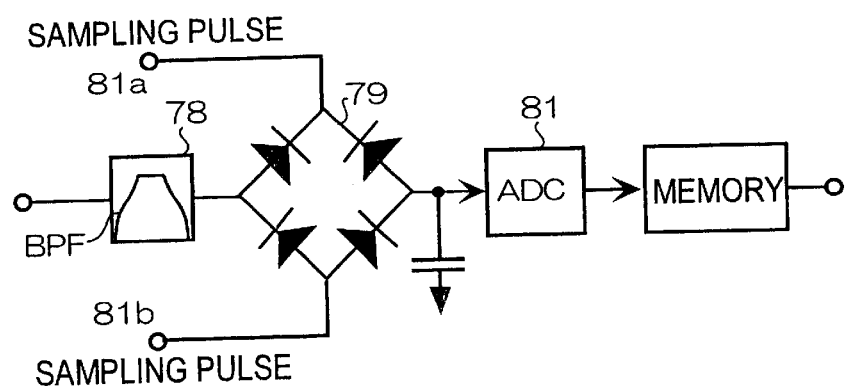
FIG. 103b is a diagram showing a configuration for performing an AD conversion by an under-sampling method.
Figure 104A:
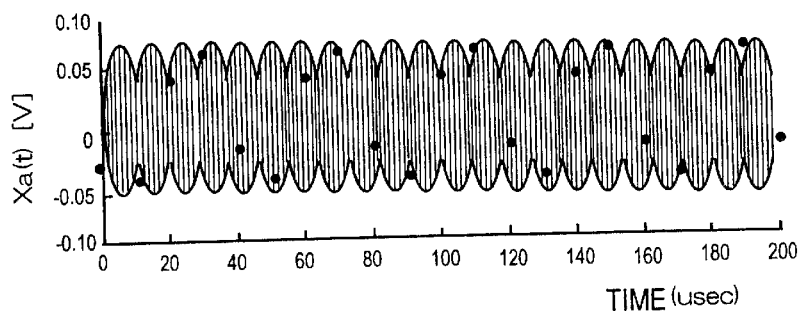
FIG. 104a is a diagram showing a waveform of a series of sample values when an input signal is sampled as per usual in its high frequency state.
Figure 104B:
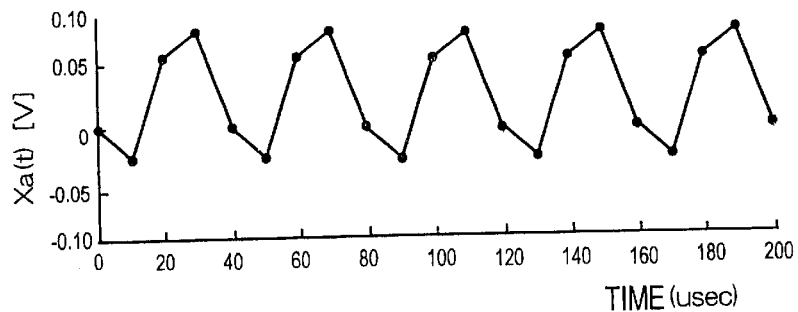
FIG. 104b is a diagram showing a waveform of a series of sample values when an input signal is sampled by the under-sampling method.
Figure 105A:
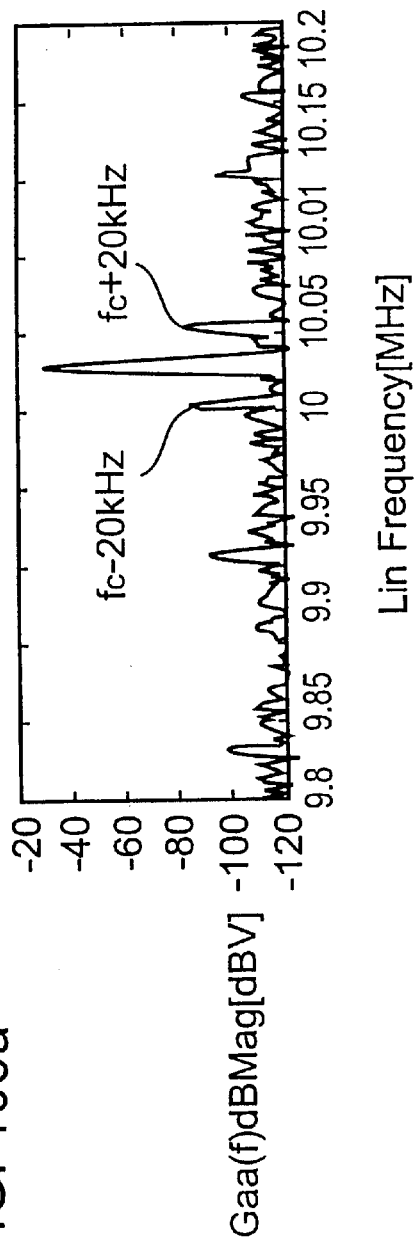
FIG. 105a is a diagram showing a spectrum of the series of sample values shown in FIG. 104a, and FIG. 105b is a diagram showing a spectrum of the series of sample values shown in FIG. 104b.
Figure 105B:
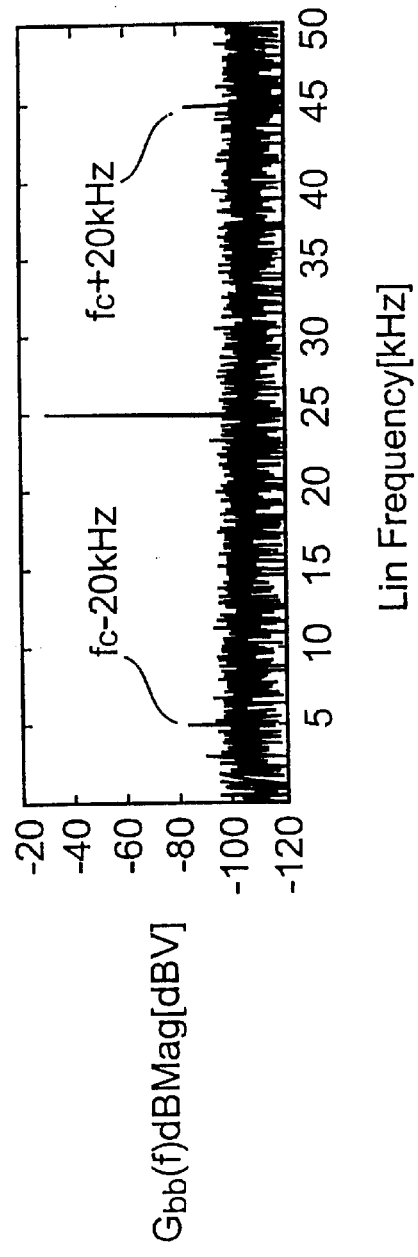

With respect to an ordinary AD converter, as shown in FIG. 103a, an input signal is inputted to an AD converter 77 after frequency components higher than ½ of the sampling frequency of the AD converter 77 have been removed therefrom by a lowpass filter 76. It is necessary for the AD converter 77 to perform an analog-digital conversion at a sampling frequency equal to or higher than two-time frequency of the input signal frequency. However, in the apparatus according to the present invention, the input signal may be sampled and converted into a digital signal at a frequency lower than the input signal frequency. For this purpose, for example as shown in FIG. 103b, high frequency components of the input signal are removed by a bandpass or lowpass filter 78, and then the input signal is sampled in a sampling bridge circuit 79 comprised of diodes by sampling pulses applied between terminals 81a and 81b at a frequency lower than the input signal frequency. A sample value accurately obtained by this process is converted into a digital signal by an AD converter 81 for each sampling. For example, an experiment was performed using a sine wave signal having 10.025 MHz frequency and being phase-modulated by 20 kHz signal. When this sine wave signal was sampled at a frequency of 40.0 MHz that was higher than that of this input signal, the waveform of the series of sample values was as shown in FIG. 104a. In this case, the spectrum was as shown in FIG. 105a wherein a large peak of the carrier wave component having 10.025 MHz frequency as well as peaks of upper and lower sidebands (modulation components) were observed. On the other hand, when this sine wave signal was under-sampled by the circuit configuration of FIG. 103b at a frequency of 100 kHz that was lower than the carrier wave frequency of the input signal by two digits, the waveform of the series of sample values was as shown in FIG. 104b. This series of sample values is also shown in FIG. 104a by marks ○. In this case, the spectrum of the series of sample values in the under-sampling was as shown in FIG. 105b wherein a peak of the carrier wave component having 25 kHz frequency and two peaks of the modulation components (upper and lower sidebands) of 25 kHz±20 kHz were observed. Therefore, it could be understood that a jitter can also be measured by the apparatus of the present invention using an under-sampling AD converter.

Figure 91:
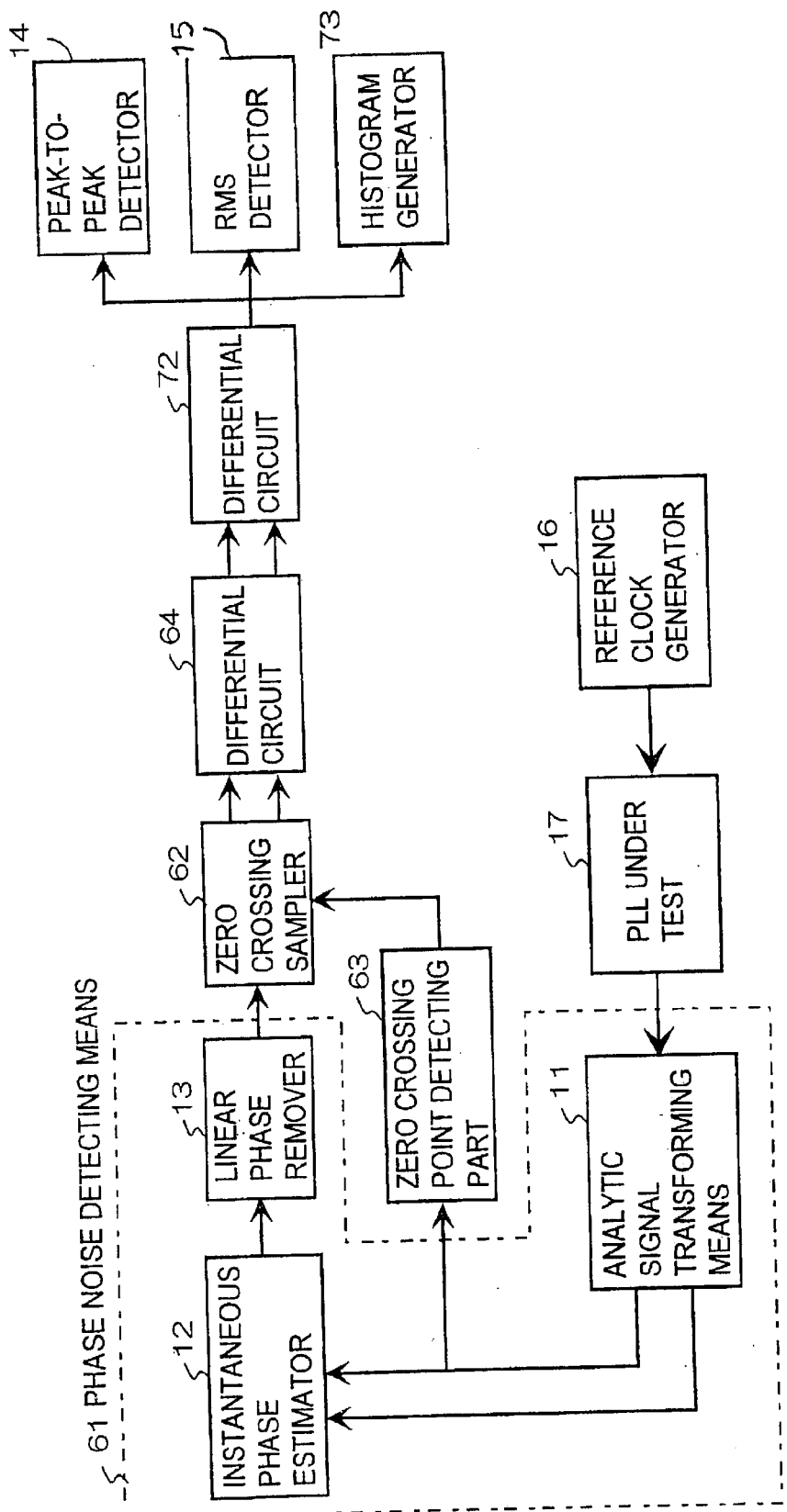
FIG. 91 is a diagram showing an embodiment in which the present invention is applied to a measurement of a cycle-to-cycle jitter.
Figure 92:
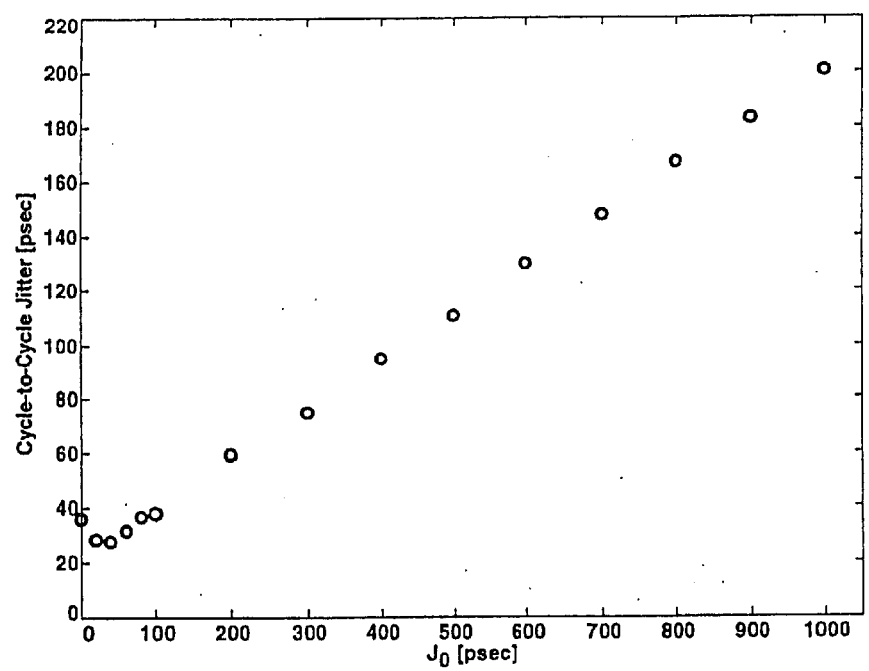
FIG. 92 is a diagram showing a measured experimental result of a cycle-to-cycle jitter.

In each of the embodiments shown in FIG. 82, FIG. 88 and FIG. 91, one of the various analytic signal transforming means shown in FIG. 91, FIG. 40b, FIG. 67 and FIG. 69 can be used as the analytic signal transforming means 11. In addition, in those embodiments, it is not limited to use an AD converter for converting an input signal into a digital signal, but a comparator may be used instead of the AD converter. That is, in general, an input signal under measurement is converted into a digital signal by an AD converter, or is changed to a binary value by a comparator to be inputted to the analytic signal transforming means 11. However, an input signal under measurement is inputted into the analytic signal transforming means shown in FIG. 40*a* without being converted into a digital signal. Moreover, an input signal of the phase noise detecting means 61, i.e., an input signal of the analytic signal transforming means 11 may be a signal produced by frequency-dividing an input signal (a signal under jitter measurement) by a frequency-divider or a signal produced by frequency-converting an input signal by a frequency-converter.

Heretofore, measurements of jitters of a signal under measurement have been mainly described. However, the present invention can be applied to jitter measurements of various signals like a data signal used in telecommunication, a repetitive video signal such as a television signal or the like.

While the present invention has been described with regard to the preferred embodiment shown by way of example, it will be apparent to those skilled in the art that various modifications, alterations, changes, and/or minor improvements of the embodiment described above can be made without departing from the sprit and the scope of the present invention. Accordingly, it should be understood that the present invention is not limited to the illustrated embodiment, and is intended to encompass all such modifications, alterations, changed, and/or minor improvements falling within the scope of the invention defined by the appended claims.

Further, the aforementioned reference literatures c1–c18 are as listed below.

[c1]: Alan V. Oppenheim, Alan S. Willsky and Ian T. Young, Signals and Systems, Prentice-Hall, Inc., 1983.

[c2]: Athanasios Pappulis, "Analysis for Analog and Digital Signals", Gendai Kogakusha, 1982.

[c3]: Stefan L. Hahn, Hilbert Transforms in Signal Processing, Artrch House Inc., 1996.

[c4]: J. Dugundji, "Envelopes and Pre-Envelopes of Real Waveforms," IRE Trans. Inform. Theory, vol. IT-4, pp. 53–57, 1958.

[c5]: Alan V. Oppenheim and Ronald W. Schafer, Discrete-Time Signal Processing, Prentice-Hall, Inc., 1989.

[c6]: Tristan Needham, Visual Complex Analysis, Oxford University Press, Inc., 1997.

[c7]: Donald G. Childers, David P. Skinner and Robert C. Kemerait, "The Cepstrum: A Guide to Processing," Proc. IEEE, vol. 65, pp. 1428–1442, 1977.

[c8]: Jose M. Tribolet, "A New Phase Unwrapping Algorithm," IEEE Trans. Acoust., Speech, Signal Processing, vol. ASSP-25, pp. 170–177, 1977.

[c9]: Kuno P. Zimmermann, "On Frequency-Domain and Time-Domain Phase Unwrapping," Proc. IEEE, vol. 75, pp. 519–520, 1987.

[c10]: Julius S. Bendat and Allan G. Piersol, Random Data: Analysis and Measurement Procedures, $2^{nd}$ ed., John Wiley & Sons, Inc., 1986.

[c11]: Shoichiro Nakamura, Applied Numerical Methods with Software, Prentice-Hall, Inc., 1991.

[c12]: David Chu, "Phase Digitizing Sharpens Timing Measurements," IEEE Spectrum, pp. 28–32, 1988.

[c13]: Lee D. Cosart, Luiz Peregrino and Atul Tambe, "Time Domain Analysis and Its Practical Application to the Measurement of Phase Noise and Jitter," IEEE Trans. Instrum. Meas., vol. 46, pp. 1016–1019, 1997.

[c14]: Jacques Rutman, "Characterization of Phase and Frequency Instabilities in Precision Frequency Sources: Fifteen Years of Progress," Proc. IEEE, vol. 66, pp. 1048–1075, 1977.

[c15]: Kamilo Fehier, Telecommunications Measurements, Analysis, and Instrumentation, Prentice-Hall, Inc., 1987.

[c16]: Michel C. Jeruchim, Philip Balaban and K. Sam Shanmugan, Simulation of Communication Systems, Plenum Press, 1992.

[c17]: E. Oran Brigham, The Fast Fourier Transform, Prentice-Hall, Inc., 1974.

[c18]: Albert H. Nuttall, "Some Windows with Very Good Sidelobe Behavior", IEEE Trans. Acoust., Speech, Signal Processing, vol. ASSP-29, pp. 84–91, 1981.

What is claimed is:

1. An apparatus for measuring a jitter comprising:

analytic signal transforming means for transforming a signal under measurement into a complex analytic signal;

instantaneous phase estimating means for obtaining an instantaneous phase of the analytic signal;

linear phase removing means for removing a linear phase from the instantaneous phase to obtain a phase noise waveform; and jitter detecting means to which the phase noise waveform is supplied for obtaining a jitter of the signal under measurement.

2. The apparatus for measuring a jitter according to claim 1 further including:

a zero crossing sampler for sampling the phase noise waveform as an input signal at a timing close to a zero crossing point of a real part of the analytic signal to output a sample phase noise waveform.

3. The apparatus for measuring a jitter according to claim 2 further including:

a first differential circuit for inputting therein the sample phase noise waveform and for calculating its differential waveform to output a first differential phase noise waveform and to supply the outputted first differential phase noise waveform to said jitter detecting means.

4. The apparatus for measuring a jitter according to claim 2 further including:

a first differential circuit for inputting therein the sample phase noise waveform and for calculating its differential waveform to output a first differential phase noise waveform; and a second differential circuit for inputting therein the first differential phase noise waveform and for calculating its differential waveform to output a second differential phase noise waveform and to supply the outputted second differential phase noise waveform to said jitter detecting means.

5. The apparatus for measuring a jitter according to any one of claims 1–4 further including:

a comparator for comparing the signal under measurement with a reference analog quantity to change the signal under measurement to a binary value, and for supplying the binary value to the analytic signal transforming means.

6. The apparatus for measuring a jitter according to any one of claims 1–4 wherein said analytic signal transforming means is means for supplying the signal under measurement to a bandpass filter, for Hilbert-transforming an output of said bandpass filter by a Hilbert transformer to obtain an imaginary part of the analytic signal, and for making the output of said bandpass filter a real part of the analytic signal.

7. The apparatus for measuring a jitter according to any one of claims 1–4 wherein said analytic signal transforming means comprises:

a frequency domain transformer for transforming the signal under measurement into a signal in frequency domain;

a bandpass processor for cutting-off negative frequency components from an output of said frequency domain transformer and for extracting only frequency components in the proximity of the frequency of the signal under measurement; and a time domain transformer for inverse-transforming the output of said bandpass processor into a signal in time domain.

8. The apparatus for measuring a jitter according to claim 7 further including:

a buffer memory for storing therein the signal under measurement;

wherein said analytic signal transforming means further comprises:

means for taking out in the sequential order the signal under measurement from said buffer memory such that the signal under measurement being taken out is partially overlapped with a signal under measurement taken out just before;

means for multiplying each taken out partial signal under measurement by a window function to supply the multiplied result to said frequency domain transformer; and means for multiplying the signal transformed in time domain by an inverse number of the window function to obtain the analytic signal.

9. The apparatus according to any one of claims 1–4 wherein said analytic signal transforming means comprises:

a first frequency mixer for multiplying the signal under measurement by a sine wave signal;

a second frequency mixer for multiplying the signal under measurement by a cosine wave signal whose frequency is same as that of the sine wave signal;

a first lowpass filter to which an output of said first frequency mixer is supplied; and a second lowpass filter to which an output of said second frequency mixer is supplied.

10. The apparatus for measuring a jitter according to any one of claims 1–4 wherein said analytic signal transforming means comprises:

a first frequency mixer for multiplying the signal under measurement by a sine wave signal;

a second frequency mixer for multiplying the signal under measurement by a cosine wave signal whose frequency is same as that of the sine wave signal;

a first lowpass filter to which an output of said first frequency mixer is supplied;

a second lowpass filter to which an output of said second frequency mixer is supplied;

a first comparator for comparing an output of said first lowpass filter with a reference analog quantity; and a second comparator for comparing an output of said second lowpass filter with the reference analog quantity;

wherein the analytic signal is composed of an output signal of said first comparator and an output signal of said second comparator.

11. The apparatus for measuring a jitter according to any one of claims 1–4 wherein said jitter detecting means is peak-to-peak detecting means for obtaining a difference between the maximum value and the minimum value of a supplied waveform as a peak value of a jitter.

12. The apparatus for measuring a jitter according to any one of claims 1–4 wherein said jitter detecting means is root-mean-square detecting means for calculating a root-mean-square of a supplied waveform to obtain a root-mean-square value of a jitter.

13. The apparatus for measuring a jitter according to any one of claims 1–4 wherein said jitter detecting means is histogram estimating means for obtaining a histogram of a supplied waveform.

14. The apparatus for measuring a jitter according to any one of claims 1–4 wherein said linear phase removing means comprises:

continuous phase converting means for converting an inputted instantaneous phase into a continuous phase;

linear phase estimating means for estimating a linear phase with respect to the converted continuous phase; and means for subtracting the estimated linear phase from the continuous phase to obtain the phase noise waveform.

15. A method of measuring a jitter comprising the steps of:

an analytic signal transforming step of transforming a signal under measurement into a complex analytic signal;

an instantaneous phase estimating step of obtaining an instantaneous phase of the analytic signal;

a linear phase removing step of removing a linear phase from the instantaneous phase to obtain a phase noise waveform; and a step of obtaining a jitter of the signal under measurement from the phase noise waveform.

16. A method of measuring a jitter according to claim 15 further comprising the steps of:

sampling the phase noise waveform at a timing close to a zero crossing point of a real part of the analytic signal to obtain a sample noise waveform; and calculating a differential waveform of the sample phase noise waveform to obtain a first differential phase noise waveform.

17. A method of measuring a jitter according to claim 16 further comprising the step of:

calculating a differential waveform of the first differential phase noise waveform to obtain a second differential phase noise waveform.

18. The apparatus for measuring a jitter according to any one of claims 1–4 further including:

a clipper for supplying the signal under measurement to said analytic signal transforming means as a signal having constant amplitude.

19. The apparatus according to claim 9, wherein said analytic signal transforming means comprises:

a first AD converter for converting an output of said first lowpass filter into a digital signal; and a second AD converter for converting an output of said second lowpass filter into a digital signal;

wherein the complex analytic signal has a real part comprising an output signal of said first AD converter and an imaginary part comprising an output signal of said second AD converter.

* * * * *